US011719639B2

(12) United States Patent
Schmid et al.

(10) Patent No.: US 11,719,639 B2
(45) Date of Patent: Aug. 8, 2023

(54) INTEGRATED SENSOR FOR MULTI-DIMENSIONAL SIGNAL ANALYSIS

(71) Applicant: Quantum-Si Incorporated, Guilford, CT (US)

(72) Inventors: Gerard Schmid, Guilford, CT (US); Dajiang Yang, San Jose, CA (US); Eric A. G. Webster, Santa Clara, CA (US); Xin Wang, San Jose, CA (US); Todd Rearick, Cheshire, CT (US); Changhoon Choi, Palo Alto, CA (US); Ali Kabiri, Guilford, CT (US); Kyle Preston, Guilford, CT (US); Brian Reed, Madison, CT (US)

(73) Assignee: Quantum-Si Incorporated, Guilford, CT (US)

( * ) Notice: Subject to any disclaimer, the term of this patent is extended or adjusted under 35 U.S.C. 154(b) by 15 days.

(21) Appl. No.: 17/190,331

(22) Filed: Mar. 2, 2021

(65) Prior Publication Data

US 2021/0270740 A1    Sep. 2, 2021

Related U.S. Application Data

(60) Provisional application No. 62/984,229, filed on Mar. 2, 2020.

(51) Int. Cl.
*G01N 21/64* (2006.01)
*H01L 27/146* (2006.01)

(52) U.S. Cl.
CPC ..... *G01N 21/6454* (2013.01); *G01N 21/6408* (2013.01); *G01N 21/6428* (2013.01);
(Continued)

(58) Field of Classification Search
CPC .......... G01N 21/6454; G01N 21/6408; G01N 21/6428; G01N 2021/6463; H01L 27/14603
See application file for complete search history.

(56) References Cited

U.S. PATENT DOCUMENTS

| | | | |
|---|---|---|---|
| 5,961,924 | A | 10/1999 | Reichert et al. |
| 6,686,582 | B1 | 2/2004 | Volcker et al. |

(Continued)

FOREIGN PATENT DOCUMENTS

| | | | |
|---|---|---|---|
| EP | 2182523 A1 | 5/2010 |
| EP | 2487897 A1 | 8/2012 |

(Continued)

OTHER PUBLICATIONS

Extended European Search Report for European Application No. 18202357.2 dated Mar. 15, 2019.

(Continued)

*Primary Examiner* — David P Porta
*Assistant Examiner* — Jeremy S Valentiner
(74) *Attorney, Agent, or Firm* — Wolf, Greenfield & Sacks, P.C.

(57) ABSTRACT

Some aspects relate to an integrated circuit, comprising at least one photodetection region configured to generate charge carriers responsive to incident photons emitted from a sample, at least one charge storage region configured to receive the charge carriers from the photodetection region, and at least one controller configured to obtain information about the incident photons, the information comprising at least one member selected from the group comprising pulse duration and interpulse duration and at least one member selected from the group comprising wavelength information, luminescence lifetime information, and intensity information. In some embodiments, the information comprises at (Continued)

least three, four, and/or five members selected from the group comprising wavelength information, luminescence lifetime information, intensity information, pulse duration information, and interpulse duration information. In some embodiments, the information obtained may be used to identify the sample.

19 Claims, 37 Drawing Sheets

(52) U.S. Cl.
CPC ............... *H01L 27/14603* (2013.01); *G01N 2021/6463* (2013.01)

(56) References Cited

U.S. PATENT DOCUMENTS

| | | | |
|---|---|---|---|
| 6,787,308 B2 | 9/2004 | Balasubramanian et al. | |
| 6,917,726 B2 | 7/2005 | Levene et al. | |
| 7,175,811 B2 | 2/2007 | Bach et al. | |
| 7,426,322 B2 | 9/2008 | Hyde | |
| 7,738,086 B2 | 6/2010 | Shepard et al. | |
| 7,820,983 B2 | 10/2010 | Lundquist et al. | |
| 7,834,329 B2 | 11/2010 | Lundquist et al. | |
| 7,838,847 B2 | 11/2010 | Lundquist et al. | |
| 8,053,742 B2 | 11/2011 | Lundquist et al. | |
| 8,207,509 B2 | 6/2012 | Lundquist et al. | |
| 8,274,040 B2 | 9/2012 | Zhong et al. | |
| 8,278,728 B2 | 10/2012 | Murshid | |
| 8,465,699 B2 | 6/2013 | Fehr et al. | |
| 8,471,219 B2 | 6/2013 | Lundquist et al. | |
| 8,471,230 B2 | 6/2013 | Zhong et al. | |
| 8,502,169 B2 | 8/2013 | Rigneault et al. | |
| 8,618,507 B1 | 12/2013 | Lundquist et al. | |
| 9,029,802 B2 | 5/2015 | Lundquist et al. | |
| 9,157,864 B2 | 10/2015 | Fehr et al. | |
| 9,222,123 B2 | 12/2015 | Zhong et al. | |
| 9,222,133 B2 | 12/2015 | Lundquist et al. | |
| 9,223,084 B2 | 12/2015 | Grot et al. | |
| 9,372,308 B1 | 6/2016 | Saxena et al. | |
| 9,488,584 B2 | 11/2016 | McCaffrey et al. | |
| 9,587,276 B2 | 3/2017 | Lundquist et al. | |
| 9,606,060 B2 | 3/2017 | Chen et al. | |
| 9,658,161 B2 | 5/2017 | Saxena et al. | |
| 9,666,748 B2 | 5/2017 | Leobandung | |
| 9,719,138 B2 | 8/2017 | Zhong et al. | |
| 9,759,658 B2 | 9/2017 | Rothberg et al. | |
| 9,765,395 B2 | 9/2017 | Goldsmith | |
| 9,885,657 B2 | 2/2018 | Rothberg et al. | |
| 9,946,017 B2 | 4/2018 | Saxena et al. | |
| 10,018,764 B2 | 7/2018 | Grot et al. | |
| 10,048,208 B2 | 8/2018 | Rothberg et al. | |
| 10,090,429 B2 | 10/2018 | Leobandung | |
| 10,138,515 B2 | 11/2018 | Fehr et al. | |
| 10,246,742 B2 | 4/2019 | Rothberg et al. | |
| 10,280,457 B2 | 5/2019 | Zhong et al. | |
| 10,283,928 B2 | 5/2019 | Rothberg et al. | |
| 10,310,178 B2 | 6/2019 | Saxena et al. | |
| 10,487,356 B2 | 11/2019 | Lundquist et al. | |
| 10,551,624 B2 | 2/2020 | Rothberg et al. | |
| 10,578,788 B2 | 3/2020 | Grot et al. | |
| 10,655,172 B2 | 5/2020 | Rank et al. | |
| 10,724,090 B2 | 7/2020 | McCaffrey et al. | |
| 2002/0182716 A1 | 12/2002 | Weisbuch et al. | |
| 2003/0174992 A1 | 9/2003 | Levene et al. | |
| 2004/0169842 A1 | 9/2004 | Dosluoglu et al. | |
| 2010/0065726 A1 | 3/2010 | Zhong et al. | |
| 2011/0204467 A1 | 8/2011 | Ohchi et al. | |
| 2011/0298079 A1 | 12/2011 | Kawahito | |
| 2012/0019828 A1* | 1/2012 | McCaffrey et al. | G01N 21/645 439/55 |
| 2012/0273653 A1 | 11/2012 | Hynecek et al. | |
| 2013/0070131 A1 | 3/2013 | Ohkubo et al. | |
| 2013/0116153 A1 | 5/2013 | Bowen et al. | |
| 2014/0077283 A1 | 3/2014 | Lenchenkov | |
| 2015/0141267 A1 | 5/2015 | Rothberg et al. | |
| 2015/0264287 A1 | 9/2015 | Shimotsusa et al. | |
| 2016/0084761 A1 | 3/2016 | Rothberg et al. | |
| 2016/0133668 A1* | 5/2016 | Rothberg | G01N 21/645 250/206 |
| 2016/0181298 A1 | 6/2016 | Wan et al. | |
| 2016/0344156 A1 | 11/2016 | Rothberg et al. | |
| 2017/0146479 A1 | 5/2017 | Levine et al. | |
| 2017/0276686 A1 | 9/2017 | Marcotte et al. | |
| 2017/0349944 A1* | 12/2017 | Rothberg | G16B 30/00 |
| 2018/0172906 A1 | 6/2018 | Rothberg et al. | |
| 2018/0173000 A1 | 6/2018 | Rothberg et al. | |
| 2018/0175582 A1 | 6/2018 | Rothberg et al. | |
| 2018/0180546 A1 | 6/2018 | Rothberg et al. | |
| 2018/0231465 A1 | 8/2018 | Rothberg et al. | |
| 2019/0025511 A1 | 1/2019 | Rothberg et al. | |
| 2019/0237160 A1* | 8/2019 | Rothberg | G16B 30/10 |
| 2019/0292590 A1 | 9/2019 | Zhong et al. | |
| 2019/0391010 A1 | 12/2019 | Thurston et al. | |
| 2020/0072752 A1 | 3/2020 | Cipriany | |
| 2020/0124864 A1 | 4/2020 | Rothberg et al. | |
| 2020/0219590 A1 | 7/2020 | Reed et al. | |
| 2020/0408690 A1 | 12/2020 | Yang et al. | |
| 2021/0215605 A1 | 7/2021 | Schmid et al. | |
| 2021/0217800 A1 | 7/2021 | Webster et al. | |

FOREIGN PATENT DOCUMENTS

| | | |
|---|---|---|
| EP | 3483938 A1 | 5/2019 |
| WO | WO 2010/025331 A1 | 3/2010 |
| WO | WO 2011/103507 A1 | 8/2011 |
| WO | WO 2011/153962 A1 | 12/2011 |
| WO | WO 2016/022998 A2 | 2/2016 |
| WO | WO 2016/128198 A1 | 8/2016 |
| WO | WO 2016/187580 A1 | 11/2016 |
| WO | WO 2017/210413 A1 | 12/2017 |
| WO | WO 2018/096980 A2 | 5/2018 |
| WO | WO 2020/102741 A1 | 5/2020 |

OTHER PUBLICATIONS

Invitation to Pay Additional Fees for International Application No. PCT/US2015/044360 dated Nov. 20, 2015.
International Search Report and Written Opinion for International Application No. PCT/US2015/044360 dated Feb. 3, 2016.
International Search Report and Written Opinion for International Application No. PCT/US2017/068089 dated Mar. 27, 2018.
Invitation to Pay Additional Fees for International Application No. PCT/US2019/048824 dated Dec. 9, 2019.
International Search Report and Written Opinion for International Application No. PCT/US2019/048824 dated Jan. 31, 2020.
Invitation to Pay Additional Fees for International Application No. PCT/US2019/038105 dated Sep. 16, 2019.
International Search Report and Written Opinion for International Application No. PCT/US2019/038105 dated Nov. 26, 2019.
Invitation to Pay Additional Fees for International Application No. PCT/US2020/039868 dated Oct. 22, 2020.
International Search Report and Written Opinion for International Application No. PCT/US2020/039868 dated Dec. 15, 2020.
International Search Report and Written Opinion for International Application No. PCT/US2021/013501 dated Apr. 14, 2021.
International Search Report and Written Opinion for International Application No. PCT/US2021/013505 dated May 11, 2021.
Hale, Fibre Optic Sensors using Adiabatically Tapered Single Mode Fibres. Dissertation submitted to the University of Cambridge. Feb. 1994. 209 pages.
Mogensen et al., A Microfluidic Device with an Integrated Waveguide Beam Splitter for Velocity Measurements of Flowing Particles by Fourier Transformation. Analytical Chemistry. Sep. 15 2003;75(18):4931-4936.
Swaminathan et al. A theoretical justification for single molecule peptide sequencing. PLoS Comput Biol. Feb. 25, 2015;11(2):e1004080. 17 pages.

(56) References Cited

OTHER PUBLICATIONS

Taitt et al., Evanescent wave fluorescence biosensors. Biosens Bioelectron. Jun. 2005;20(12):2470-87. Epub Dec. 8, 2004.
Yao et al., Single-molecule protein sequencing through fingerprinting: computational assessment. Physical biology. Aug. 11, 2015;12(5):055003. 7 pages.
U.S. Appl. No. 17/149,310, filed Jan. 14, 2021, Schmid et al.
EP 18202357.2, Mar. 15, 2019, Extended European Search Report.
PCT/US2015/044360, Nov. 20, 2015, Invitation to Pay Additional Fees.
PCT/US2015/044360, Feb. 3, 2016, International Search Report and Written Opinion.
PCT/US2017/068089, Mar. 27, 2018, International Search Report and Written Opinion.
PCT/US2019/048824, Dec. 9, 2019, Invitation to Pay Additional Fees.
PCT/US2019/048824, Jan. 31, 2020, International Search Report and Written Opinion.
PCT/US2019/038105, Nov. 26, 2019, International Search Report and Written Opinion.
PCT/US2019/038105, Sep. 16, 2019, Invitation to Pay Additional Fees.
PCT/US2020/039868, Oct. 22, 2020, Invitation to Pay Additional Fees.
PCT/US2020/039868, Dec. 15, 2020, International Search Report and Written Opinion.
PCT/US2021/013501, Apr. 14, 2021, International Search Report and Written Opinion.
International Search Report and Written Opinion for International Application No. PCT/US2021/020521 dated Jun. 4, 2021.
International Preliminary Report on Patentability for International Application No. PCT/US2021/020521 dated Sep. 15, 2022.
International Preliminary Report on Patentability for International Application No. PCT/US2021/013505 dated Jul. 28, 2022.

* cited by examiner

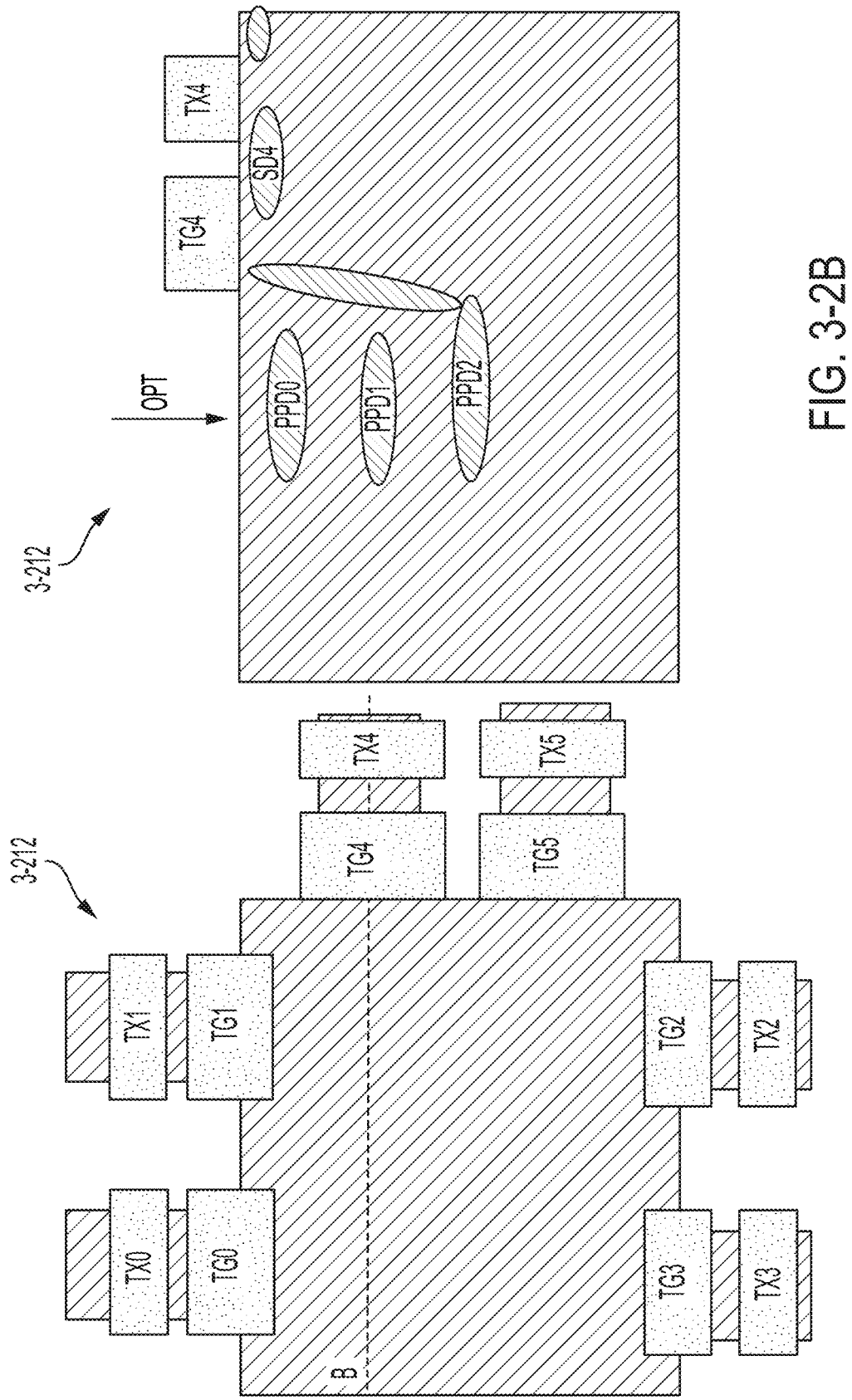

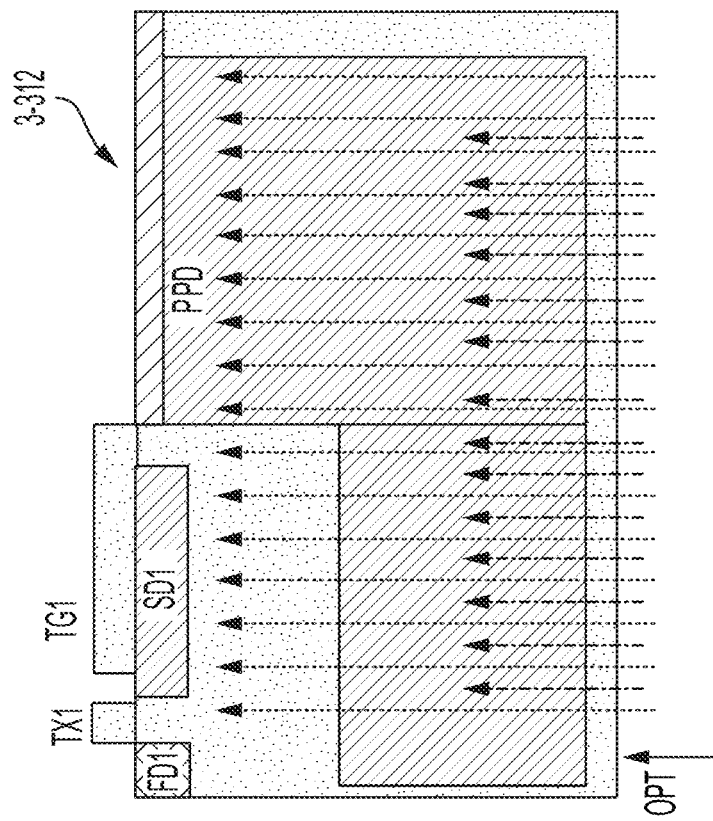
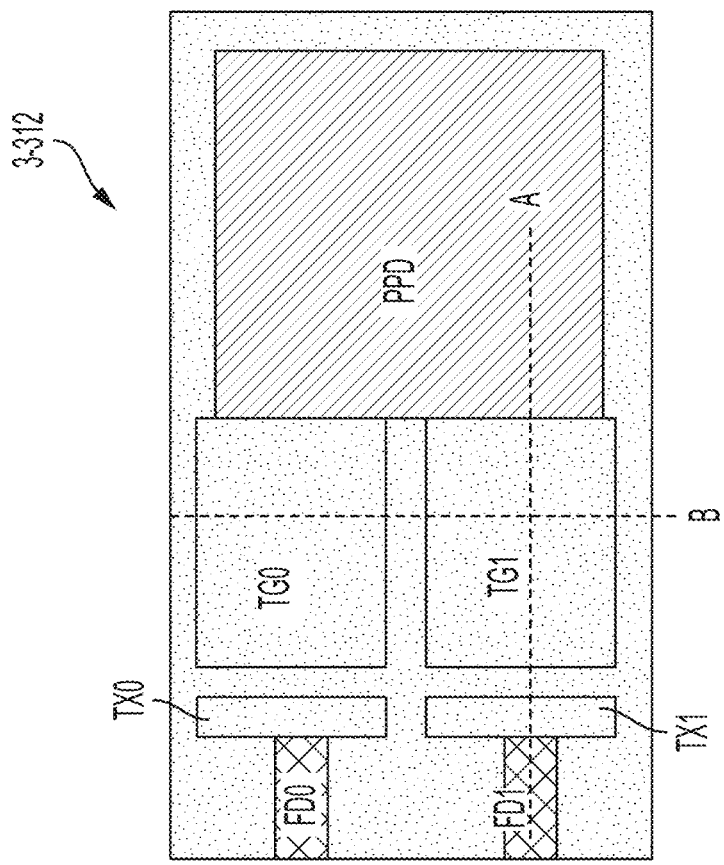
FIG. 3-3B
FIG. 3-3A

Siganl examples

| Pulse number | Intensity | Wavelength | Lifetime |
|---|---|---|---|
| 1 | Low | Short | Short |
| 2 | Low | Short | Long |
| 3 | Low | Long | Short |
| 4 | Low | Long | Long |
| 5 | High | Short | Short |
| 6 | High | Short | Long |
| 7 | High | Long | Short |
| 8 | High | Long | Long |

FIG. 4-4 CONT.

INTEGRATED SENSOR FOR MULTI-DIMENSIONAL SIGNAL ANALYSIS

CROSS-REFERENCE TO RELATED APPLICATIONS

This application claims the benefit under 35 U.S.C. § 119(e) of U.S. provisional patent application Ser. No. 62/984,229, entitled "INTEGRATED SENSOR FOR MULTI-DIMENSIONAL SIGNAL ANALYSIS", filed Mar. 2, 2020, which is incorporated by reference in its entirety herein.

FIELD OF THE DISCLOSURE

The present disclosure relates to integrated devices and related instruments that can perform massively-parallel analyses of samples by providing short optical pulses to tens of thousands of sample wells or more simultaneously and receiving fluorescent signals from the sample wells for sample analyses. The instruments may be useful for point-of-care genetic sequencing and for personalized medicine.

BACKGROUND

Photodetectors are used to detect light in a variety of applications. Integrated photodetectors have been developed that produce an electrical signal indicative of the intensity of incident light. Integrated photodetectors for imaging applications include an array of pixels to detect the intensity of light received from across a scene. Examples of integrated photodetectors include charge coupled devices (CCDs) and Complementary Metal Oxide Semiconductor (CMOS) image sensors.

Instruments that are capable of massively-parallel analyses of biological or chemical samples are typically limited to laboratory settings because of several factors that can include their large size, lack of portability, requirement of a skilled technician to operate the instrument, power need, need for a controlled operating environment, and cost. When a sample is to be analyzed using such equipment, a common paradigm is to extract a sample at a point of care or in the field, send the sample to the lab and wait for results of the analysis. The wait time for results can range from hours to days.

SUMMARY OF THE DISCLOSURE

Some aspects of the present disclosure relate to an integrated circuit, comprising: at least one photodetection region configured to generate charge carriers responsive to incident photons emitted from a sample; at least one charge storage region configured to receive the charge carriers from the photodetection region; and at least one component configured to obtain information about the incident photons, the information comprising at least one of pulse duration information and/or interpulse duration information and at least one member selected from a group comprising wavelength information, luminescence lifetime information, and intensity information.

Some aspects of the disclosure relate to an integrated circuit, comprising: at least one photodetection region configured to generate charge carriers responsive to incident photons emitted from a sample; at least one charge storage region configured to receive the charge carriers from the photodetection region; and at least one component configured to obtain information about the incident photons, the information comprising at least three of wavelength information, luminescence lifetime information, intensity information, pulse duration information, and interpulse duration information.

Some aspects of the disclosure relate to an integrated circuit, comprising: at least one photodetection region configured to generate charge carriers responsive to incident photons emitted from a sample; at least one charge storage region configured to receive the charge carriers from the photodetection region; and at least one component configured to obtain information about the incident photons, the information comprising interpulse duration information and at least one member selected from a group comprising wavelength information, luminescence lifetime information, intensity information, and pulse duration information.

Some aspects of the disclosure relate to an integrated circuit, comprising: at least one photodetection region configured to generate charge carriers responsive to incident photons emitted from a sample; at least one charge storage region configured to receive the charge carriers from the photodetection region; and at least one component configured to obtain information about the incident photons, the information comprising at least three members selected from s group comprising wavelength information, luminescence lifetime information, intensity information, pulse duration information, and interpulse duration information.

Some aspects of the disclosure relate to an integrated circuit, comprising: at least one photodetection region configured to generate charge carriers responsive to incident photons emitted from a sample; at least one charge storage region configured to receive the charge carriers from the photodetection region; and at least one component configured to obtain information about the incident photons, the information comprising at least four members selected from s group comprising wavelength information, luminescence lifetime information, intensity information, pulse duration information, and interpulse duration information.

Some aspects of the disclosure relate to an integrated circuit, comprising: at least one photodetection region configured to generate charge carriers responsive to incident photons emitted from a sample; at least one charge storage region configured to receive the charge carriers from the photodetection region; and at least one component configured to obtain information about the incident photons, the information comprising wavelength information, luminescence lifetime information, intensity information, pulse duration information, and interpulse duration information.

Some aspects of the disclosure relate to a device that determines information about a sample which emits emission light in response to excitation light, the information comprising at least one member selected from a group comprising pulse duration and interpulse duration characteristics of the emission light and at least one member selected from a group comprising wavelength, intensity, and luminescence lifetime characteristics of the emission light.

Some aspects of the disclosure relate to a device, comprising: a sample well that receives a sample which emits emission light in response to excitation light; a photodetector that produces charge carriers in response to the emission light; and a component that determines at least two members selected from a group comprising wavelength, intensity, luminescence lifetime, pulse duration, and interpulse duration characteristics of the emission light based at least in part on one or more characteristics of the charge carriers.

Some aspects of the disclosure relate to a method, comprising: exciting a sample with excitation light; and determining at least three members selected from a group comprising wavelength, intensity, lifetime, pulse duration and interpulse duration characteristics of light emitted by the sample in response to the excitation light.

Some aspects of the disclosure relate to a method, comprising: exciting a sample with excitation light; determining pulse duration characteristics of light emitted by the sample in response to the excitation light; and determining at least one member selected from a group comprising wavelength, intensity, lifetime, and interpulse duration characteristics of the light emitted by the sample in response to the excitation light.

Some aspects of the disclosure relate to a method, comprising: exciting a sample with excitation light; determining interpulse duration characteristics of light emitted by the sample in response to the excitation light; and determining at least one member selected from a group comprising wavelength, intensity, lifetime, and pulse duration characteristics of the light emitted by the sample in response to the excitation light.

Some aspects of the disclosure relate to a method, comprising: determining information about a sample that emits emission light in response to excitation light based on at least three members selected from a group comprising wavelength, intensity, lifetime, pulse duration and interpulse duration characteristics of the emission light.

Some aspects of the disclosure relate to a device, comprising: a plurality of sample wells, each sample well configured to receive a sample that, in response to excitation light, emits emission light; a waveguide that directs the excitation light to the plurality of sample wells; a plurality of sensors, each sensor of the plurality of sensors configured to generate charge carriers in response to the emission light; and one or more processors configured to determine at least one member selected from a group comprising pulse duration and interpulse duration characteristics of the emission light and one member selected from a group comprising wavelength, lifetime, and intensity characteristics of the emission light from one or more sample wells of the plurality of sample wells and to determine information about the sample based at least in part on the at least two characteristics.

Some aspects of the disclosure relate to a device, comprising: a plurality of sample wells, each sample well configured to receive a sample that, in response to excitation light, emits emission light; a waveguide that directs the excitation light to the plurality of sample wells; a plurality of sensors, each sensor of the plurality of sensors configured to generate charge carriers in response to the emission light; and one or more processors configured to determine at least three members selected from a group comprising wavelength, lifetime, intensity, pulse duration and interpulse duration characteristics of the emission light from one or more sample wells of the plurality of sample wells and to determine information about the sample based at least in part on the at least two characteristics.

Some aspects of the disclosure relate to a device, comprising: at least one photodetection region configured to generate charge carriers responsive to incident photons emitted from a sample; and at least one component configured to obtain information about the incident photons, the information comprising any of three, four, or five characteristics selected from a group comprising wavelength information, luminescence lifetime information, intensity information, pulse duration information, and interpulse duration information.

Some aspects of the disclosure relate to an integrated circuit comprising: at least one photodetection region configured to generate charge carriers responsive to incident photons emitted from a sample; at least one component configured to obtain information about the incident photons, the information comprising any of three, four, or five members selected from a group comprising pulse duration information, interpulse duration information, wavelength information, luminescence lifetime information, and intensity information, wherein: the at least one component comprises a plurality of components, each one of the plurality of components being configured to obtain a different one of the three, four, or five members selected from the group comprising pulse duration information, interpulse duration information, wavelength information, luminescence lifetime information, and intensity information.

Some aspects of the disclosure relate to an integrated circuit comprising: at least one photodetection region configured to generate charge carriers responsive to incident photons emitted from a sample; at least one component configured to obtain information about the incident photons, the information comprising any of three, four, or five characteristics selected from a group comprising pulse duration information, interpulse duration information, wavelength information, luminescence lifetime information, and intensity information, wherein: the at least one component comprises a first component being configured to obtain each of the three, four, or five members selected from the group comprising pulse duration information, interpulse duration information, wavelength information, luminescence lifetime information, and intensity information.

Some aspects of the disclosure relate to an integrated circuit comprising: at least one photodetection region configured to generate charge carriers responsive to incident photons emitted from a sample; at least one component configured to obtain information about the incident photons, the information comprising any of three, four, or five characteristics selected from a group comprising pulse duration information, interpulse duration information, wavelength information, luminescence lifetime information, and intensity information, the at least one component comprising: a first component being configured to obtain at least two of the members selected from the group comprising pulse duration information, interpulse duration information, wavelength information, luminescence lifetime information, and intensity information; and a second component being configured to obtain at least one of the members selected from the group comprising pulse duration information, interpulse duration information, wavelength information, luminescence lifetime information and intensity information; the at least one member obtained by the second component being different than the at least two members obtained by the first component.

BRIEF DESCRIPTION OF DRAWINGS

FIG. 1-1B is a schematic of a pixel of an integrated device, according to some embodiments.

FIG. 1-1C is a circuit diagram of the pixel of FIG. 1-1B, according to some embodiments.

FIG. 1-1D is a plan view of the pixel of FIGS. 1-1B and 1-1C, according to some embodiments.

FIG. 1-2A depicts emission probability curves for two different fluorophores having different decay characteristics, according to some embodiments.

FIG. 1-2B depicts time-binning detection of fluorescent emission, according to some embodiments.

FIG. 1-2C depicts a time-binning photodetector, according to some embodiments.

FIG. 1-2D depicts a pulsed excitation and time-binned detection of fluorescent emission from a sample, according to some embodiments.

FIG. 1-2E depicts a histogram of accumulated fluorescent photon counts in various time bins after a repeated pulsed excitation of a sample, according to some embodiments.

FIG. 2-1 is a side view of an exemplary pixel having a time-gated charge storage region and a direct-excitation charge storage region configured to receive incident photons from a light source via a photodetection region, according to some embodiments.

FIG. 2-2 is a side view of an alternative exemplary pixel having a time-gated charge storage region and a direct-excitation charge storage region configured to receive incident photons from a light source via a photodetection region, according to some embodiments.

FIG. 2-3 is a side view of an exemplary pixel having a time-gated charge storage region, a direct-excitation charge storage region configured to receive incident photons from a light source, and a photodetection region configured to receive at least some of the incident photons via the direct-excitation charge storage region, according to some embodiments.

FIG. 2-4 is a side view of an exemplary pixel having two photodetection regions of different depths and two time-gated charge storage regions, according to some embodiments.

FIG. 2-5 is a side view of an exemplary pixel having three photodetection regions of different depths, according to some embodiments.

FIG. 3-1A is a top view of an exemplary pixel having one photodetection region and four charge storage regions, according to some embodiments.

FIG. 3-1B is a cross-sectional view of a portion of the pixel of FIG. 3-1A, according to some embodiments.

FIG. 3-2A is a top view of an exemplary pixel having one photodetection region and six charge storage regions, according to some embodiments.

FIG. 3-2B is a cross-sectional view of a portion of the pixel of FIG. 3-2A, according to some embodiments.

FIG. 3-3A is a top view of an exemplary pixel having one photodetection region and two charge storage regions, according to some embodiments.

FIG. 3-3B is a cross-sectional view of a portion of the pixel of FIG. 3-3A, according to some embodiments.

FIG. 3-3C is an alternate cross-sectional view of a portion of the pixel of FIG. 3-3A, according to some embodiments.

FIG. 3-4 is a side view of an example pixel having two charge storage regions with one of the charge storage regions having optical shielding, according to some embodiments.

FIG. 4-1 is a side view of an exemplary pixel having an optical sorting element, two photodetection regions, and two time-gated charge storage regions, according to some embodiments.

FIG. 4-2 is a side view of an alternative exemplary pixel having an optical sorting element, two photodetection regions, and two time-gated charge storage regions, according to some embodiments.

FIGS. 4-3A-E show non-limiting examples of characteristic pulse patterns for sample molecules under analysis, according to some embodiments.

FIG. 4-4 shows one example of data collected for a multi-dimensional discrimination technique, according to some embodiments.

FIG. 5-1A is a block diagram of an integrated device and an instrument, according to some embodiments.

FIG. 5-1B is a schematic of an apparatus including an integrated device, according to some embodiments.

FIG. 5-1C is a block diagram depiction of an analytical instrument that includes a compact mode-locked laser module, according to some embodiments.

FIG. 5-1D depicts a compact mode-locked laser module incorporated into an analytical instrument, according to some embodiments.

FIG. 5-2 depicts a train of optical pulses, according to some embodiments.

FIG. 5-3 depicts an example of parallel reaction chambers that can be excited optically by a pulsed laser via one or more waveguides according to some embodiments.

FIG. 5-4 illustrates optical excitation of a reaction chamber from a waveguide, according to some embodiments.

FIG. 5-5 depicts further details of an integrated reaction chamber, optical waveguide, and time-binning photodetector, according to some embodiments.

FIG. 5-6 depicts an example of a biological reaction that can occur within a reaction chamber, according to some embodiments.

FIG. 5-7 depicts emission probability curves for two different fluorophores having different decay characteristics according to some embodiments.

FIG. 5-8 depicts time-binning detection of fluorescent emission, according to some embodiments.

FIG. 5-9 depicts a time-binning photodetector, according to some embodiments.

FIG. 5-10A depicts pulsed excitation and time-binned detection of fluorescent emission from a sample, according to some embodiments.

FIG. 5-10B depicts a histogram of accumulated fluorescent photon counts in various time bins after repeated pulsed excitation of a sample, according to some embodiments.

FIG. 5-11A-5-11D depict different histograms that may correspond to four nucleotides (T, A, C, G) or nucleotide analogs, according to some embodiments.

FIG. 5-12 illustrates an example graph illustrating a three-dimensional discrimination technique for identifying amino acids FIG. 5-13 is a flow diagram illustrating a method of sequencing a labeled polypeptide by Edman degradation according to some embodiments.

FIG. 5-14 includes a flow diagram illustrating a method of sequencing in which discrete binding events give rise to signal pulses of a signal output, and a graph illustrating the signal output according to some embodiments.

Figures 1, 1A:
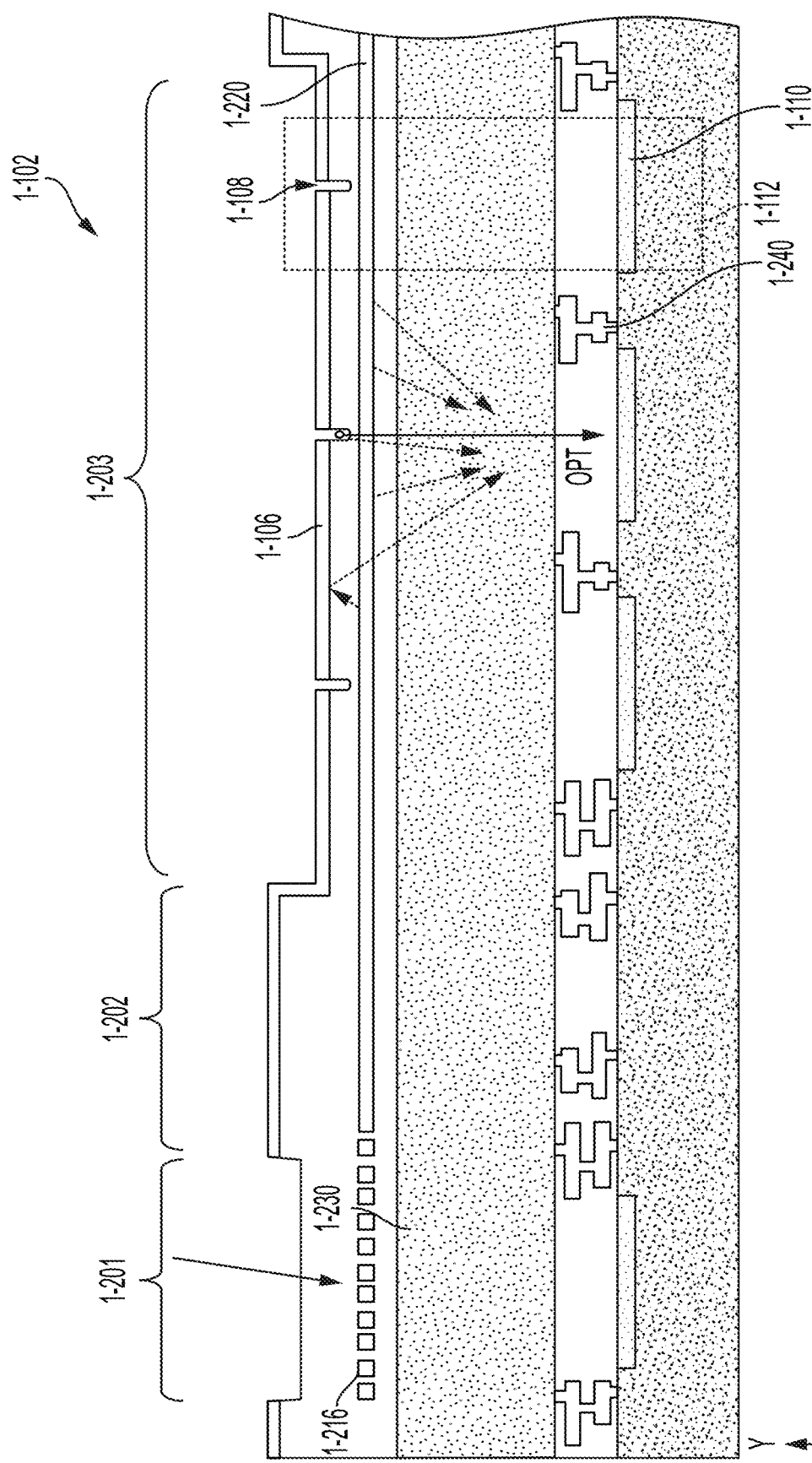
FIG. 1-1A is a schematic of an integrated device, according to some embodiments.

The features and advantages of the present invention will become more apparent from the detailed description set forth below when taken in conjunction with the drawings. When describing embodiments in reference to the drawings, directional references ("above," "below," "top," "bottom," "left," "right," "horizontal," "vertical," etc.) may be used. Such references are intended merely as an aid to the reader viewing the drawings in a normal orientation. These directional references are not intended to describe a preferred or only orientation of features of an embodied device. A device may be embodied using other orientations.

DETAILED DESCRIPTION

I. Introduction

Aspects of the present disclosure relate to integrated devices, instruments and related systems capable of analyzing samples in parallel, including identification of single molecules and nucleic acid sequencing. Such an instrument may be compact, easy to carry, and easy to operate, allowing a physician or other provider to readily use the instrument and transport the instrument to a desired location where care may be needed. Analysis of a sample may include labeling the sample with one or more fluorescent markers, which may be used to detect the sample and/or identify single molecules of the sample (e.g., individual nucleotide identification as part of nucleic acid sequencing). A fluorescent marker may become excited in response to illuminating the fluorescent marker with excitation light (e.g., light having a characteristic wavelength that may excite the fluorescent marker to an excited state) and, if the fluorescent marker becomes excited, emit emission light (e.g., light having a characteristic wavelength emitted by the fluorescent marker by returning to a ground state from an excited state). Detection of the emission light may allow for identification of the fluorescent marker, and thus, the sample or a molecule of the sample labeled by the fluorescent marker. According to some embodiments, the instrument may be capable of massively-parallel sample analyses and may be configured to handle tens of thousands of samples or more simultaneously.

The inventors have recognized and appreciated that an integrated device, having sample wells configured to receive the sample and integrated optics formed on the integrated device, and an instrument configured to interface with the integrated device may be used to achieve analysis of this number of samples. The instrument may include one or more excitation light sources, and the integrated device may interface with the instrument such that the excitation light is delivered to the sample wells using integrated optical components (e.g., waveguides, optical couplers, optical splitters) formed on the integrated device. The optical components may improve the uniformity of illumination across the sample wells of the integrated device and may reduce a large number of external optical components that might otherwise be needed. Furthermore, the inventors have recognized and appreciated that integrating photodetectors (e.g., photodiodes) on the integrated device may improve detection efficiency of fluorescent emissions from the sample wells and reduce the number of light-collection components that might otherwise be needed.

The inventors have further recognized that certain characteristics of fluorescent emissions from the sample wells may be measured and analyzed for use in a number of applications. For example, certain characteristics of emitted light may enable identification of the sample being analyzed (e.g., identification of a fluorescent marker) which can facilitate genetic sequencing applications, such as DNA, RNA, and/or protein sequencing. Multiple characteristics of emission light may be obtained, including information regarding intensity, wavelength, lifetime, pulse duration, interpulse duration and any combination thereof, to enable multi-dimensional discrimination techniques for analyzing a chemical or biological sample. In some embodiments, the device is configured to obtain measurements for characteristics of emitted light to enable techniques for 2-D, 3-D, 4-D, and 5-D discrimination of one or more samples under analysis.

For example, the inventors have developed techniques for obtaining spectral information such as wavelength of the incident light emitted from a sample well. For instance, in some aspects, a pixel may include one or more charge storage regions configured to receive charge carriers generated responsive to incident photons from a light source, with charge carriers stored in the charge storage region(s) indicative of spectral and timing information. In one example, two charge storage regions may receive charge carriers generated responsive to incident light at different wavelengths, such that a difference in power spectral density of the incident light is indicated in the accumulated charge in the charge storage regions. Alternatively or additionally, in some aspects, a pixel may include regions having different depths, each configured to generate charge carriers responsive to incident photons. For instance, in one example, the pixel may include two or more photodetection regions having different depths (e.g., along the optical axis) such that charge carriers are generated in the different photodetection regions responsive to incident photons of different wavelengths. Alternatively or additionally, in some aspects, a pixel may include multiple charge storage regions having different depths, and one or more of the charge storage regions may be configured to receive the incident photons and generate charge carriers therein. Another of the charge storage regions may be configured to receive charge carriers generated in the photodetection region(s) of the pixel. In some aspects, a pixel may alternatively or additionally include an optical sorting element configured to direct at least some incident photons to one charge storage region and other incident photons to another charge storage region. For instance, in one example, the optical sorting element may include an at least partially refractive, diffractive, scattering, and/or plasmonic element. The inventors have recognized that wavelength information may be used as one degree of discrimination in some embodiments of 2-D, 3-D, 4-D and/or 5-D discrimination sample analysis techniques.

In addition, the inventors have developed methods for obtaining, separately and in any combination, lifetime, pulse duration, interpulse duration, and intensity information for a sample under analysis. In particular, time-gating techniques may be used to obtain measurements of fluorescence lifetime, pulse width/duration, and/or interpulse duration of an emission from a sample under analysis. In some embodiments, one or more measurements for intensity of emission light are obtained by collecting and quantifying charge carriers generated by incident photons in one or more charge storage regions. The inventors have recognized that such fluorescence lifetime, pulse duration, interpulse duration, and/or intensity information may be used as degrees of discrimination in some embodiments of 2-D, 3-D, 4-D and/or 5-D discrimination sample analysis techniques in addition or alternative to wavelength information. For example, in 2-D discrimination techniques, discrimination of a sample may be based on any two types of information used in combination, such as wavelength and intensity, lifetime and intensity, etc. For 3-D discrimination techniques, discrimination of a sample may be performed based on any three types of information used in combination, such as wavelength, lifetime, and intensity, etc. Likewise, 4-D discrimination techniques may be performed based on any four types of information used in combination and 5-D discrimination techniques may be performed based on any five types of information used in combination.

Thus, the inventors have recognized that the techniques described herein for obtaining wavelength, lifetime, pulse duration, interpulse duration, and intensity information and/or any other suitable characteristic of emission light from a sample may be used to facilitate multi-dimensional analysis of a biological or chemical sample using any combination of characteristics described herein. In some embodiments, the multi-dimensional analysis may be used for identifying the particular sample from which emission light is collected and analyzed, for example, identifying a particular amino acid or nucleotide. The inventors have recognized that multi-dimensional analysis of a sample can provide for more accurate identification of a molecule as opposed to single dimensional analysis. In addition, techniques using more dimensions can provide for more accurate identification of a molecule compared to techniques which use fewer dimensions for analysis.

In some embodiments, a two-dimensional discrimination technique is used for analyzing and identifying a sample based on characteristics of emission light associated with the sample. Any suitable grouping of characteristics may be used in such two-dimensional techniques, for example, lifetime and wavelength information, and/or wavelength and intensity information. In some embodiments, a three-dimensional discrimination technique is used for analyzing and identifying a sample, for example, using wavelength, lifetime, and intensity information, using wavelength, pulse duration, interpulse duration, and lifetime information, and/or any other suitable grouping of characteristics. In some embodiments, a four-dimensional discrimination technique is used for analyzing and identifying a sample, for example, using wavelength, lifetime, intensity, pulse duration and interpulse duration information of collected emission light associated with a sample under analysis. In some embodiments, the integrated device is configured for massively parallel sample analysis and thus the multi-dimensional analysis techniques can be used for analyzing and identifying a high volume of samples at a time.

It should be appreciated that integrated devices described herein may incorporate any or all techniques described herein alone or in combination.

II. Integrated Device Overview

The multi-dimensional signal analysis techniques described herein may, in some embodiments, be implemented using an integrated device, such as integrated device 1-102 shown in FIG. 1-1A. A cross-sectional schematic of integrated device 1-102 illustrating a row of pixels 1-112 is shown in FIG. 1-1A. Integrated device 1-102 may include coupling region 1-201, routing region 1-202, and pixel region 1-203. Pixel region 1-203 may include a plurality of pixels 1-112 having sample wells 1-108 positioned on a surface at a location separate from coupling region 1-201, which is where excitation light (shown as the dashed arrow) couples to integrated device 1-102. Sample wells 1-108 may be formed through metal layer(s) 1-106. One pixel 1-112, illustrated by the dotted rectangle, is a region of integrated device 1-102 that includes a sample well 1-108 and a photodetection region having one or more photodetectors 1-110.

FIG. 1-1A illustrates the path of excitation (shown in dashed lines) by coupling a beam of excitation light to coupling region 1-201 and to sample wells 1-108. The row of sample wells 1-108 shown in FIG. 1-1A may be positioned to optically couple with waveguide 1-220. Excitation light may illuminate a sample located within a sample well. The sample may reach an excited state in response to being illuminated by the excitation light. When a sample is in an excited state, the sample may emit emission light, which may be detected by one or more photodetectors associated with the sample well. FIG. 1-1A schematically illustrates an optical axis of emission light OPT from a sample well 1-108 to photodetector(s) 1-110 of pixel 1-112. The photodetector(s) 1-110 of pixel 1-112 may be configured and positioned to detect emission light from sample well 1-108. Examples of suitable photodetectors are described in U.S. patent application Ser. No. 14/821,656 titled "INTEGRATED DEVICE FOR TEMPORAL BINNING OF RECEIVED PHOTONS," filed Aug. 7, 2015 which is hereby incorporated by reference herein in its entirety. For an individual pixel 1-112, a sample well 1-108 and its respective photodetector(s) 1-110 may be aligned along a common axis (along the y-direction shown in FIG. 1-1A). In this manner, the photodetector(s) may overlap with the sample well within a pixel 1-112.

The directionality of the emission light from a sample well 1-108 may depend on the positioning of the sample in the sample well 1-108 relative to metal layer(s) 1-106 because metal layer(s) 1-106 may act to reflect emission light. In this manner, a distance between metal layer(s) 1-106 and a fluorescent marker positioned in a sample well 1-108 may impact the efficiency of photodetector(s) 1-110, that are in the same pixel as the sample well, to detect the light emitted by the fluorescent marker. The distance between metal layer(s) 1-106 and the bottom surface of a sample well 1-106, which is proximate to where a sample may be positioned during operation, may be in the range of 100 nm to 500 nm, or any value or range of values in that range. In some embodiments the distance between metal layer(s) 1-106 and the bottom surface of a sample well 1-106 is approximately 300 nm.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a sample well 1-106 and photodetector(s) may be in the range of 5 µm to 15 µm, or any value or range of values in that range. It should be appreciated that, in some embodiments, emission light may be provided through other means than an excitation light source and a sample well. Accordingly, some embodiments may not include sample well 1-108.

Photonic structure(s) 1-230 may be positioned between sample wells 1-108 and photodetectors 1-110 and configured to reduce or prevent excitation light from reaching photodetectors 1-110, which may otherwise contribute to signal noise in detecting emission light. As shown in FIG. 1-1A, the one or more photonic structures 1-230 may be positioned between waveguide 1-220 and photodetectors 1-110. Photonic structure(s) 1-230 may include one or more optical rejection photonic structures including a spectral filter, a polarization filter, and a spatial filter. Photonic structure(s) 1-230 may be positioned to align with individual sample wells 1-108 and their respective photodetector(s) 1-110 along a common axis. Metal layers 1-240, which may act as a circuitry for integrated device 1-102, may also act as a spatial filter, or polarization filter, in accordance with some embodiments. In such embodiments, one or more metal layers 1-240 may be positioned to block some or all excitation light from reaching photodetector(s) 1-110.

Coupling region 1-201 may include one or more optical components configured to couple excitation light from an external excitation source. Coupling region 1-201 may include grating coupler 1-216 positioned to receive some or all of a beam of excitation light. Examples of suitable grating couplers are described in U.S. patent application Ser. No. 15/844,403 titled "OPTICAL COUPLER AND WAVEGUIDE SYSTEM," filed Dec. 15, 2017 which is hereby incorporated by reference herein in its entirety. Grating coupler 1-216 may couple excitation light to waveguide 1-220, which may be configured to propagate excitation light to the proximity of one or more sample wells 1-108.

Alternatively, coupling region 1-201 may comprise other well-known structures for coupling light into a waveguide.

Components located off of the integrated device may be used to position and align the excitation source 1-106 to the integrated device. Such components may include optical components including lenses, mirrors, prisms, windows, apertures, attenuators, and/or optical fibers. Additional mechanical components may be included in the instrument to allow for control of one or more alignment components. Such mechanical components may include actuators, stepper motors, and/or knobs. Examples of suitable excitation sources and alignment mechanisms are described in U.S. patent application Ser. No. 15/161,088 titled "PULSED LASER AND SYSTEM," filed May 20, 2016 which is hereby incorporated by reference in its entirety. Another example of a beam-steering module is described in U.S. patent application Ser. No. 15/842,720 titled "COMPACT BEAM SHAPING AND STEERING ASSEMBLY," filed Dec. 14, 2017 which is hereby incorporated herein by reference.

A sample to be analyzed may be introduced into sample well 1-108 of pixel 1-112. The sample may be a biological sample or any other suitable sample, such as a chemical sample. The sample may include multiple molecules and the sample well may be configured to isolate a single molecule. In some instances, the dimensions of the sample well may act to confine a single molecule within the sample well, allowing measurements to be performed on the single molecule. Excitation light may be delivered into the sample well 1-108, so as to excite the sample or at least one fluorescent marker attached to the sample or otherwise associated with the sample while it is within an illumination area within the sample well 1-108.

In operation, parallel analyses of samples within the sample wells are carried out by exciting some or all of the samples within the wells using excitation light and detecting signals from sample emission with the photodetectors. Emission light from a sample may be detected by a corresponding photodetector and converted to at least one electrical signal. Information regarding various characteristics of the emission light (e.g., wavelength, fluorescence lifetime, intensity, pulse duration and/or any other suitable characteristic) may be collected and used for subsequent analysis, as described herein. The electrical signals may be transmitted along conducting lines (e.g., metal layers 1-240) in the circuitry of the integrated device, which may be connected to an instrument interfaced with the integrated device. The electrical signals may be subsequently processed and/or analyzed. Processing or analyzing of electrical signals may occur on a suitable computing device either located on or off the instrument.

Figures 1, 1B:
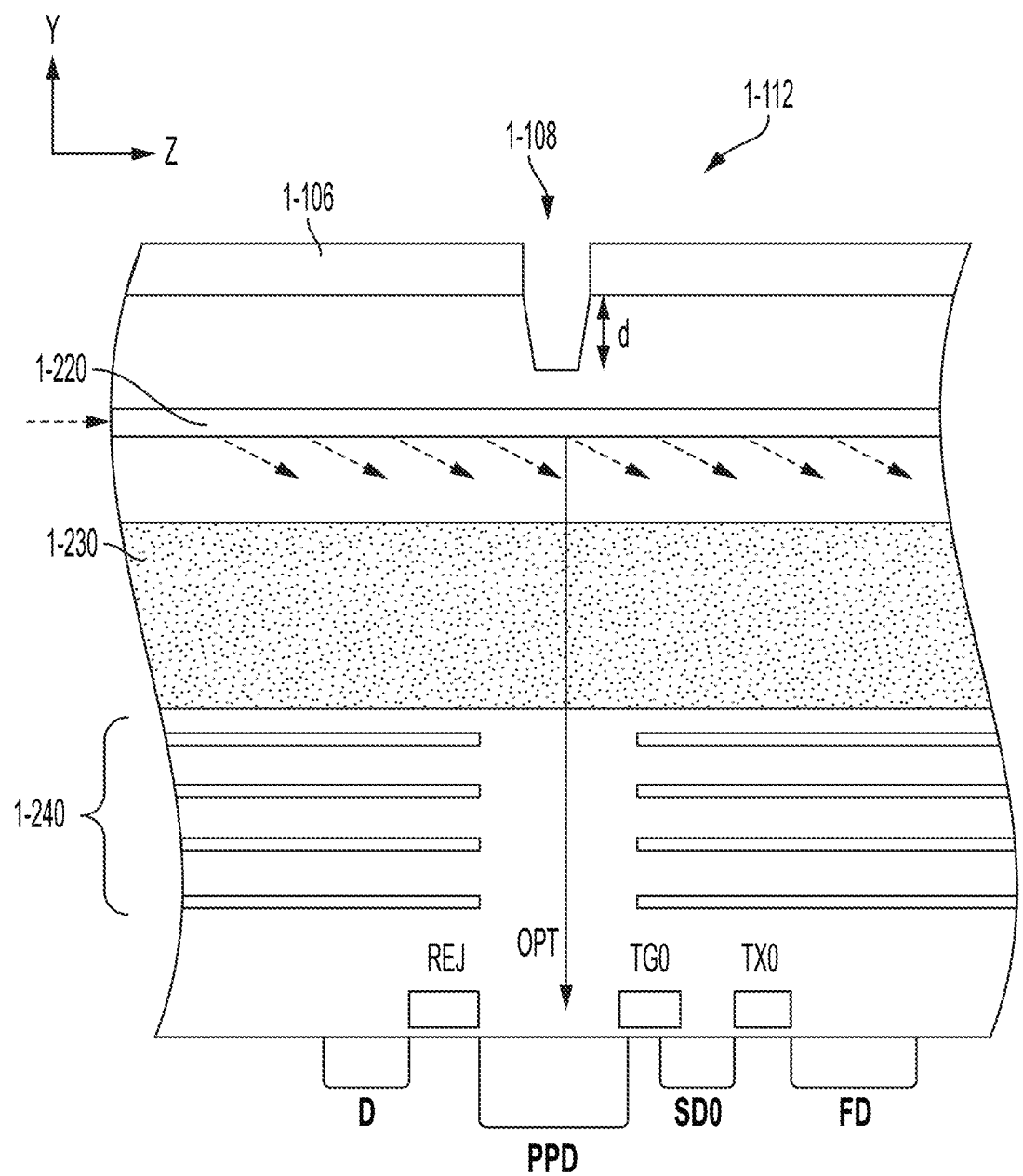

FIG. 1-1B illustrates a cross-sectional view of a pixel 1-112 of integrated device 1-102. Pixel 1-112 includes photodetection region, which may be a pinned photodiode (PPD), and a storage region, which may be a storage diode (SD0). During operation of pixel 1-112, excitation light may illuminate sample well 1-108 causing incident photons, including fluorescence emissions from a sample, to flow along an optical axis to photodetection region PPD. When transfer gate TG0 induces a first electrical bias at the semiconductor region between photodetection region PPD and storage region SD0, a transfer path may be formed in the semiconductor region. Charge carriers (e.g., photo-electrons) generated in photodetection region PPD by the incident photons may flow along the transfer path to storage region SD0. In some embodiments, the first electrical bias may be applied during a binning period during which charge carriers from the sample are selectively directed to storage region SD0. Alternatively, when transfer gate TG0 provides a second electrical bias at the semiconductor region between photodetection region PPD and storage region SD0, charge carriers from photodetection region PPD may be blocked from reaching storage region SD0 along the transfer path. For example, in some embodiments, drain gate REJ may provide a channel to drain D to draw noise charge carriers generated in photodetection region PPD by the excitation light away from photodetection region PPD and storage region SD0, such as during a rejection period before fluorescent emission photons from the sample reach photodetection region PPD. In some embodiments, during a readout period, transfer gate TG0 may provide the second electrical bias and transfer gate TX0 may provide an electrical bias to cause charge carriers stored in storage region SD0 to flow to the readout region, which may be a floating diffusion (FD) region, for processing. It should be appreciated that, in accordance with various embodiments, transfer gates described herein may include semiconductor material(s) and/or metal, and may include a gate of a field effect transistor (FET), a base of a bipolar junction transistor (BJT), and/or the like.

In some embodiments, operation of pixel 1-112 may include one or more rejection (e.g., drain) periods and one or more collection periods. In one example, operation of pixel 1-112 in accordance with one or more pulses of an excitation light source may begin with a rejection period, such as to discard charge carriers generated in pixel 1-112 (e.g., in photodetection region PD) responsive to excitation photons from the light source. For instance, the excitation photons may arrive at pixel 1-112 prior to the arrival of fluorescence emission photons from the sample well. Transfer gates for the charge storage regions may be biased to have low conductivity in the charge transfer channels coupling the charge storage regions to the photodetection region, blocking transfer and accumulation of charge carriers in the charge storage regions. A drain gate for the drain region may be biased to have high conductivity in a drain channel between the photodetection region and the drain region, facilitating draining of charge carriers from the photodetection region to the drain region. Transfer gates for any charge storage regions coupled to the photodetection region may be biased to have low conductivity between the photodetection region and the charge storage regions, such that charge carriers are not transferred to or accumulated in the charge storage regions during the rejection period.

Following the rejection period, a collection period may occur in which charge carriers generated responsive to the incident photons are transferred to one or more charge storage regions. During the collection period, the incident photons may include fluorescent emission photons, resulting in accumulation of fluorescent emission charge carriers in the charge storage region(s). For instance, a transfer gate for one of the charge storage regions may be biased to have high conductivity between the photodetection region and the charge storage region, facilitating accumulation of charge carriers in the charge storage region. Any drain gates coupled to the photodetection region may be biased to have low conductivity between the photodetection region and the drain region such that charge carriers are not discarded during the collection period. Some embodiments may include multiple collection periods, such as a second collection period following a first collection period, for multiple charge storage regions to accumulate charge carriers at different times. For instance, during one of multiple collection periods, one of the transfer gates may be biased to facilitate accumulation of charge carriers in the corresponding charge storage region, and the other transfer gates may be biased to block accumulation of charge carriers in the other charge storage regions. In some embodiments, multiple charge storage regions may accumulate charge carriers during a single collection period. In some embodiments, operation of the pixel may include as many collection periods as charge storage regions. In some embodiments, operation as described herein may be repeated for each pulse of the excitation light source. In some embodiments, collection periods for the various charge storage regions may be separated by rejection periods. For example, in some embodiments, each pulse of the excitation light source may be followed by one rejection period and one collection period (e.g., having accumulation in a single charge storage region).

As described further herein, the rejection and/or collection periods may be controlled using one or more control signals from a control circuit of the integrated circuit, such as by providing the control signal(s) to drain and/or transfer gates of the pixel(s) of the integrated circuit. It should be appreciated that, in some embodiments, operation of pixels described herein may occur as described in this section.

Figures 1, 1C:
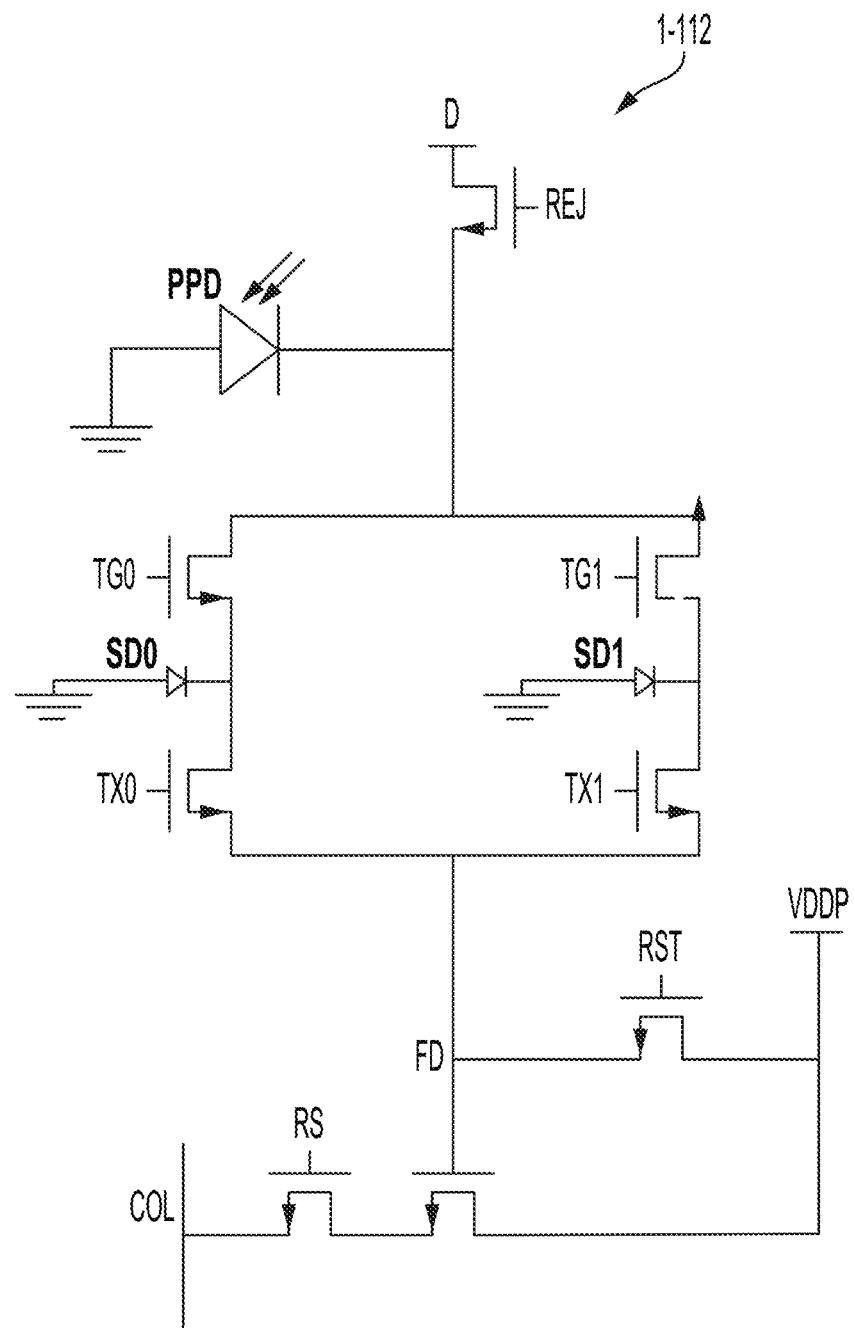

For example, FIG. 1-1C is a circuit diagram of pixel 1-112 of FIG. 1-1B, according to some embodiments. In FIG. 1-1C, photodetection region PPD is coupled to multiple storage regions SD0 and SD1. Storage region SD1 and transfer gate TG1 may be configured in the manner described for storage region SD0 and transfer gate TG0. Pixel 1-112 may be configured such that only one of storage regions SD0 and SD1 receive charge carriers from photodetection region PPD at a given time. For example, storage regions SD0 and SD1 may have binning periods that are separated in time, with transfer gate TG0 enabling flow of charge carriers to storage region SD0 during the binning period for storage region SD0, and with transfer gate TG1 enabling flow of charge carriers to storage region SD1 during the binning period for storage region SD1 Likewise, pixel 1-112 may be configured such that only one of storage regions SD0 and SD1 may provide charge carriers to readout region FD. For example, storage regions SD0 and SD1 may have readout periods that are separated in time, with transfer gate TX0 enabling flow of charge carriers from storage region SD0 during the readout period for storage region SD0, and with transfer gate TX1 enabling flow of charge carriers from storage region SD1 during the readout period for storage region SD1.

Figures 1, 1D:
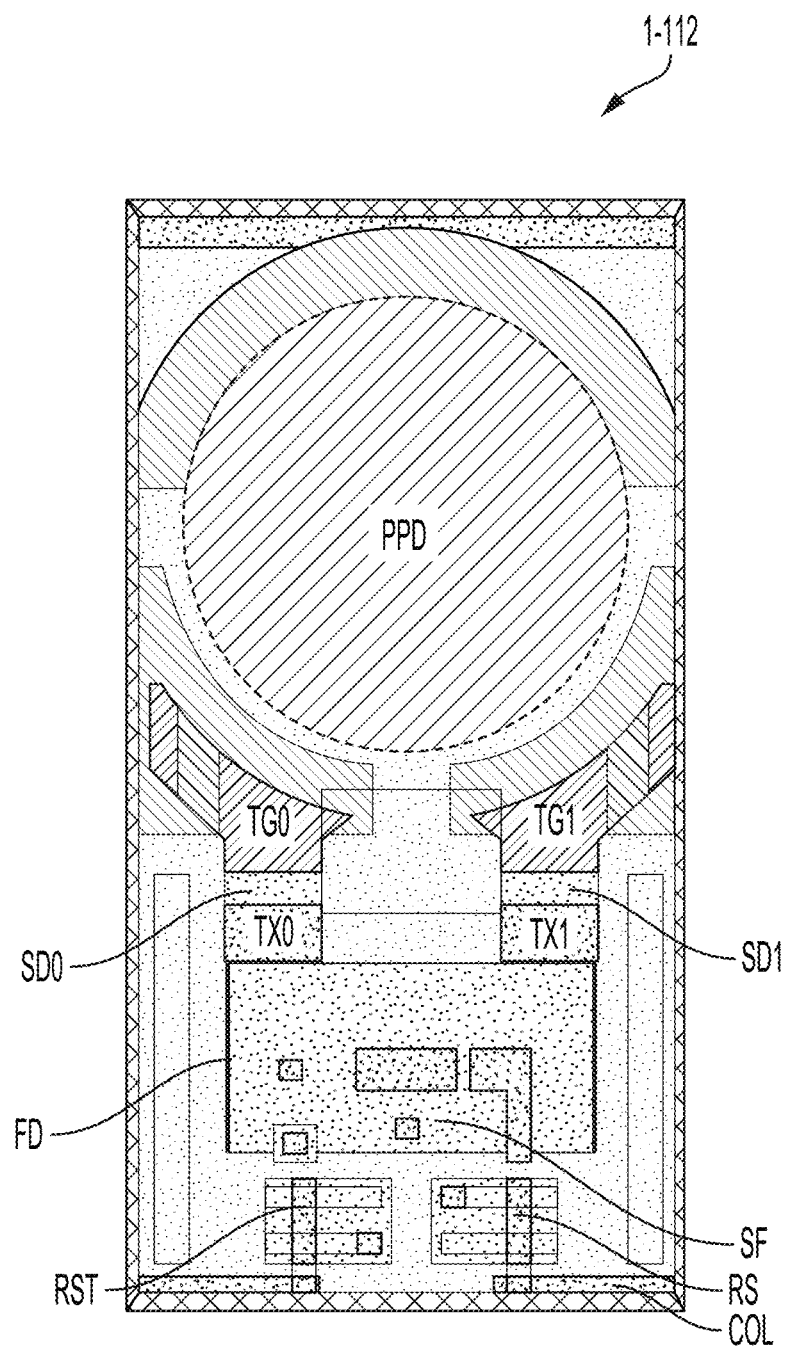

FIG. 1-1D is a plan view of the pixel of FIGS. 1-1B and 1-1C illustrating the relative positioning of storage regions SD0 and SD1 relative to photodetection region PPD.

In some embodiments, some components of pixels described herein may be disposed and/or formed on one or more substrate layers of an integrated circuit. In some embodiments, the substrate layer(s) may alternatively or additionally include one or more auxiliary layers (e.g., epitaxial layers) disposed above and/or below the other substrate layer(s). In some embodiments, some components of pixels described herein may be formed by etching away at least a portion of the substrate and/or auxiliary layer(s). In some embodiments, transfer and/or drain gates described herein may be formed using a semiconductor material such as polysilicon, which may be at least partially opaque.

III. Techniques for Obtaining Lifetime Information

According to an aspect of the technology described herein, the inventors have developed techniques for obtaining information regarding multiple characteristics of emission light from a sample well to facilitate sample analysis including sample identification with multiple dimensions of discrimination. The inventors have recognized that fluorescent markers used to label biological or chemical samples, when excited by incident light, fluoresce with a characteristic lifetime (e.g., a characteristic emission decay time period), such that analyzing the lifetime information of emission light may facilitate identification of the particular sample to which the fluorescent marker is attached (e.g., bonded). Fluorescence lifetime, also referred to herein as simply "lifetime", is a measure of the time which a fluorescent marker spends in the excited state before returning to a ground state and emitting a photon. In some embodiments, fluorescence lifetime information may be obtained through techniques for time binning charge carriers generated by incident photons.

Figures 1, 2, 2A:
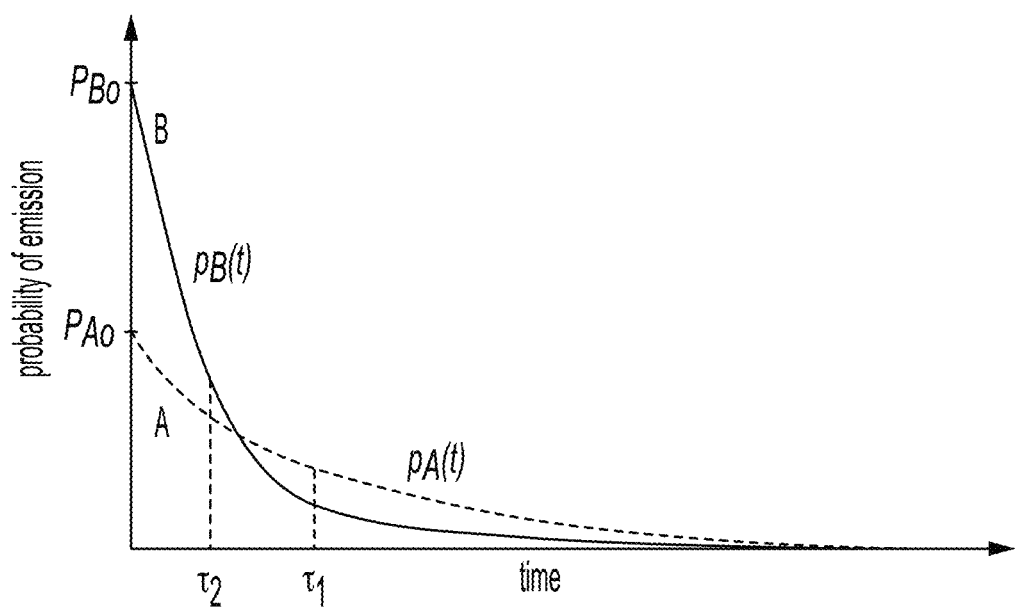

For example, FIG. 1-2A plots two different fluorescent emission probability curves (A and B), which can be representative of fluorescent emission from two different fluorescent molecules, for example. With reference to curve A (dashed line), after being excited by a short or ultrashort optical pulse, a probability pA(t) of a fluorescent emission from a first molecule may decay with time, as depicted. In some cases, the decrease in the probability of a photon being emitted over time can be represented by an exponential decay function $p\_A (t) = P\_Ao\ e^{-(-t/\tau\_1)}$, where PAo is an initial emission probability and $\tau 1$ is a temporal parameter associated with the first fluorescent molecule that characterizes the emission decay probability. $\tau 1$ may be referred to as the "fluorescence lifetime," "emission lifetime," or "lifetime" of the first fluorescent molecule. In some cases, the value of $\tau 1$ can be altered by a local environment of the fluorescent molecule. Other fluorescent molecules can have different emission characteristics than that shown in curve A. For example, another fluorescent molecule can have a decay profile that differs from a single exponential decay, and its lifetime can be characterized by a half-life value or some other metric.

A second fluorescent molecule may have a decay profile pB(t) that is exponential, but has a measurably different lifetime $\tau 2$, as depicted for curve B in FIG. 1-2A. In the example shown, the lifetime for the second fluorescent molecule of curve B is shorter than the lifetime for curve A, and the probability of emission pB(t) is higher sooner after excitation of the second molecule than for curve A. Different fluorescent molecules can have lifetimes or half-life values ranging from about 0.1 ns to about 20 ns, in some embodiments.

Differences in fluorescent emission lifetimes can be used to discern between the presence or absence of different fluorescent molecules and/or to discern between different environments or conditions to which a fluorescent molecule is subjected. In some cases, discerning fluorescent molecules based on lifetime (rather than emission wavelength, for example) can simplify aspects of an analytical instrument. As an example, wavelength-discriminating optics (such as wavelength filters, dedicated detectors for each wavelength, dedicated pulsed optical sources at different wavelengths, and/or diffractive optics) can be reduced in number or eliminated when discerning fluorescent molecules based on lifetime. In some cases, a single pulsed optical source operating at a single characteristic wavelength can be used to excite different fluorescent molecules that emit within a same wavelength region of the optical spectrum but have measurably different lifetimes. An analytic system that uses a single pulsed optical source, rather than multiple sources operating at different wavelengths, to excite and discern different fluorescent molecules emitting in a same wavelength region can be less complex to operate and maintain, more compact, and can be manufactured at lower cost.

Although analytic systems based on fluorescent lifetime analysis can have certain benefits, the amount of information obtained by an analytic system and/or detection accuracy can be increased by allowing for additional detection techniques. For example, some analytic systems can additionally be configured to discern one or more properties of a sample based on fluorescent wavelength, pulse duration/width, and/or fluorescent intensity as described herein.

Figures 1, 2, 2B:
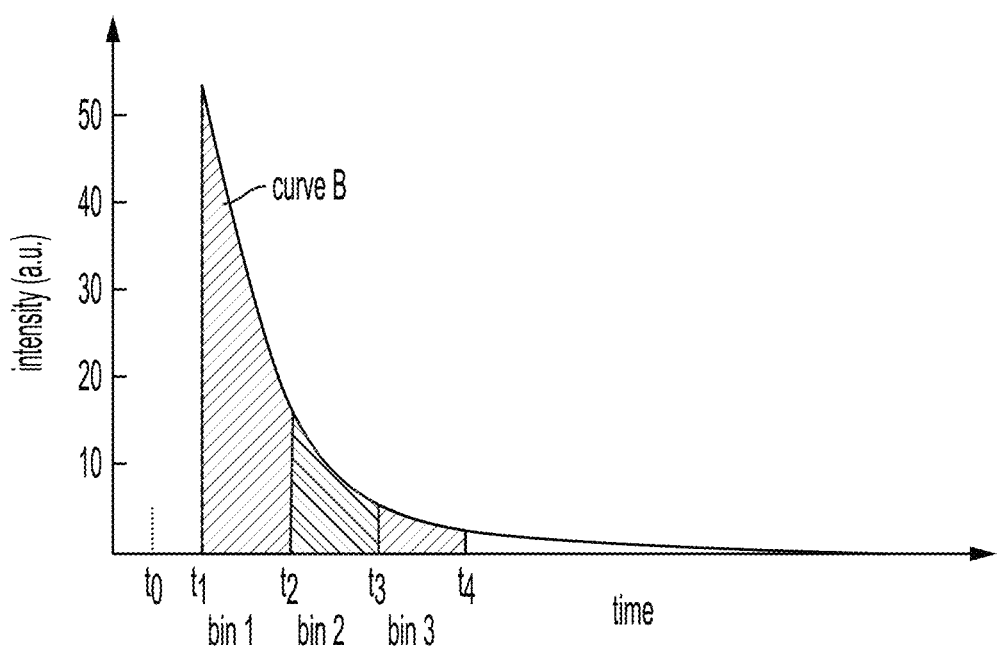

Referring again to FIG. 1-2A, according to some embodiments, different fluorescent lifetimes can be distinguished with a photodetector that is configured to time-bin fluorescent emission events following excitation of a fluorescent molecule. The time binning can occur during a single charge-accumulation cycle for the photodetector. A charge-accumulation cycle is an interval between read-out events during which photo-generated carriers are accumulated in bins of the time-binning photodetector. The concept of determining fluorescence lifetime by time-binning of emission events is introduced graphically in FIG. 1-2B. At time $t_e$ just prior to $t_1$, a fluorescent molecule or ensemble of fluorescent molecules of a same type (e.g., the type corresponding to curve B of FIG. 1-2A) is (are) excited by a short or ultrashort optical pulse. For a large ensemble of molecules, the intensity of emission can have a time profile similar to curve B, as depicted in FIG. 1-2B.

For a single molecule or a small number of molecules, however, the emission of fluorescent photons occurs according to the statistics of curve B in FIG. 1-2A, for this example. A time-binning photodetector 1-322 can accumulate carriers generated from emission events into discrete time bins. Three bins are indicated in FIG. 1-2B, though fewer bins or more bins may be used in embodiments. The bins are temporally resolved with respect to the excitation time $t_e$ of the fluorescent molecule(s). For example, a first bin can accumulate carriers produced during an interval between times $t_1$ and $t_2$, occurring after the excitation event at time $t_e$. A second bin can accumulate carriers produced during an interval between times $t_2$ and $t_3$, and a third bin can accumulate carriers produced during an interval between times $t_3$ and $t_4$. When a large number of emission events are summed, carriers accumulated in the time bins can approximate the decaying intensity curve shown in FIG. 1-2B, and the binned signals can be used to distinguish between different fluorescent molecules or different environments in which a fluorescent molecule is located.

Figures 1, 2, 2C:
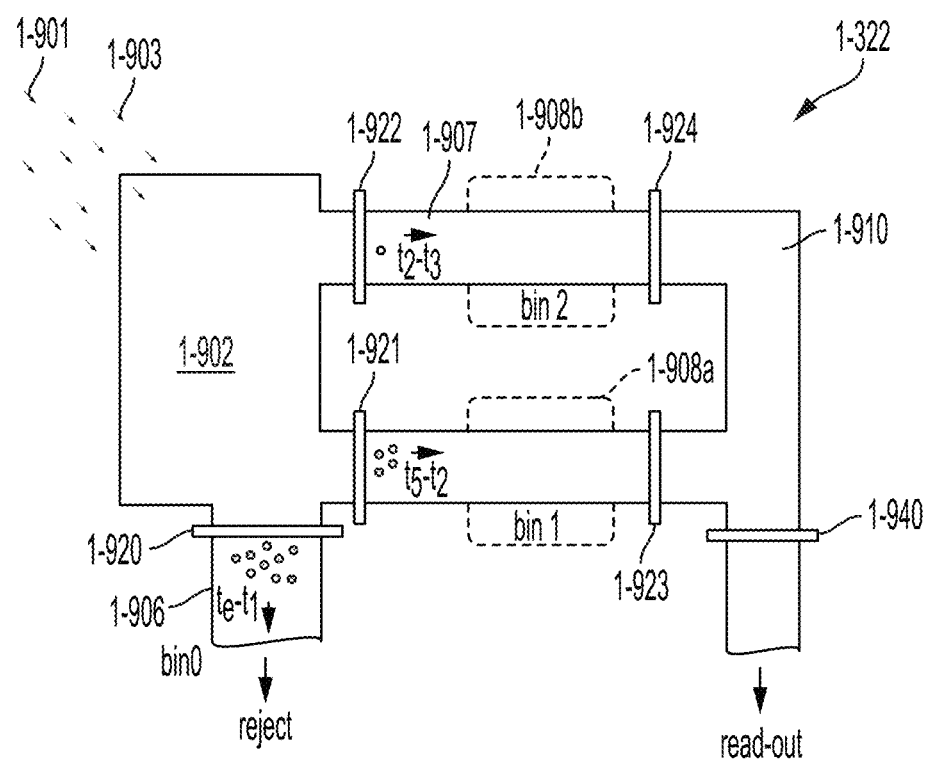

Examples of a time-binning photodetector 1-322 are described in U.S. patent application Ser. No. 14/821,656, filed Aug. 7, 2015, titled "Integrated Device for Temporal Binning of Received Photons" and in U.S. patent application Ser. No. 15/852,571, filed Dec. 22, 2017, titled "Integrated Photodetector with Direct Binning Pixel," both of which are hereby incorporated herein by reference in their entireties. For explanation purposes, a non-limiting embodiment of a time-binning photodetector is depicted in FIG. 1-2C. A single time-binning photodetector 1-322 can comprise a photon-absorption/carrier-generation region 1-902, a carrier-discharge channel 1-906, and a plurality of carrier-storage regions 1-908a, 1-908b all formed on a semiconductor substrate. Carrier-transport channels 1-907 can connect between the photon-absorption/carrier-generation region 1-902 and carrier-storage regions 1-908a, 1-908b. In the illustrated example, two carrier-storage regions are shown, but there may be more or fewer. There can be a read-out channel 1-910 connected to the carrier-storage regions. The photon-absorption/carrier-generation region 1-902, carrier-discharge channel 1-906, carrier-storage regions 1-908a, 1-908b, and read-out channel 1-910 can be formed by doping the semiconductor locally and/or forming adjacent insulating regions to provide photodetection capability, confinement, and transport of carriers. A time-binning photodetector 1-322 can also include a plurality of electrodes 1-920, 1-921, 1-922, 1-923, 1-924 formed on the substrate that are configured to generate electric fields in the device for transporting carriers through the device.

In operation, a portion of an excitation pulse from a pulsed optical source (e.g., a mode-locked laser) is delivered to a reaction chamber over the time-binning photodetector 1-322. Initially, some excitation radiation photons 1-901 may arrive at the photon-absorption/carrier-generation region 1-902 and produce carriers (shown as light-shaded circles). There can also be some fluorescent emission photons 1-903 that arrive with the excitation radiation photons 1-901 and produce corresponding carriers (shown as dark-shaded circles). Initially, the number of carriers produced by the excitation radiation can be too large compared to the number of carriers produced by the fluorescent emission. The initial carriers produced during a time interval $|t_e-t_1|$ can be rejected by gating them into a carrier-discharge channel 1-906 with a first transfer gate 1-920, for example.

At a later times mostly fluorescent emission photons 1-903 arrive at the photon-absorption/carrier-generation region 1-902 and produce carriers (indicated a dark-shaded circles) that provide useful and detectable signal that is representative of fluorescent emission from the reaction chamber 1-330. According to some detection methods, a second electrode 1-921 and third electrode 1-923 can be gated at a later time to direct carriers produced at a later time (e.g., during a second time interval $|t_1-t_2|$) to a first carrier-storage region 1-908a. Subsequently, a fourth electrode 1-922 and fifth electrode 1-924 can be gated at a later time (e.g., during a third time interval $|t_2-t_3|$) to direct carriers to a second carrier-storage region 1-908b. Charge accumulation can continue in this manner after excitation pulses for a large number of excitation pulses to accumulate an appreciable number of carriers and signal level in each carrier-storage region 1-908a, 1-908b. At a later time, the signal can be read out from the bins. In some implementations, the time intervals corresponding to each storage region are at the sub-nanosecond time scale, though longer time scales can be used in some embodiments (e.g., in embodiments where fluorophores have longer decay times).

The process of generating and time-binning carriers after an excitation event (e.g., excitation pulse from a pulsed optical source) can occur once after a single excitation pulse or be repeated multiple times after multiple excitation pulses during a single charge-accumulation cycle for the time-binning photodetector 1-322. After charge accumulation is complete, carriers can be read out of the storage regions via the read-out channel 1-910. For example, an appropriate biasing sequence can be applied to electrodes 1-923, 1-924 and at least to electrode 1-940 to remove carriers from the storage regions 1-908a, 1-908b. The charge accumulation and read-out processes can occur in a massively parallel operation on an optoelectronic chip resulting in frames of data.

Although the described example in connection with FIG. 1-2C includes multiple charge storage regions 1-908a, 1-908b in some cases a single charge storage region may be used instead. For example, only bin1 may be present in a time-binning photodetector 1-322. In such a case, a single storage regions 1-908a can be operated in a variable time-gated manner to look at different time intervals after different excitation events. For example, after pulses in a first series of excitation pulses, electrodes for the storage region 1-908a can be gated to collect carriers generated during a first time interval (e.g., during the second time interval $|t_1-t_2|$), and the accumulated signal can be read out after a first predetermined number of pulses. After pulses in a subsequent series of excitation pulses at the same reaction chamber, the same electrodes for the storage region 1-908a can be gated to collect carriers generated during a different interval (e.g., during the third time interval $|t_2-t_3|$), and the accumulated signal can be read out after a second predetermined number of pulses. Carriers could be collected during later time intervals in a similar manner if needed. In this manner, signal levels corresponding to fluorescent emission during different time periods after arrival of an excitation pulse at a reaction chamber can be produced using a single carrier-storage region.

Figures 1, 2, 2D:
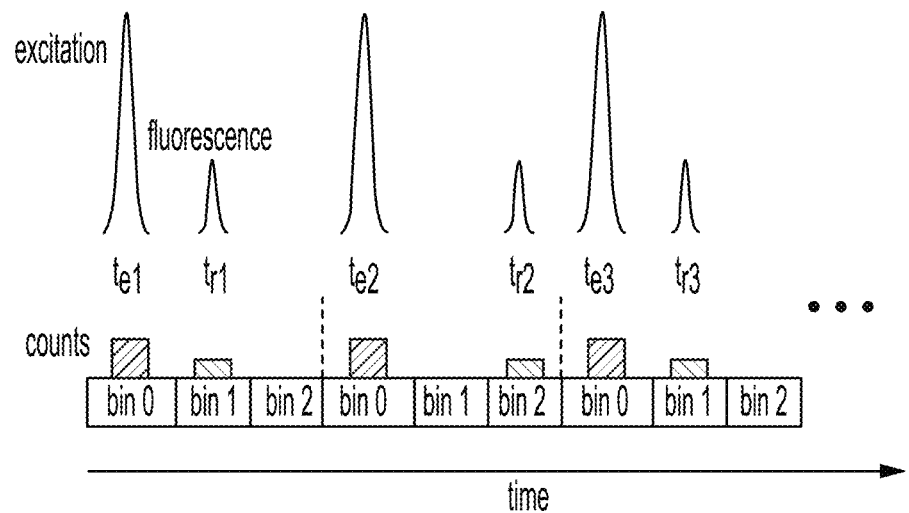

Regardless of how charge accumulation is carried out for different time intervals after excitation, signals that are read out can provide a histogram of bins that are representative of the fluorescent emission decay characteristics, for example. An example process is illustrated in FIGS. 1-2D and FIG. 1-2E, for which two charge-storage regions are used to acquire fluorescent emission from the reaction chambers. The histogram's bins can indicate a number of photons detected during each time interval after excitation of the fluorophore(s) in a reaction chamber. In some embodiments, signals for the bins will be accumulated following a large number of excitation pulses, as depicted in FIG. 1-2D. The excitation pulses can occur at times $t_{e1}, t_{e2}, t_{e3}, \ldots t_{eN}$ which are separated by the pulse interval time T. In some cases, there can be between 105 and 107 excitation pulses (or portions thereof) applied to a reaction chamber during an accumulation of signals in the electron-storage regions for a single event being observed in the reaction chamber (e.g., a single nucleotide incorporation event in DNA analysis). In some embodiments, one bin (bin0) can be configured to detect an amplitude of excitation energy delivered with each optical pulse, and may be used as a reference signal (e.g., to normalize data). In other cases, the excitation pulse amplitude may be stable, determined one or more times during signal acquisition, and not determined after each excitation pulse so that there is no bin0 signal acquisition after each excitation pulse. In such cases, carriers produced by an excitation pulse can be rejected and dumped from the photon-absorption/carrier-generation region 1-902 as described above in connection with FIG. 1-2C.

In some implementations, only a single photon may be emitted from a fluorophore following an excitation event, as depicted in FIG. 1-2D. After a first excitation event at time $t_{e1}$, the emitted photon at time $t_{f1}$ may occur within a first time interval (e.g., between times $t_1$ and $t_2$), so that the resulting electron signal is accumulated in the first electron-storage region (contributes to bin 1). In a subsequent excitation event at time $t_{e2}$, the emitted photon at time $t_{f2}$ may occur within a second time interval (e.g., between times $t_2$ and $t_3$), so that the resulting electron signal contributes to bin 2. After a next excitation event at time $t_{e3}$, a photon may emit at a time $t_{f3}$ occurring within the first time interval.

In some implementations, there may not be a fluorescent photon emitted and/or detected after each excitation pulse received at a reaction chamber. In some cases, there can be as few as one fluorescent photon that is detected at a reaction chamber for every 10,000 excitation pulses delivered to the reaction chamber. One advantage of implementing a mode-locked laser as the pulsed excitation source is that a mode-locked laser can produce short optical pulses having high intensity and quick turn-off times at high pulse-repetition rates (e.g., between 50 MHz and 250 MHz). With such high pulse-repetition rates, the number of excitation pulses within a 10 millisecond charge-accumulation interval can be 50,000 to 250,000, so that detectable signal can be accumulated.

After a large number of excitation events and carrier accumulations, the carrier-storage regions of the time-binning photodetector 1-322 can be read out to provide a multi-valued signal (e.g., a histogram of two or more values, an N-dimensional vector, etc.) for a reaction chamber. The signal values for each bin can depend upon the decay rate of the fluorophore. For example and referring again to FIG. 1-2B, a fluorophore having a decay curve B will have a higher ratio of signal in bin 1 to bin 2 than a fluorophore having a decay curve A. The values from the bins can be analyzed and compared against calibration values, and/or each other, to determine the particular fluorophore present. For a sequencing application, identifying the fluorophore can determine the nucleotide or nucleotide analog that is being incorporated into a growing strand of DNA, for example. For other applications, identifying the fluorophore can determine an identity of a molecule or specimen of interest, which may be linked to the fluorophore.

Figures 1, 2, 2E:
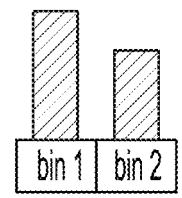

To further aid in understanding the signal analysis, the accumulated, multi-bin values can be plotted as a histogram, as depicted in FIG. 1-2E for example, or can be recorded as a vector or location in N-dimensional space. Calibration runs can be performed separately to acquire calibration values for the multi-valued signals (e.g., calibration histograms) for four different fluorophores.

Thus, obtaining lifetime information obtained by the time binning techniques described herein may facilitate analysis and identification of a sample in a sample well. It should be appreciated that other suitable techniques of time binning charge carriers and/or otherwise obtaining fluorescence lifetime information other than the techniques described herein may be implemented, and aspects of the technology are not limited in this respect IV. Techniques for Obtaining Wavelength Information According to another aspect of the technology described herein, the inventors developed techniques for discriminating spectral information (e.g., wavelength information) of incident light. For instance, in addition to or alternative to using time-gating techniques for discriminating timing information (e.g., lifetime information), devices described herein may be configured to determine spectral information to enhance the data that can be obtained from a sample. The inventors have recognized that, similar to lifetime, emission light from a particular fluorescent marker may have a characteristic wavelength such that analyzing wavelength information of emission light may facilitate identification of the sample to which the fluorescent marker is attached. Thus, in some embodiments, emission light wavelength is an additional dimension of discrimination used in the multi-dimensional discrimination techniques described herein.

The inventors have recognized that an integrated device, such as integrated device 1-102 may obtain wavelength measurements of emission light through a variety of techniques described further herein. For example, in some embodiments, wavelength measurements may be obtained through techniques incorporating photodetector regions having different depths. In other embodiments, wavelength measurements may be obtained using techniques incorporating charge transfer channels of different depths. In some embodiments, wavelength information may be obtained using techniques incorporating optical shielding elements.

Further, in some embodiments, wavelength measurements of emission light may be obtained using one or more optical sorting elements. It should be appreciated that any suitable technique in addition to or alternative to the techniques described herein may be used to obtain wavelength measurements of emission light to facilitate multi-dimensional discrimination of samples, and aspects of the technology are not limited in this respect.

a. Techniques Incorporating Regions of Different Depths

In some aspects, spectral information may be obtained using pixels having regions of differing depth (e.g., semiconductor junction depth). For example, in some embodiments, one or more charge storage regions are configured having different depths. In some embodiments, one or more photodetection regions may be configured having different depths in addition to or in the alternative to configuring one or more charge storage regions with different depths. FIG. 2-1 is a side view of an alternative embodiment of a pixel 2-112, which may have a time-gated charge storage region and a direct-excitation charge storage region configured to receive incident photons from a light source via a photodetection region, according to some embodiments. Pixel 2-112 may be configured in the manner described for pixel 1-112 in connection with FIGS. 1-1A to 1-1D. For instance, pixel 2-112 is shown in FIG. 2-1 including photodetection region PPD and charge storage regions SD0 and SD1. In some embodiments, pixel 2-112 may also include one or more transfer gates, such as transfer gate TG0 illustrated in FIG. 2-1. In some embodiments, pixel 2-112 may include one or more barriers, such as metal layer M0 illustrated in FIG. 2-1. It should be appreciated that pixel 2-112 may include any number of photodetection regions, charge storage regions, and/or transfer gates. Pixel 2-112 may alternatively or additionally include one or more drain regions and/or drain gates.

In some embodiments, pixel 2-112 may include one or more lightly p-doped substrate layers. Photodetection region PPD and charge storage regions SD0 and SD1 may be formed and/or disposed in or on the substrate layer(s) using n-type doping techniques. One or more barriers may be formed and/or disposed in or on the substrate layer(s) using p-type doping techniques. Transfer gate TG0 may be formed using a more opaque material than the substrate layer(s), such as polysilicon. It should be appreciated that, in some embodiments, the substrate layer(s) may be lightly n-doped, and the photodetection region PPD and charge storage regions SD0 and SD1 may be formed and/or disposed using p-type doping techniques. In such embodiments, the barrier(s) may be formed and/or disposed using p-type doping techniques.

In some embodiments, some regions of pixel 2-112 may have greater depth than other regions of the pixel. For instance, in the example of FIG. 2-1, charge storage region SD1 has a greater depth than charge storage region SD0 in a direction parallel to the optical axis (e.g., along which incident light travels from the light source to pixel 2-112). Also shown in FIG. 2-1, charge storage region SD1 is disposed at least partially below photodetection region PPD, such as incident photons received from the light source and/or sample well may reach charge storage region SD1 after passing at least partially through photodetection region PPD. In some embodiments, the different depths of various regions of pixel 2-112 may facilitate discrimination of spectral and/or timing (e.g., lifetime) information in pixel 2-112. For instance, as shown in FIG. 2-1, incident photons from a light source and/or sample well may travel different distances into pixel 2-112 along the optical axis. Some photons (e.g., of a first wavelength) may reach photodetection region PPD (as indicated by the shorter arrows in FIG. 2-1), generating charge carriers that may be conducted to charge storage region SD0 during a collection period. For example, during the collection period, transfer gate TG0 may receive a control signal from a control circuit of pixel 2-112 responsive to which a charge transfer channel coupling photodetection region PPD to storage region SD0 may become more conductive. As a result, during the collection period, charge carriers generated in photodetection region PPD may travel to and accumulate in charge storage region SD0. Other incident photons (e.g., of a second wavelength longer than the first wavelength) may continue traveling beyond photodetection region PPD (as indicated by the longer arrows in FIG. 2-1) and reach charge storage region SD1, generating charge carriers in charge storage region SD1. In some embodiments, the configuration (e.g., timing) of draining and/or collecting charge carriers in pixel 2-112 may occur as described in connection with FIGS. 1-1A to 1-1D.

In some embodiments, differences between the charge carriers collected in charge storage region SD0 and the charge carriers collected in charge storage region SD1 may indicate spectral and/or timing (e.g., lifetime) information of the incident light. For instance, in some embodiments, a sum and/or difference of the number of charge carriers collected in the charge storage regions may indicate a fluorescence lifetime and/or wavelength of the fluorescence emissions received from the sample well. In one example, higher wavelength photons may contribute more substantially to the number of charge carriers collected in charge storage region SD0, and lower wavelength photons may contribute more substantially to the number of charge carriers collected in charge storage region SD1. In this example, lower wavelength photons may have higher energy than higher wavelength photons, causing many of the lower wavelength photons to continue traveling beyond photodetection region PPD to charge storage region SD1, whereas higher wavelength photons may predominantly terminate at photodetection region PPD (e.g., due to attenuation in the bulk of pixel 2-112). As a result, the higher wavelength photons may generate more charge carriers to be collected in charge storage region SD0 during the collection period, and lower wavelength photons may generate more charge carriers in charge storage region SD1. Accordingly, a sum and/or difference of charge carriers accumulated in charge storage regions SD0 and SD1 may indicate spectral information of the incident light, such as a wavelength of the incident light. In some embodiments, a depth of charge storage region SD0 and/or a depth of charge storage region SD1 may be configured such that each charge storage region predominantly collects incident photons having a particular wavelength and/or range of wavelengths. Alternatively or additionally, in some embodiments, the difference in depth between charge storage region(s) SD0 and/or SD1 and photodetection region PPD may be configured such that each charge storage region predominantly collects incident photons having a particular wavelength and/or range of wavelengths.

In some embodiments, one or more processors (e.g., microprocessors, field programmable gate arrays (FPGAs), and/or application specific integrated circuits (ASICs), part or each of which may be integrated with the integrated device, etc.) coupled to pixel 2-112 may be configured to determine lifetime and/or spectral information based on the number of charge carriers accumulated in charge storage region(s) SD0 and/or SD1. It should be appreciated that, alternatively or additionally, the number of charge carriers accumulated in charge storage region SD0 and/or SD1 may indicate a fluorescence lifetime of the incident light. In some embodiments, charge carriers collected in one of the charge storage regions may indicate timing information, and charge carriers collected in another of the charge storage regions may indicate spectral information.

It should be appreciated that integrated circuits described herein may be configured to discriminate among incident photons having various optical wavelengths and/or ranges of optical wavelengths. In some embodiments, the higher wavelength photons of the above example may have a wavelength greater than 600 nm, and the lower wavelength photons may have a wavelength less than 600 nm. In some embodiments, the higher wavelength photons of the above example may have a wavelength greater than 700 nm, and the lower wavelength photons may have a wavelength less than 600 nm. In some embodiments, the higher wavelength photons of the above example may have a wavelength greater than 700 nm, and the lower wavelength photons may have a wavelength less than 700 nm. In some embodiments, the higher wavelength photons of the above example may have a wavelength greater than 600 nm, and the lower wavelength photons may have a wavelength less than 600 nm. In some embodiments, the higher wavelength photons of the above example may have a wavelength greater than 600 nm, and the lower wavelength photons may have a wavelength less than 550 nm. In some embodiments, the higher wavelength photons of the above example may have a wavelength greater than 550 nm, and the lower wavelength photons may have a wavelength less than 550 nm. In some embodiments, pixels described herein may have an area less than or equal to 40 square microns.

FIG. 2-2 is a side view of pixel 2-212, which may have a time-gated charge storage region and a direct-excitation charge storage region configured to receive incident photons from a light source via a photodetection region, according to some embodiments. Pixel 2-212 may be configured in the manner described for pixel 2-112. For instance, as shown in FIG. 2-2, pixel 2-212 includes photodetection region PPD, charge storage regions SD0 and SD1, and transfer gate TG0. FIG. 2-2 may alternatively or additionally include one or more barriers such as metal layer M0, and/or the barrier illustrated extending from metal layer M0 into the pixel. For instance, the barrier may be elongated in a direction parallel to the optical axis along which photodetection region PPD receives incident light from a light source. While pixel 2-112 of FIG. 2-1 may be configured to receive light in the direction in which photodetection region PPD is spaced from transfer gate TG0 parallel to the optical axis, pixel 2-212 may be configured to receive light in an opposite direction from pixel 2-112. For instance, as shown in FIG. 2-2, pixel 2-112 may be configured to receive light in a direction in which transfer gate TG0 is spaced from photodetection region PPD parallel to the optical axis. One advantage of the structure illustrated in FIG. 2-2 (e.g., back-side illumination) is that incident photons may be attenuated in the substrate layer(s) of the pixel prior to reaching the depth of the charge storage regions, thus reducing the number of noise photons and/or charge carriers that may reach and/or be generated in the charge storage regions, thus improving signal integrity of pixel operation.

As in FIG. 2-1, some regions of pixel 2-212 may have greater depth than other regions of the pixel. For instance, in the example of FIG. 2-2, charge storage region SD1 has a greater depth than charge storage region SD0 in a direction parallel to the optical axis (e.g., along which incident light travels from the light source to pixel 2-112). Alternatively or additionally, one of charge storage regions SD0 and SD1 may be configured to receive incident light and generate and store charge carriers. For instance, in FIG. 2-2, charge storage region SD1 is positioned such that incident photons may travel through photodetection region PPD and reach charge storage region SD0. In some embodiments, the barrier(s) of pixel 2-212 may block at least some of the incident photons (e.g., obliquely incident photons) from reaching charge storage region SD0, such that charge carriers accumulated in charge storage region SD0 are predominantly time-gated from photodetection region PPD using transfer gate TG0. In some embodiments, the difference in depth between charge storage regions SD0 and SD1, and/or photodetection region PPD, may cause charge carriers accumulated in the charge storage regions to have different indicate timing and/or spectral information of the incident light. For instance, in some embodiments, a depth of charge storage region SD0, a depth of charge storage region SD1, and/or a depth of photodetection region PPD may be configured such that each charge storage region predominantly collects incident photons having a particular wavelength and/or range of wavelengths.

Figures 1, 2:
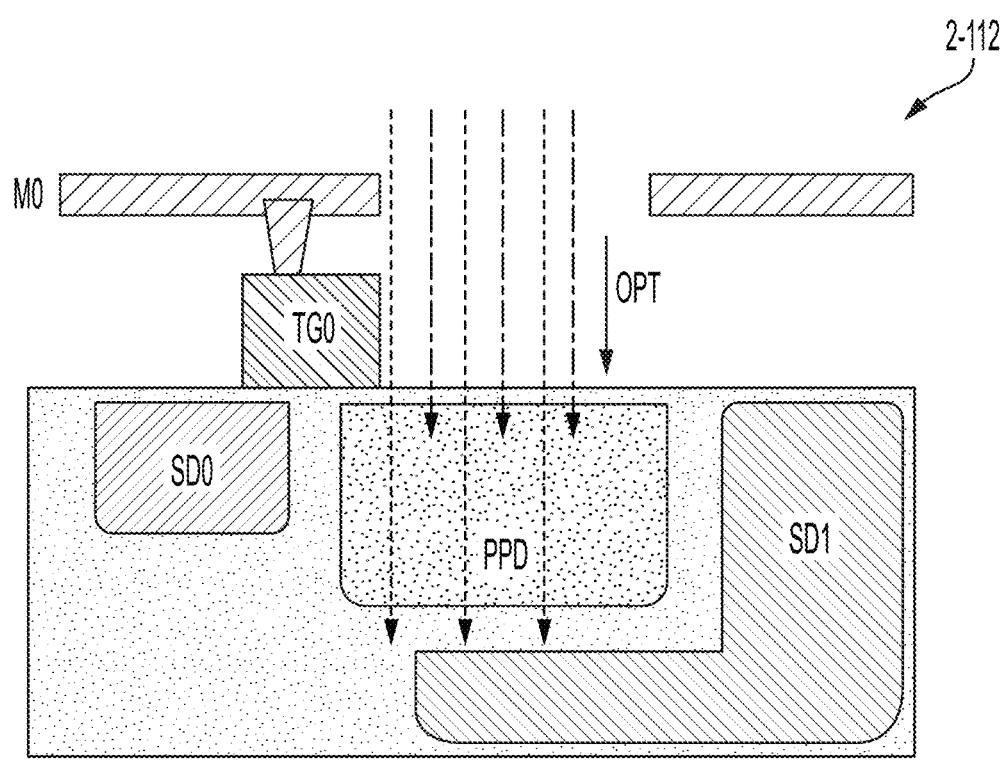
Figure 2:
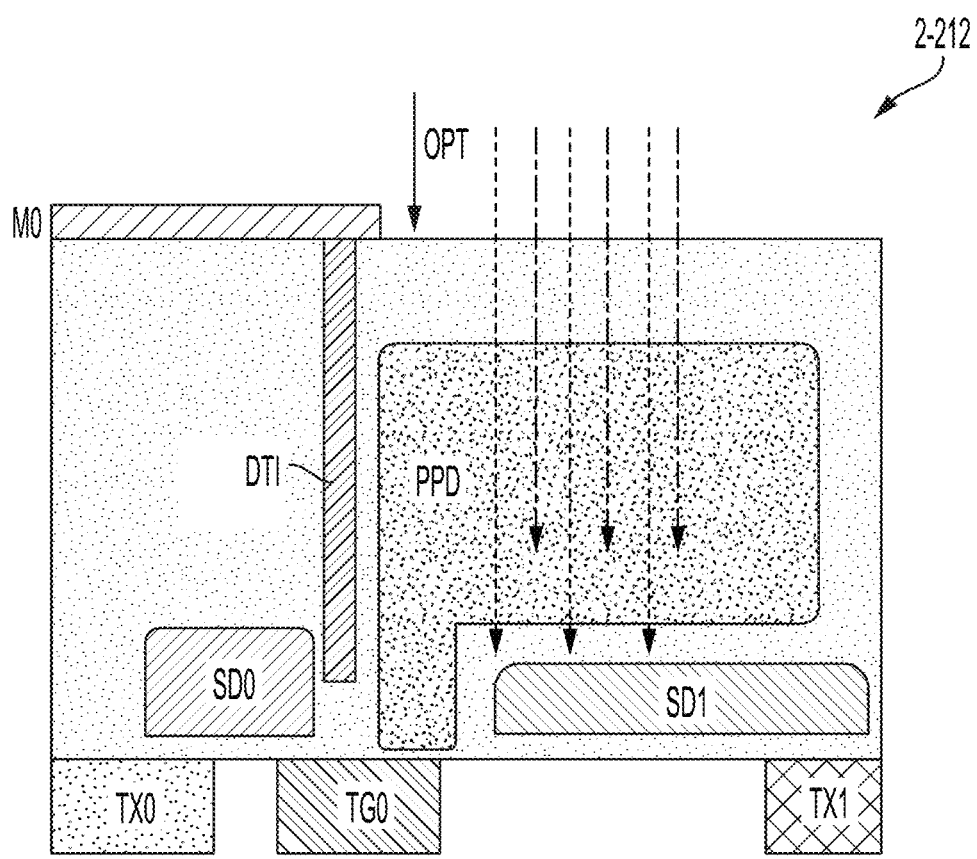
Figures 2, 3:
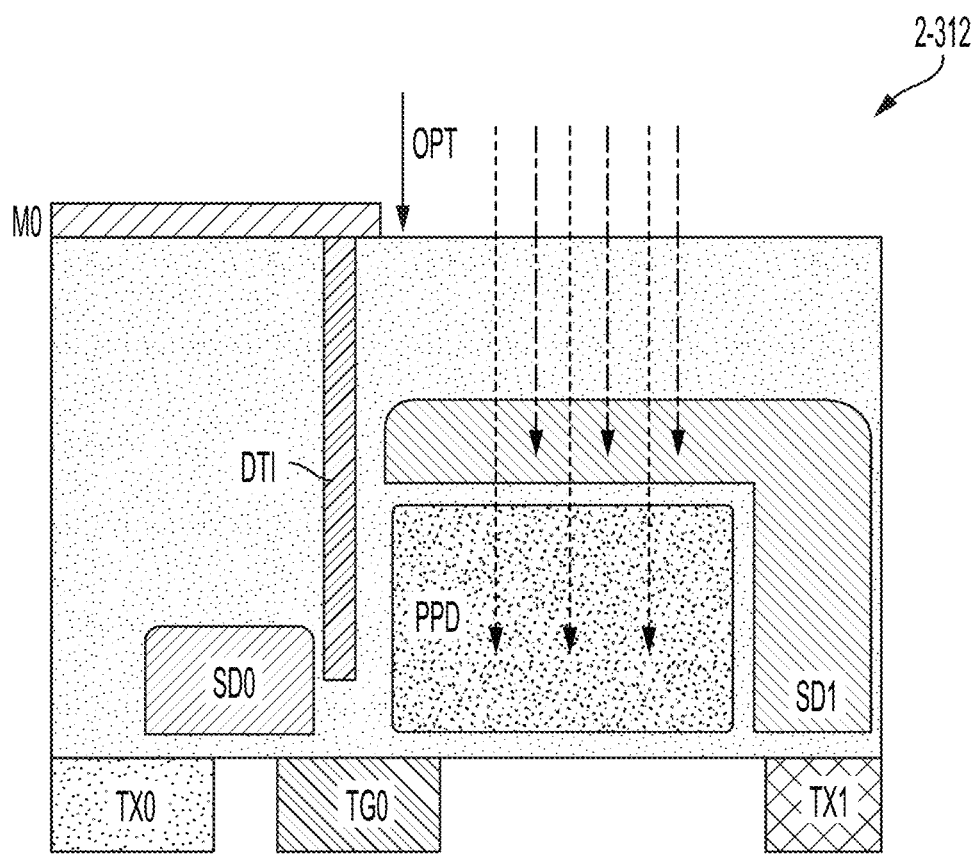

FIG. 2-3 is a side view of pixel 2-312, which may have a time-gated charge storage region, a direct-excitation charge storage region configured to receive incident photons from a light source, and a photodetection region configured to receive at least some of the incident photons via the direct-excitation charge storage region, according to some embodiments. Pixel 2-312 may be configured in the manner described for pixel 2-312 in connection with FIG. 2-3. For instance, in FIG. 2-3, pixel 2-312 includes photodetection region PPD, charge storage regions SD0 and SD1, and transfer gate TG0. In some embodiments, pixel 2-312 may include one or more barriers such as metal layer M0 and/or the barrier shown elongated parallel to the optical axis. Also shown in FIG. 2-3, pixel 2-312 may be configured to receive light in the direction in which transfer gate TG0 is spaced from photodetection region PPD parallel to the optical axis.

In some embodiments, the difference in depth between charge storage regions SD0 and SD1, and/or photodetection region PPD, may cause charge carriers accumulated in the charge storage regions to have different indicate timing and/or spectral information of the incident light. For instance, in some embodiments, a depth of charge storage region SD0, a depth of charge storage region SD1, and/or a depth of photodetection region PPD may be configured such that each charge storage region predominantly collects incident photons having a particular wavelength and/or range of wavelengths. However, unlike in FIG. 2-2, photodetection region PPD of pixel 2-312 is configured to receive incident photons having traveled through charge storage region SD0. As a result, a greater number of lower wavelength photons may reach photodetection region PPD than higher wavelength photons, such that a greater number of lower wavelength charge carriers may be generated and stored in charge storage region SD1 than higher wavelength charge carriers. Likewise, a greater number of higher wavelength photons may generate high wavelength charge carriers in photodetection region PPD, resulting in a greater number of higher wavelength charge carriers accumulated in charge storage region SD0 by time-gating via transfer gate TG0.

Figures 2, 3, 4:
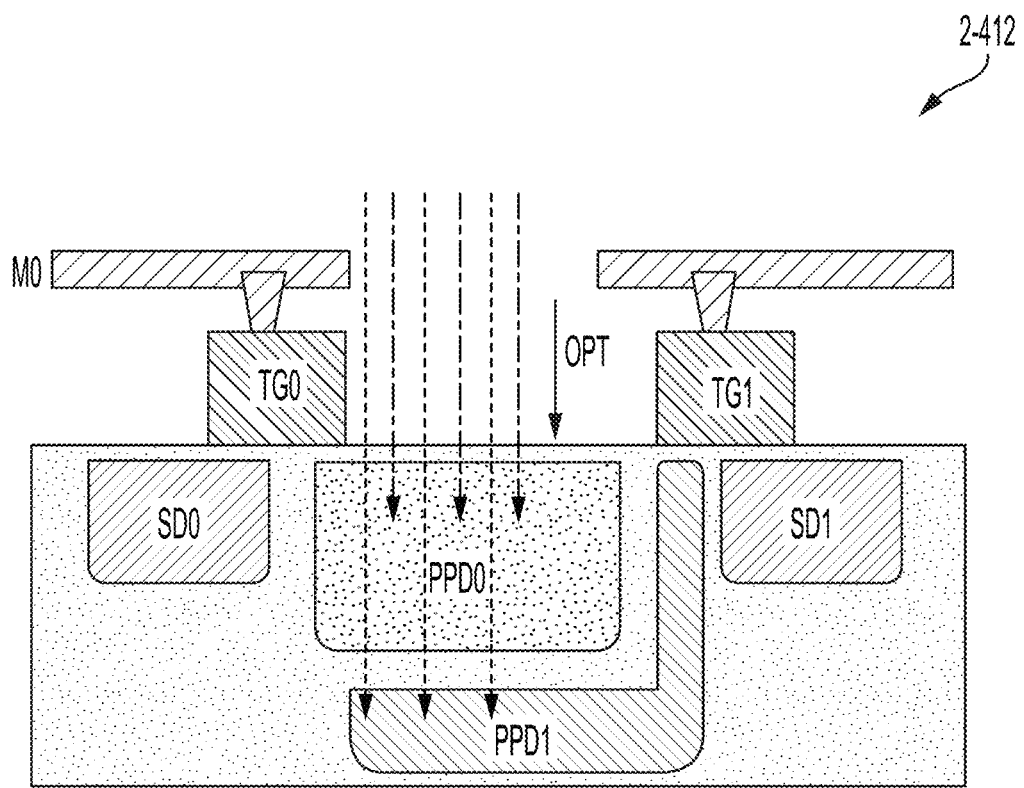

FIG. 2-4 is a side view of pixel 2-412 having two photodetection regions of different depths and two time-gated charge storage regions, according to some embodiments. Pixel 2-412 may be configured in the manner described for pixel 2-112 in connection with FIG. 2-1. For instance, as shown in FIG. 2-4, pixel 2-412 includes photodetection region PPD0, charge storage regions SD0 and SD1, and transfer gate TG0. Like in FIG. 2-1, pixel 2-412 may include regions of different depths. For instance, in FIG. 2-4, pixel 2-412 may include photodetection region PPD1 and transfer gate TG1, and photodetection regions PPD0 and PPD1 are shown having different depths. In one example, a greater number of lower wavelength incident photons may reach photodetection region PPD1 than higher wavelength incident photons. As a result, a greater number of lower wavelength charge carriers may be accumulated in charge storage region SD1 by time-gating via transfer gate TG1 than higher wavelength charge carriers. Likewise, a greater number of higher wavelength incident photons may generate charge carriers in photodetection region PPD0 than lower wavelength incident photons, resulting in more higher wavelength charge carriers accumulated in charge storage region SD0 by time-gating via transfer gate TG0 than lower wavelength charge carriers.

FIG. 2-5 is a side view of pixel 2-512 having three photodetection regions of different depths, according to some embodiments. Pixel 2-512 may be configured in the manner described for pixel 2-415 in connection with FIG. 2-4, such as having regions of different depths. For instance, as shown in FIG. 2-5, pixel 2-512 includes photodetection regions PPD0 and PPD1 and charge storage regions SD0 and SD1, with photodetection regions PPD0 and PPD1 having different depths. Also shown in FIG. 2-5, pixel 2-512 includes photodetection region PPD2 and charge storage region SD2, with photodetection region PPD2 having a different depth from photodetection regions PPD0 and PPD1. In some embodiments, such as illustrated in FIG. 2-5, one or more charge storage regions may be positioned between adjacent ones of the photodetection regions. Alternatively or additionally, as illustrated in FIG. 2-5, pixel 2-512 may include one or more barriers 2-502 (e.g., p-doped barriers "Pwell") positioned between adjacent photodetection regions PD. For example, barriers 2-502 may be doped with an opposite conductivity type than photodetection regions PPD0, PPD1, PPD2, such as being p-type doped when photodetection regions PPD0, PPD1, and PPD2 are n-type doped.

It should be appreciated that, in embodiments having more than two photodetection regions, some (or all) of the photodetection regions may have a same depth. Alternatively or additionally, in some embodiments having multiple photodetection regions (e.g., having different depths), the charge storage regions may have different depths. By including more regions of different depths, such as illustrated in FIG. 2-5, more timing and/or spectral information of the incident light may be obtained for processing.

b. Techniques Incorporating Charge Transfer Channels of Different Depths

FIGS. 3-1A and 3-1B illustrate pixel 3-112, which may have one photodetection region and four charge storage regions, according to some embodiments. FIG. 3-1A is a top view of pixel 3-112, and FIG. 3-1B is a cross-sectional view of pixel 3-112 along line A. Pixel 3-112 may be configured in the manner described for pixel 2-412 in connection with FIG. 2-4. For instance, as shown in FIGS. 3-1A and 3-1B, pixel 3-112 includes photodetection regions PPD0 and PPD1, as well as charge storage regions SD0 and SD1 (of which charge storage region SD1 is hidden from view), and transfer gates TG0 and TG1. In addition, pixel 3-112 includes charge storage regions SD2 and SD3 (of which charge storage region SD2 hidden from view) and transfer gates TG2 and TG3 positioned on an opposite side of photodetection regions PPD0 and PPD1 from charge storage regions SD0 and SD1 and transfer gates TG0 and TG1. In one example, charge storage regions SD0 and SD1 may be configured substantially identically to charge storage regions SD2 and SD3, respectively. For instance, charge storage regions SD0 and SD1 may have a same depth and may be configured to receive charge carriers from photodetection region PPD0 via charge transfer channels having a same depth as well. Likewise, charge storage regions SD2 and SD3 may have a same depth and may be configured to receive charge carriers from photodetection region PPD1 via charge transfer channels having a same depth. In some embodiments, charge storage regions SD0 and SD3 may be configured substantially identically to one another, and charge storage regions SD1 and SD2 may be configured substantially identically to one another. In some embodiments, charge storage regions SD0 and SD2 may be configured substantially identically to one another, and charge storage regions SD1 and SD3 may be configured substantially identically to one another. It should be appreciated that slight differences, such as due to inconsistencies in manufacturing pixel 3-112, may result in greater differences between substantially identically configured charge storage regions. In some embodiments, charge storage regions of pixel 3-112 may be configured differently from one another, such has having different depths from one another.

Regions of pixel 3-112 may have different depths. In some embodiments, charge storage regions SD0 and SD3 may have a same depth, and charge transfer channels coupling respective photodetection regions PPD0 and PPD1 to charge storage regions SD0 and SD3 may have different depths, such as shown in FIG. 3-1B. For instance, as shown in FIG. 3-112, the charge transfer channel coupled to charge storage region SD3 is at least partially below the charge transfer channel coupled to charge storage region SD0 (e.g., in a direction parallel to the optical axis). Accordingly, in some embodiments, charge storage regions SD0 and SD1 may accumulate a substantially equal amount of charge carriers over a same range of frequencies (e.g., a same number of lower wavelength charge carriers and a same number of higher wavelength charge carriers) Likewise, in some embodiments, charge storage regions SD2 and SD3 may accumulate a substantially equal amount of charge carriers over the range of frequencies as one another, but different numbers of charge carriers at the various frequencies than charge storage regions SD0 and SD1. For example, by receiving charge carriers from deeper photodetection region PPD1, charge storage regions SD2 and SD3 may accumulate a greater number of higher charge carriers than charge storage regions SD0 and SD1. Accordingly, charge carriers accumulated in the charge storage regions may indicate spectral information of the incident light. Moreover, including multiple charge storage regions SD0 and SD1 (and likewise SD2 and SD3), the charge carriers may be read out to determine both timing and spectral information. For instance, in one example, charge carriers accumulated in charge storage regions SD0 and SD3 may indicate spectral information, and charge carriers accumulated in charge storage regions SD0 and SD1 may indicate timing information. It should be appreciated that other combinations of charge storage regions SD0, SD1, SD2, and SD3 may be used to determine various information of the incident light.

FIGS. 3-2A and 3-2B illustrate pixel 3-212, which may have one photodetection region and six charge storage regions, according to some embodiments. FIG. 3-2A is a top view of pixel 3-212, and FIG. 3-2B is a cross-sectional view of pixel 3-212 along line B. Pixel 3-212 may be configured in the manner described for pixel 3-112 in connection with FIGS. 3-1A and 3-1B. For instance, pixel 3-112 is shown in FIGS. 3-2A and 3-2B including photodetection regions PPD0 and PPD1, transfer gates TG0, TG1, TG2, and TG4, and charge storage regions SD0, SD1, SD2, and SD3 (of which the charge storage regions are hidden from view). In addition, pixel 3-212 includes photodetection region PPD2, transfer gates TG4 and TG5, and charge storage regions SD4 and SD5 (of which charge storage region SD5 is hidden from view). As shown in FIG. 3-2B, photodetection region PPD2 may have a different depth from photodetection regions PPD0 and PPD1. In one example, charge storage regions SD4 and SD5 may be configured to receive charge carriers from photodetection region PPD2 via charge transfer channels having a depth different from the charge transfer channels coupling photodetection regions PPD0 and PPD1 to charge storage regions SD0, SD1, SD2, and SD3. Accordingly, in some embodiments, charge storage regions SD4 and SD5 may accumulate a greater number of lower wavelength charge carriers than the other charge storage regions, such as due to more lower wavelength photons reaching photodetection region PPD2 than the other photodetection regions. As a result, including greater numbers of photodetection regions and charge storage regions may increase the timing and/or spectral information of the incident light that may be obtained using pixel 3-212.

c. Techniques Incorporating Optical Shielding

Figures 1B, 3:
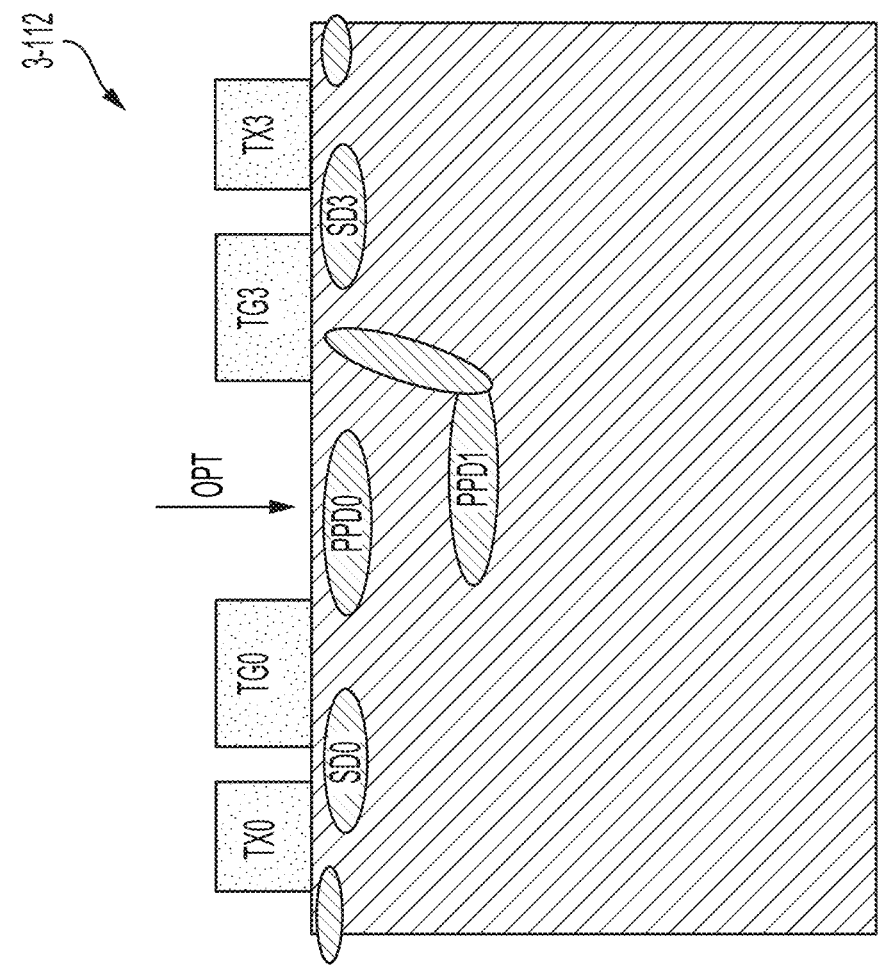
Figures 1A, 3:
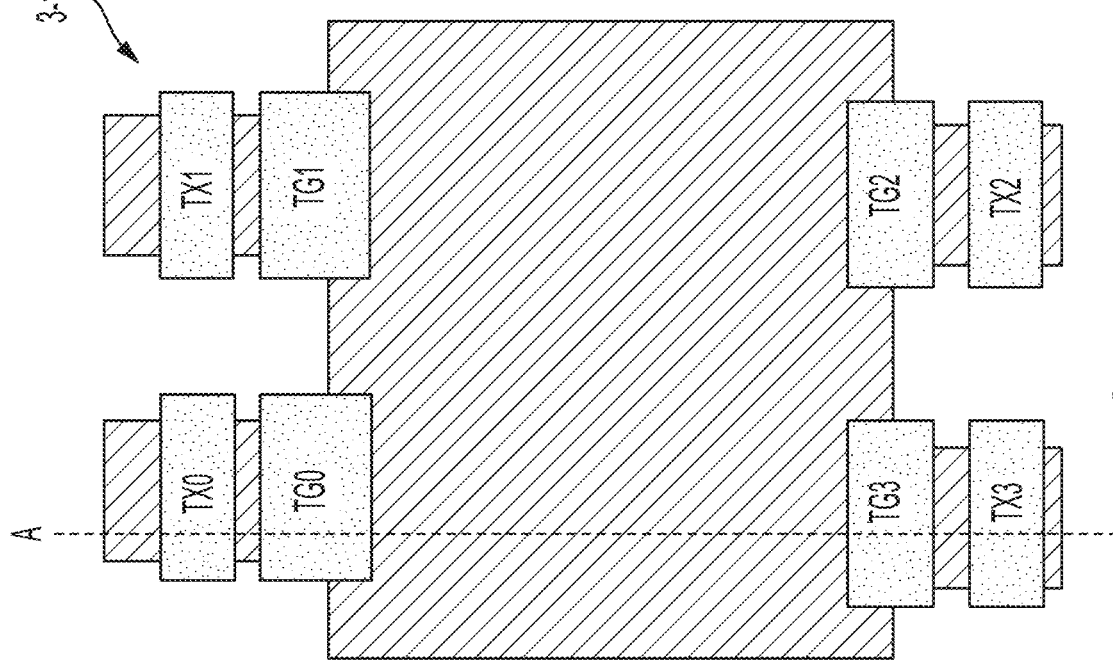
Figures 3, 3C:
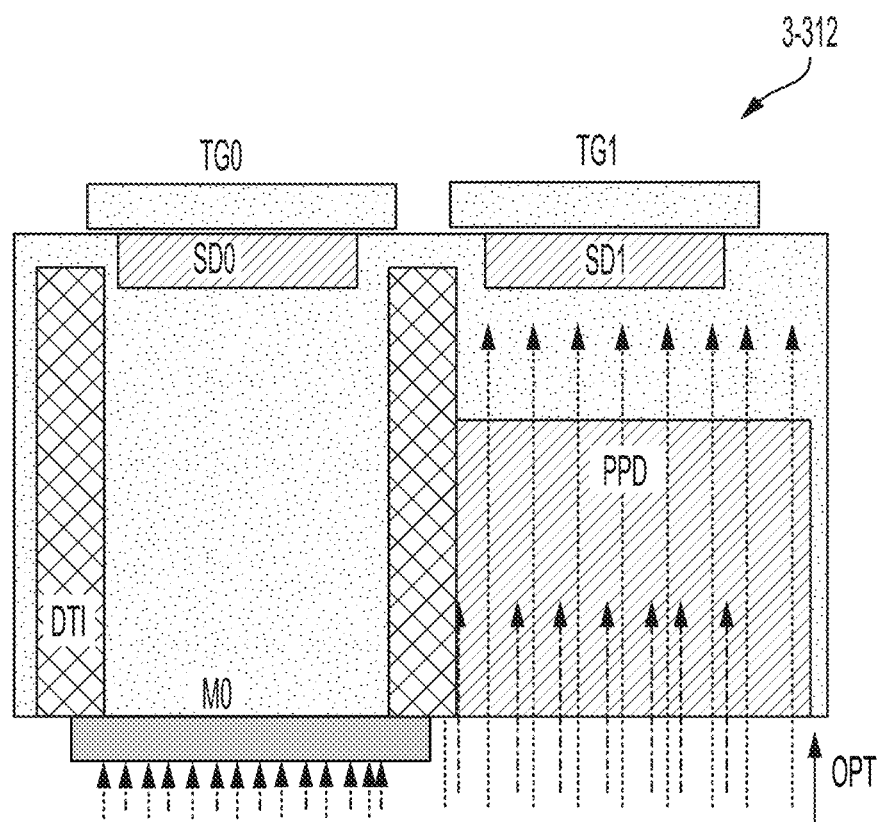
Figures 3, 4:
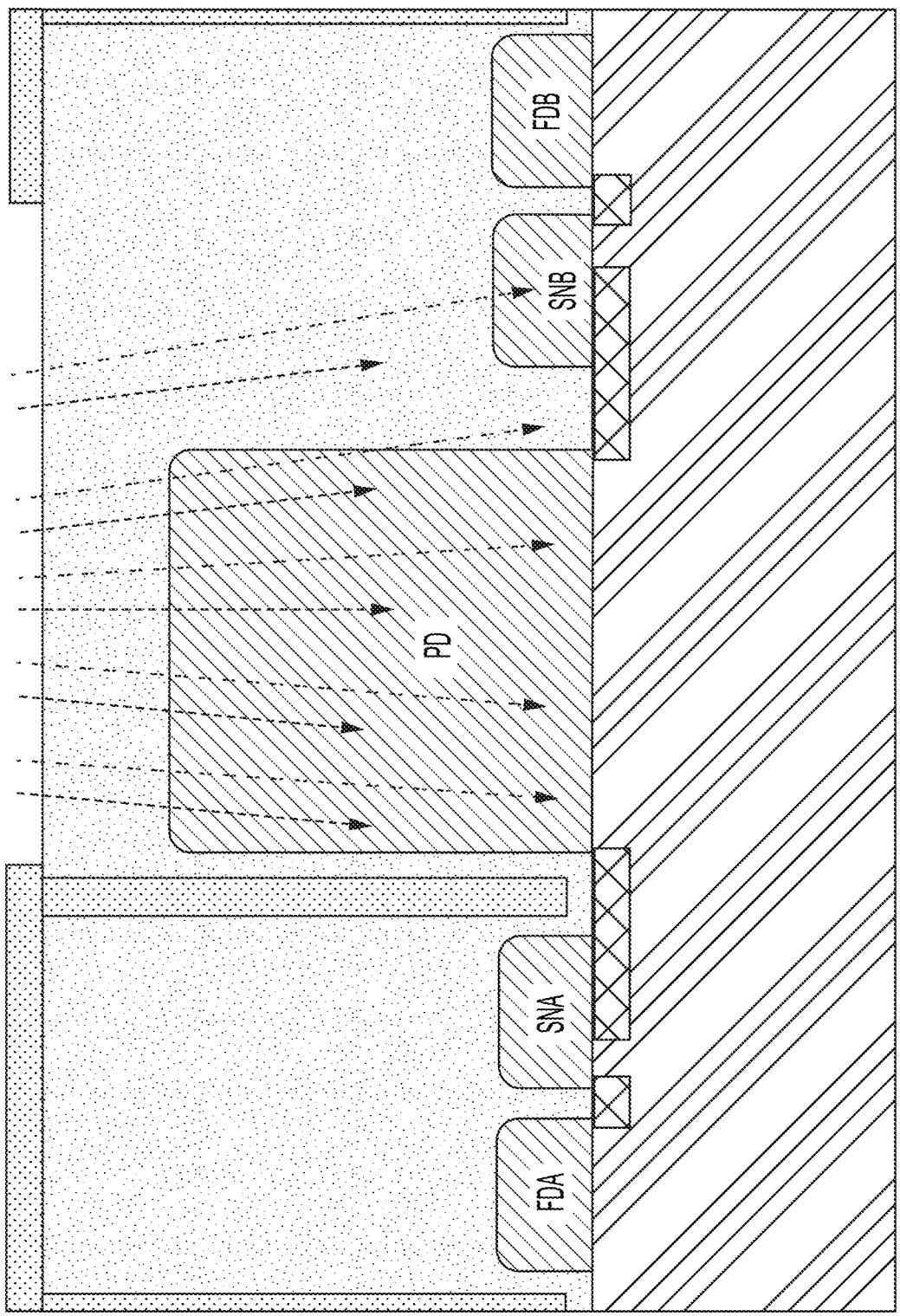
Figures 1, 4:
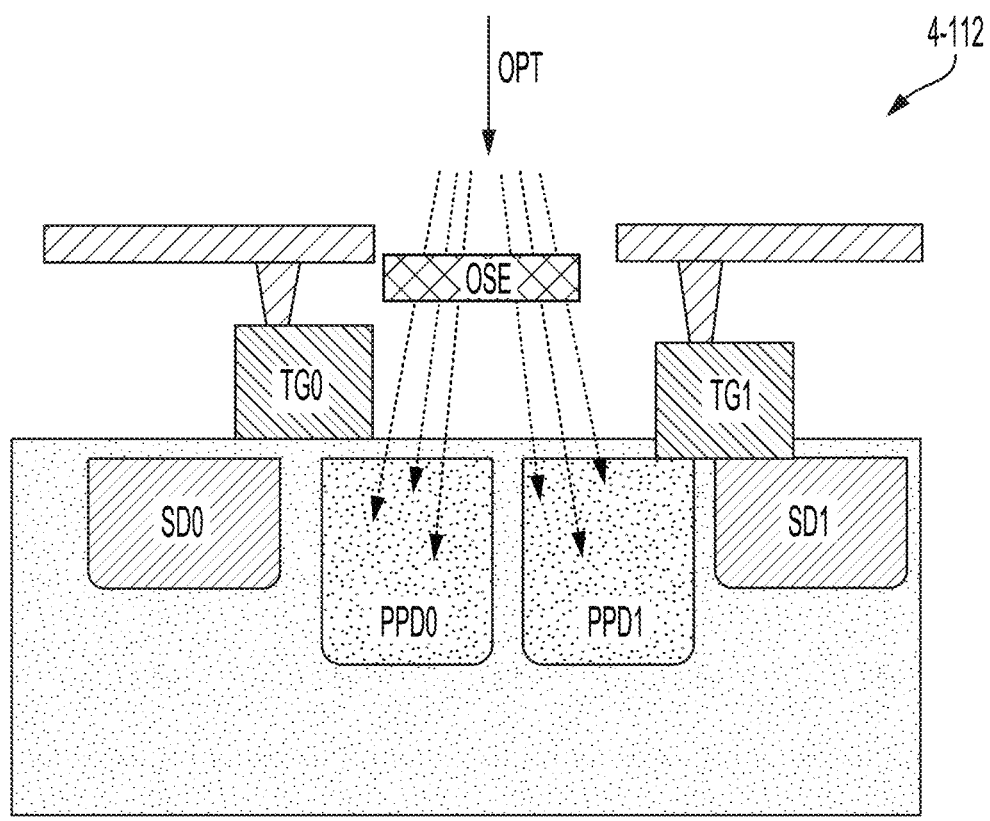
Figures 2, 4:
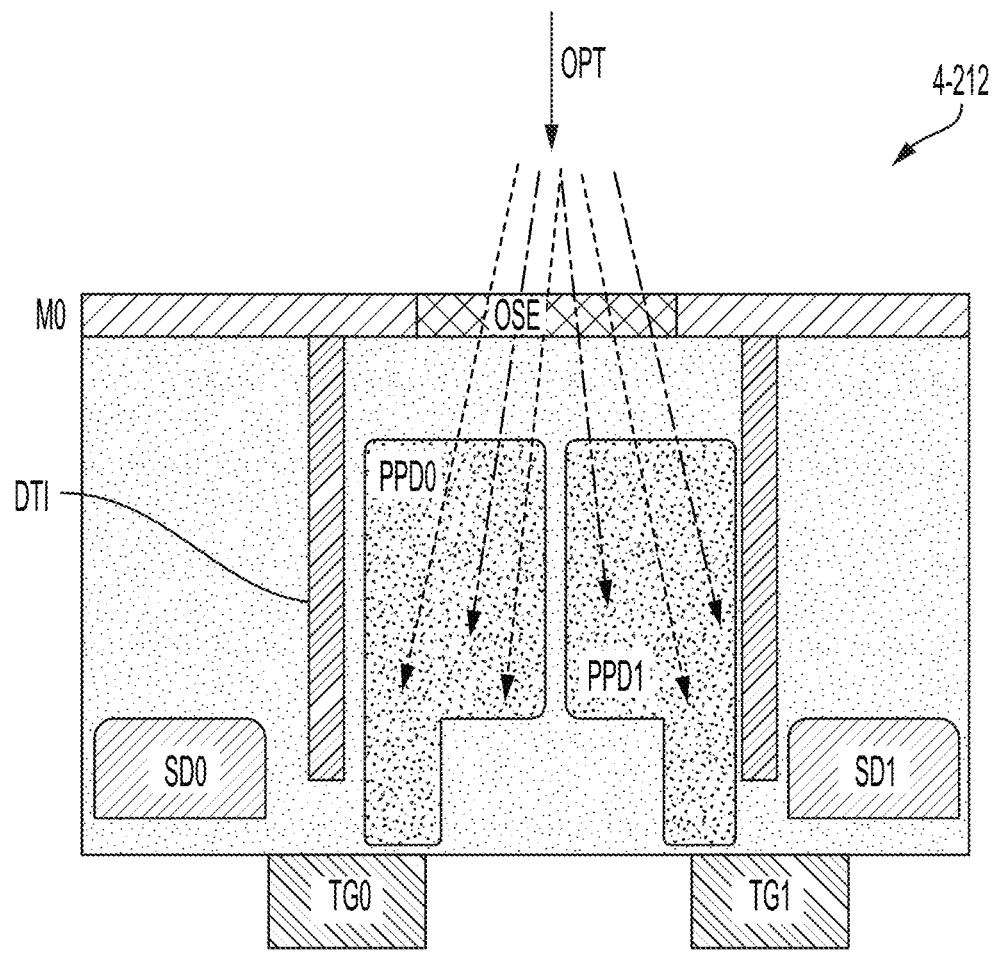
Figures 3A, 4:
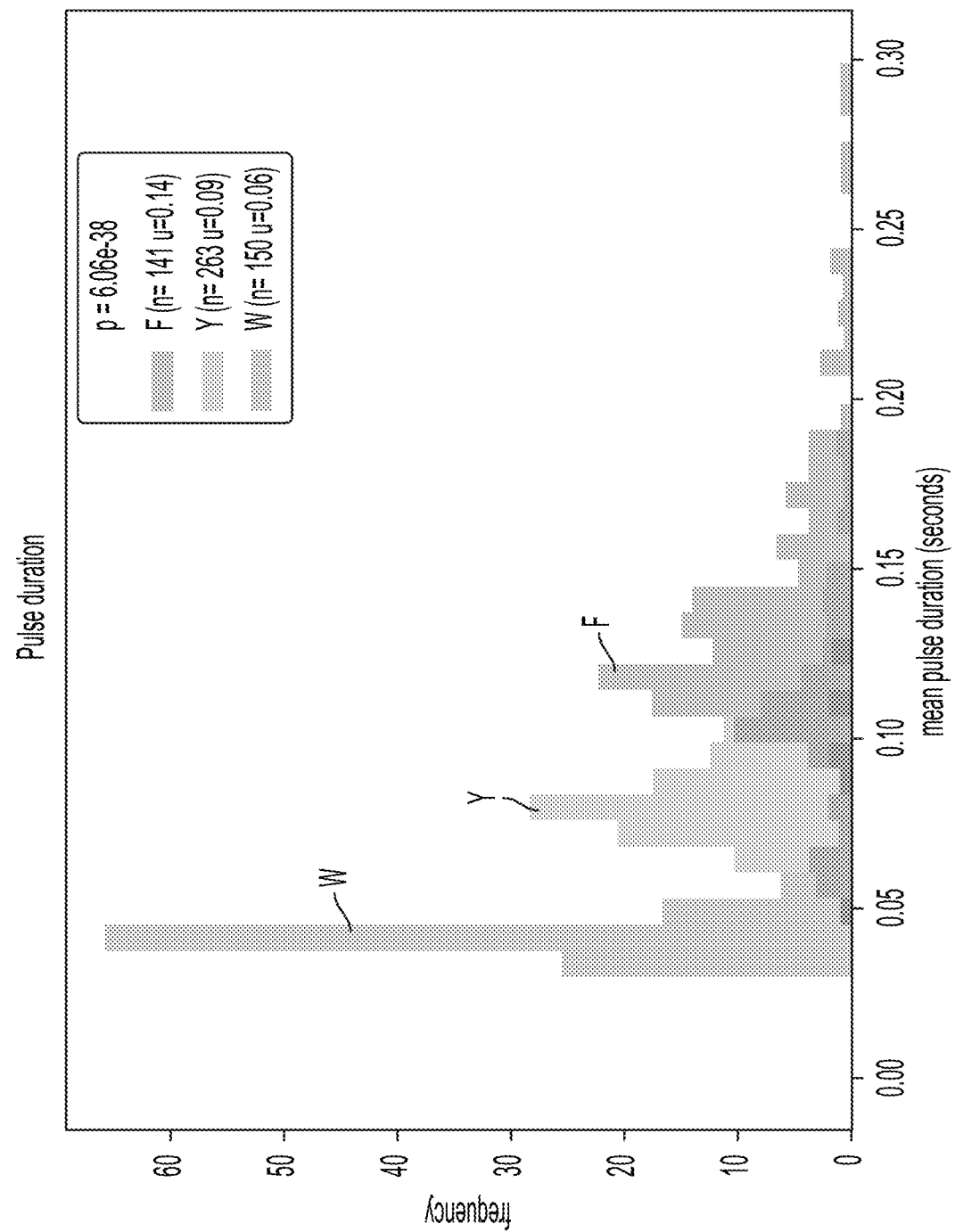
Figures 3B, 4:
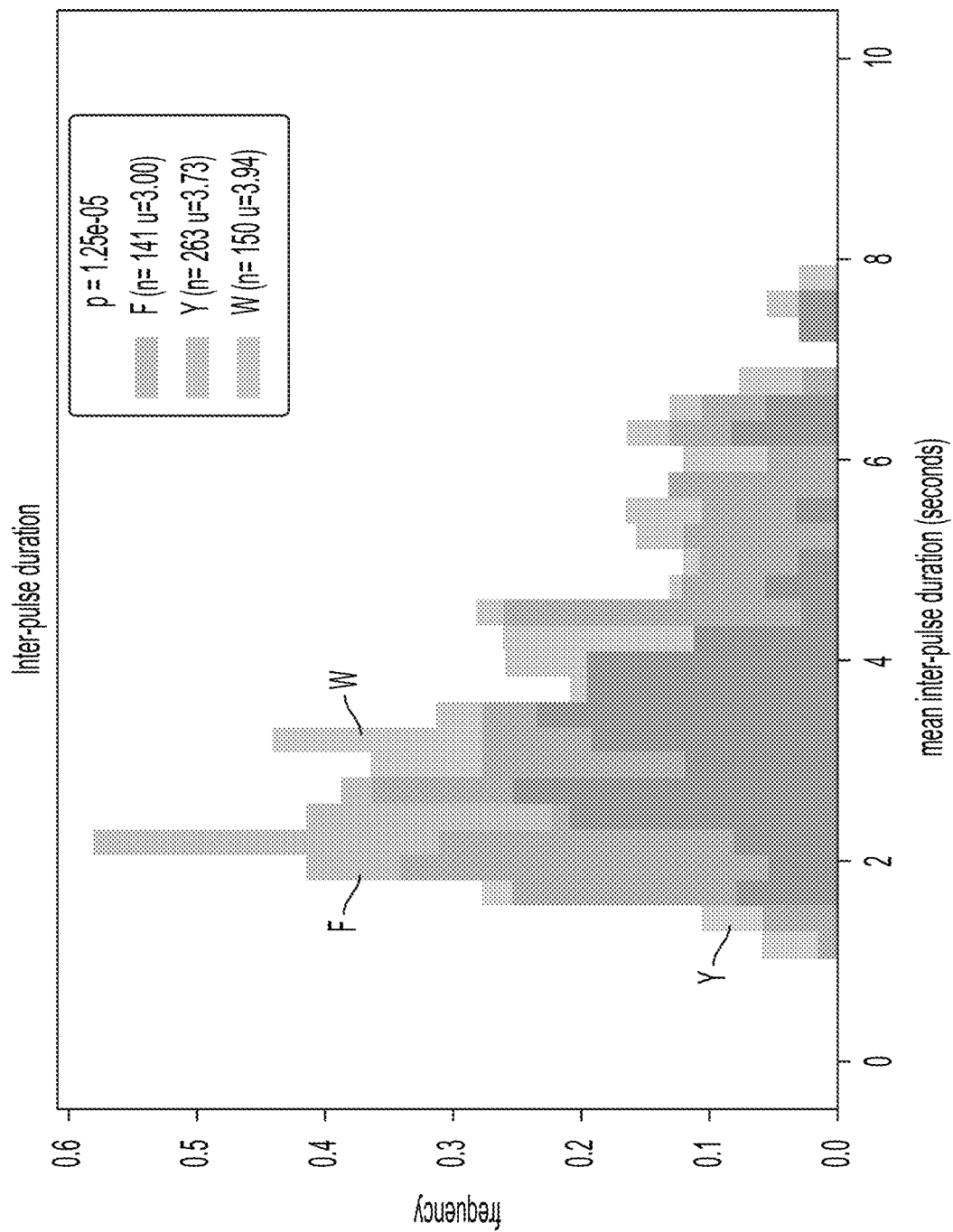
Figures 3C, 4:
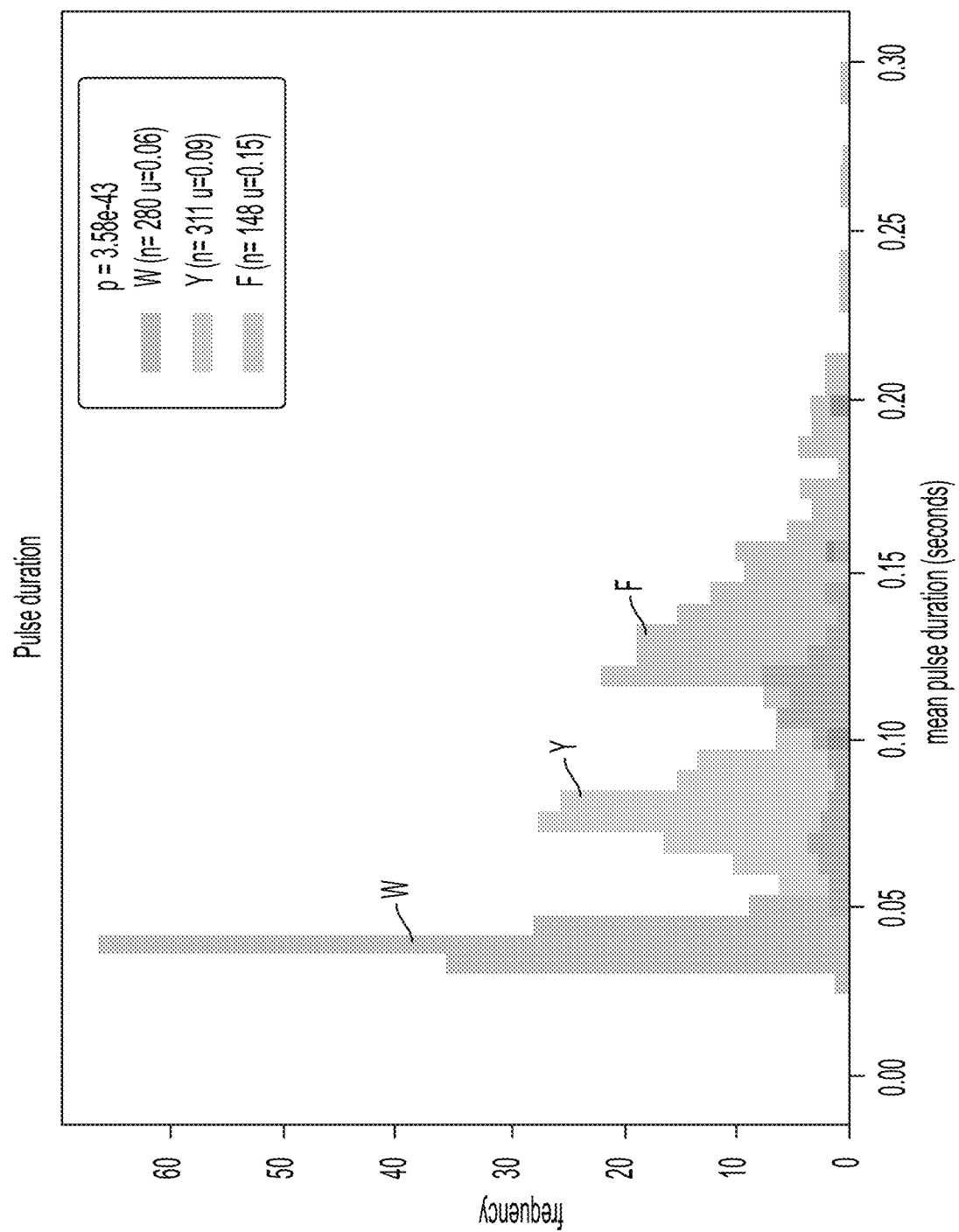
Figures 3D, 4:
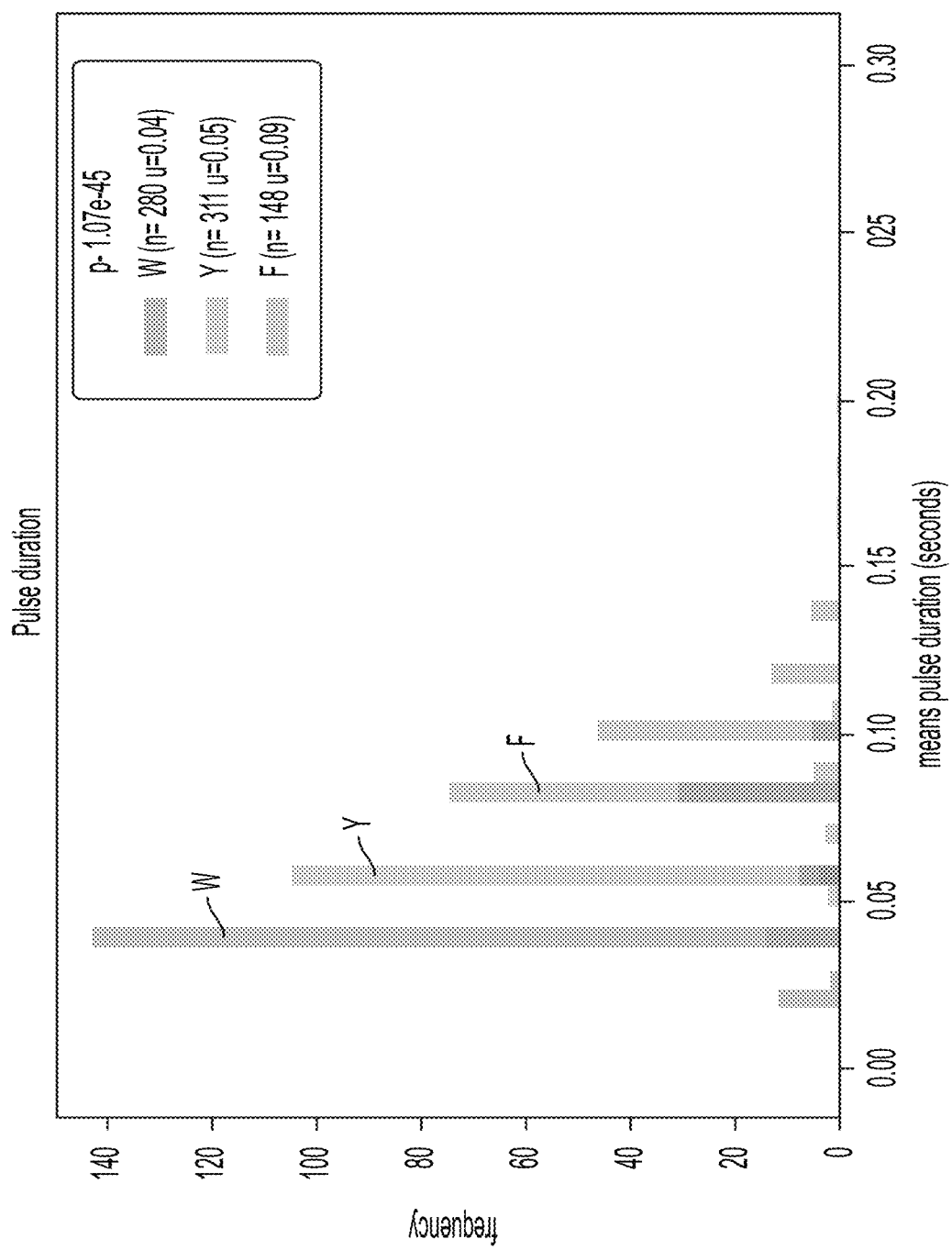
Figures 3E, 4:
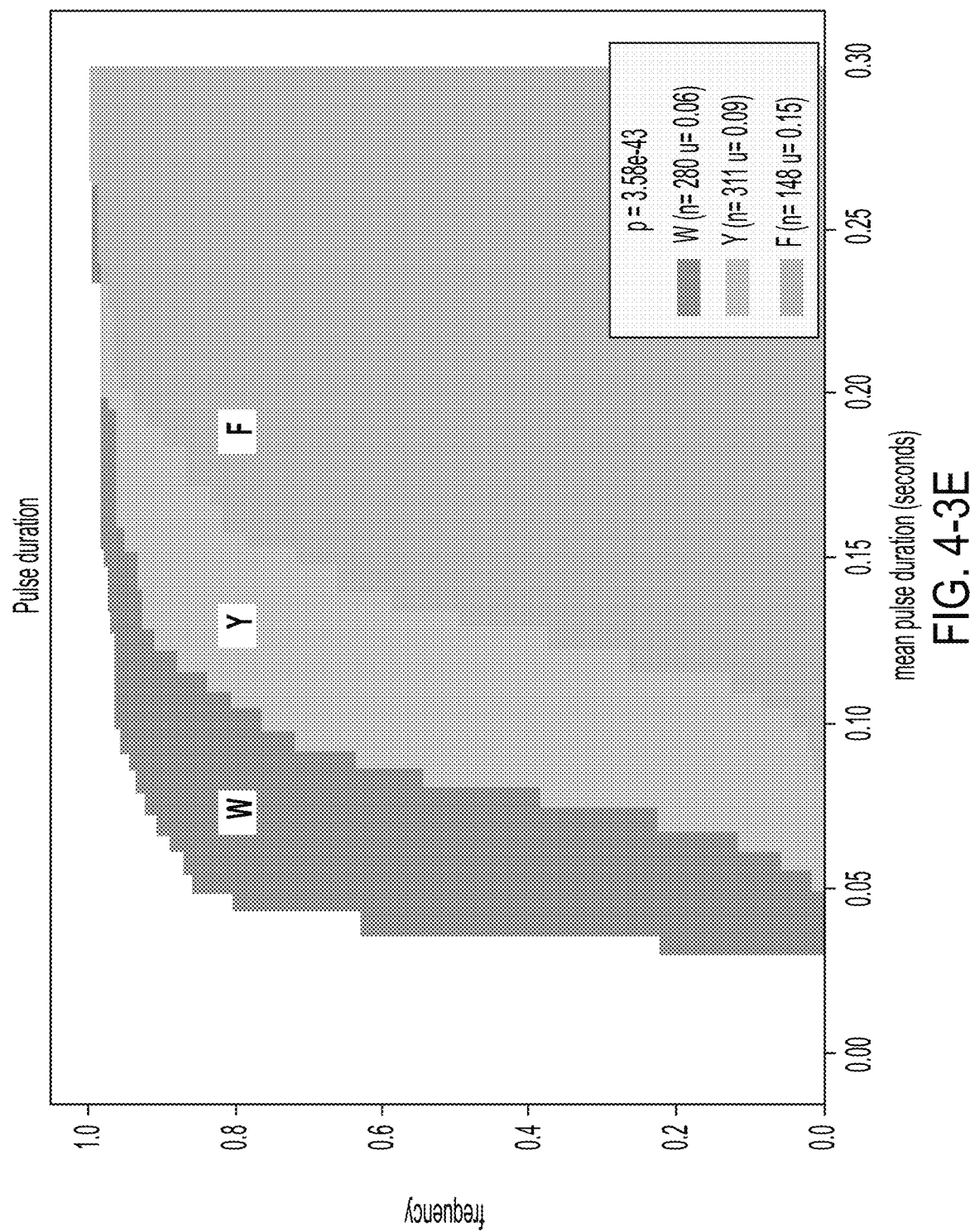
Figure 4:
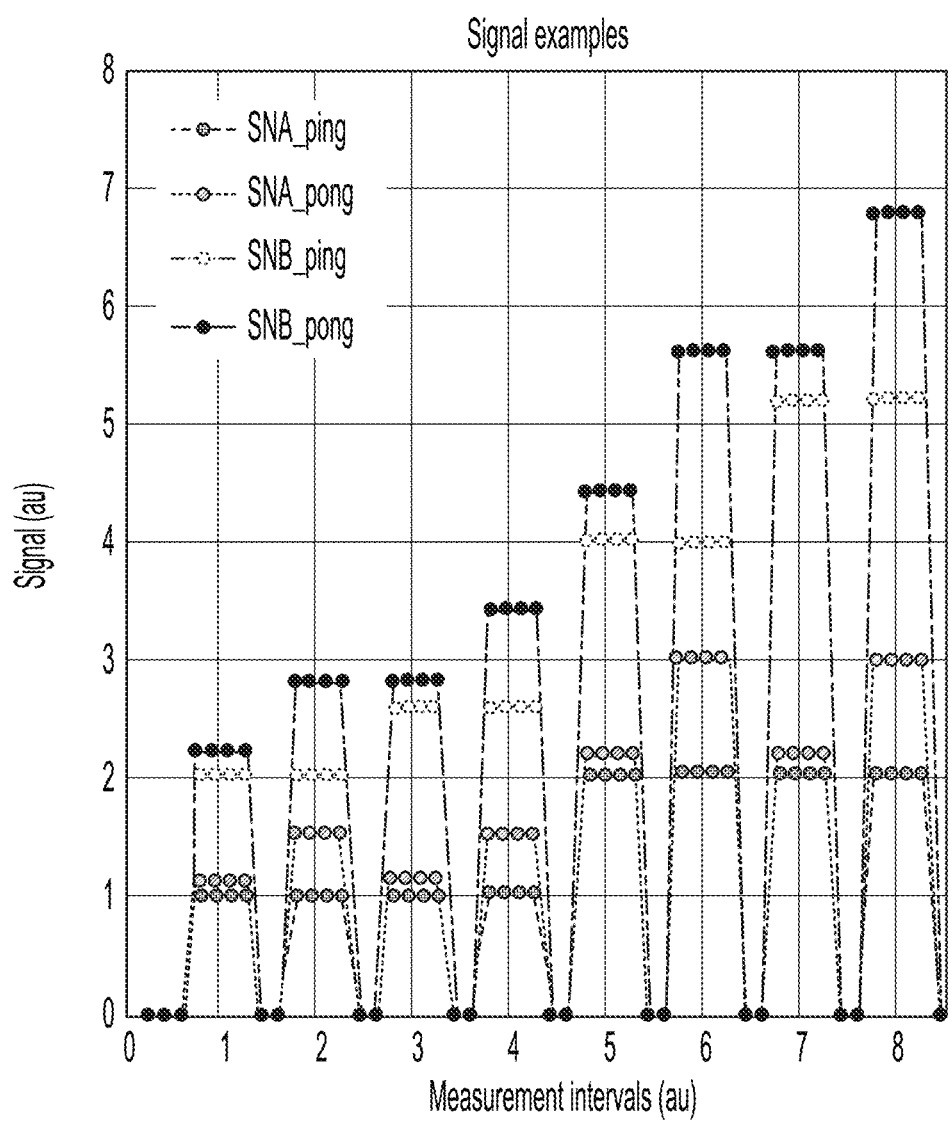

It should be appreciated that, in some embodiments, spectral information may be obtained using a pixel that does not incorporate regions of different depths. For instance, FIGS. 3-3A to 3-3C illustrate pixel 3-312, which may have one photodetection region and two charge storage regions, according to some embodiments. FIG. 3-3A is a top view of pixel 3-312, FIG. 3-3B is a cross-sectional view of Pixel 3-312 along line A of FIG. 3-3A, and FIG. 3-3C is a cross-sectional view of pixel 3-312 along line B of FIG. 3-3C. Pixel 3-312 may be configured in the manner described for pixel 2-212 in connection with FIG. 2-2. For instance, as shown in FIGS. 3-3A to 3-3C, pixel 3-312 includes photodetection region PD, charge storage regions SD0 and SD1, and transfer gate TG0. Also shown in FIGS. 3-3B and 3-3C, pixel 3-312 may be configured to receive incident light in the direction in which transfer gate TG0 is spaced from photodetection region PPD parallel to the optical axis. Pixel 3-312 may also include transfer gate TG1. For instance, one or more barriers (e.g., metal layer M0) may be configured to block incident photons from reaching charge storage region SD0, such that charge carriers predominantly reach charge storage region SD0 by time-gating via transfer gate TG0 from photodetection region PD. In some embodiments, one or more barriers may be positioned adjacent charge storage region SD0 and/or between the photodetection region PPD and charge storage region SD0, elongated parallel to the optical axis, such as illustrated in FIG. 3-3C. In contrast to charge storage region SD0, charge carriers may reach charge storage region SD1 by direct excitation (e.g., by incident photons reaching charge storage region SD1 and generating charge carriers), in addition to time-gating via transfer gate TG1 from photodetection region PD. Accordingly, charge carriers accumulated in the respective charge storage regions SD0 and SD1 may indicate timing and/or spectral information. In one example, a difference in the number of charge carriers accumulated in the respective charge storage regions may indicate a difference in the wavelength content of the incident photons (e.g., a quantity of the incident light that is lower wavelength, a quantity that is higher wavelength, etc.).

FIG. 3-4 is another example of a pixel 3-412, the pixel 3-412 of FIG. 3-4 having at least one charge storage region which is optically shielded, for example, by a barrier. For example, pixel 3-412 may be configured having one photodetection region PD, and two charge storage regions SNA and SNB. Each of the charge storage regions may be coupled to readout regions FDA and FDB, respectively, for causing charge carriers to flow out of the charge storage regions SNA and SNB and into readout regions FDA and FDB for processing. In some embodiments, readout regions FDA and FDB are floating diffusion regions. Emission light incident on photodetection region PPD may generate charge carriers which are selectively stored in one of the two charge storage regions SNA and SNB. Pixel 3-312 may be configured to operate in a "ping pong" mode alternating, at different time intervals, between reading out charge carriers in each of charge storage regions SNA and SNB, as is described herein, for example, with respect to FIG. 4-4.

As shown in FIG. 3-4, at least one of the charge storage regions may be optically shielded, for example, using a barrier, to restrict optical paths to the charge storage region other than through photodetection region PD. For example, in FIG. 3-4, a barrier is configured such that incident photons do not reach charge storage region SNA. Instead, charge storage region SNA may receive charge carriers through photodetection region PPD according to the methods described herein. A second charge storage region, SNB, may not be optically shielded and thus may accumulate charge carriers from photodetection region PPD as well as generating charge carriers directly from incident emission light which have longer wavelengths and thus can reach charge storage region SNB. Thus, analyzing the differences in charge accumulation between charge storage regions SNA and SNB may effectively provide wavelength information of incident emission light.

d. Techniques Incorporating One or More Optical Sorting Elements

FIG. 4-1 is a side view of pixel 4-112, which may have an optical sorting element, two photodetection regions, and two time-gated charge storage regions, according to some embodiments. Pixel 4-112 may be configured in the manner described for pixel 2-412 in connection with FIG. 2-4. For instance, pixel 4-112 is shown in FIG. 4-1 including photodetection regions PPD0 and PPD1, charge storage regions SD0 and SD1, and transfer gates TG0 and TG1. Photodetection regions PPD0 and PPD1 are shown having substantially equal depths, as are charge storage regions SD0 and SD1. Pixel 4-112 is shown further including optical sorting element OSE configured to direct at least some incident photons from the light source towards charge storage region SD0 and at least some other incident photons from the light source towards charge storage region SD1. The charge carriers accumulated in charge storage regions SD0 and SD1 responsive to the incident photons may be indicative of different information. For instance, charge storage region SD0 may indicate timing and/or spectral information particular to the incident photons directed towards charge storage region SD0, and charge storage region SD1 may indicate such information for the incident photons directed towards charge storage region SD1. In some embodiments, the charge carriers stored in charge storage region SD0 may indicate timing information and the charge carriers stored in charge storage region SD0 may indicate wavelength information. Alternatively or additionally, information from each charge storage region may be combined to determine timing and/or spectral information of the incident light received by each charge storage region.

In accordance with various embodiments, optical sorting element OSE may be configured as at least partially refractive, diffractive, scattering, and/or plasmonic. For instance, in some embodiments, the optical sorting element OSE may include a micro-disk, a micro-lens, and/or a prism configured to refract incident light towards the charge storage regions SD0 and SD1, such as depending on a wavelength of the incident light. In some embodiments, the optical sorting element OSE may include a linear grating element, a curved grating element, a zone plate, and/or a photonic crystal configured to diffract the incident light towards the charge storage regions SD0 and SD1, such as depending on the wavelength of the incident light. In some embodiments, the optical sorting element OSE may include a scattering element, such as having multiple elements with different refractive indices. In some embodiments, the optical sorting element OSE may include a plasmonic element, such as nano-holes and/or an extraordinary optical transmission element. Because the optical sorting element OSE may cause incident photons having different frequencies towards the different photodetection regions PPD0 and PPD1, charge carriers accumulated in the charge storage regions SD0 and SD1 may be indicative of different spectral information of the incident photons, such as different wavelength information.

It should be appreciated that, in some embodiments, one or more of the charge storage regions may be configured to receive incident photons from the optical sorting element OSE and generate and store charge carriers in response.

FIG. 4-2 is a side view of pixel 4-212, which may have an optical sorting element, two photodetection regions, and two time-gated charge storage regions, according to some embodiments. Pixel 4-212 may be configured in the manner described for pixel 4-112 in connection with FIG. 4-1. For instance, pixel 4-212 is shown in FIG. 4-2 having photodetection regions PPD0 and PPD1, charge storage regions SD0 and SD1, and transfer gates TG0 and TG1. In addition, pixel 4-212 includes one or more barriers positioned at least partially between photodetection regions PPD0 and PPD1 and respective charge storage regions SD0 and SD1. Also shown in FIG. 4-2, pixel 4-212 may be configured to receive incident photons in a direction in which transfer gates TG0 and TG1 are spaced from photodetection regions PPD0 and PPD1 parallel to the optical axis, whereas pixel 4-112 may be configured to receive incident photons in a direction in which photodetection regions PPD0 and PPD1 are spaced from transfer gates TG0 and TG1 parallel to the optical axis.

V. Techniques for Obtaining Pulse Duration Information

According to a further aspect of the technology described herein, the inventors have developed techniques for obtaining pulse duration information for emission light from a sample in a sample well. For example, fluorescent markers bound to molecules in a sample may have characteristic pulse and interpulse durations such that obtaining measurements of pulse and interpulse duration of emission light from a particular fluorescent marker facilitates identifying the fluorescent marker from which light is emitted. Pulse duration, also referred to herein as pulse width, refers to the interval of time measured across a pulse, in some embodiments, at the full width half maximum of a pulse. Interpulse duration, also referred to herein as interpulse width, refers to the interval of time between pulses.

Thus, in some embodiments, the integrated device described herein may be configured to implement techniques for obtaining pulse duration information, such as the techniques described in U.S. patent application Ser. No. 16/686,028 titled "METHODS AND COMPOSITIONS FOR PROTEIN SEQUENCING," filed Nov. 15, 2019 and PCT Application No. PCT/US19/61831 titled "METHODS AND COMPOSITIONS FOR PROTEIN SEQUENCING," filed Nov. 15, 2019, both which are incorporated by reference in their entireties. For example, as described herein, molecules in a sample may be labeled with fluorescent markers. One or more fluorescent markers may attach (e.g., bond) to a molecule, and, upon being excited by excitation light, may each emit a photon, collectively referred to as a fluorescence event. Emitted photons generated by many such fluorescent events due to repeated excitation of the fluorescent markers may be referred to as a signal pulse. Each signal pulse comprises a pulse duration ("pd") corresponding to an association event between a recognition molecule of the fluorescent markers and the sample molecule under analysis.

For example, without wishing to be bound by theory, labeled affinity reagent of a fluorescent marker selectively binds with a recognition molecule according to a binding affinity ($K_D$) defined by an association rate, or an "on" rate, of binding ($k_{on}$) and a dissociation rate, or an "off" rate, of binding ($k_{off}$). When the fluorescent molecule is bound to the recognition molecule, the marker may fluoresce and emit a photon, while, when the fluorescent marker is unbound, the marker may not fluoresce even when receiving excitation light and entering and exiting an excited state, as described herein. The rate constants $k_{off}$ and $k_{on}$ are the critical determinants of pulse duration (e.g., the time corresponding to a detectable binding event) and interpulse duration (e.g., the time between detectable binding events), respectively. In some embodiments, these rates can be engineered to achieve pulse durations and pulse rates (e.g., the frequency of signal pulses) that give the best sequencing accuracy.

Thus, in some embodiments, the pulse duration is characteristic of a dissociation rate of binding. In addition, each signal pulse of a characteristic pattern is separated from another signal pulse of the characteristic pattern by an interpulse duration ("ipd"). In some embodiments, the interpulse duration is characteristic of an association rate of binding. In some embodiments, a change in magnitude ("ΔM") can be determined for a signal pulse based on a difference between baseline and the peak of a signal pulse. In some embodiments, a characteristic pattern is determined based on pulse duration. In some embodiments, a characteristic pattern is determined based on pulse duration and interpulse duration. In some embodiments, a characteristic pattern is determined based on any one or more of pulse duration, interpulse duration, and change in magnitude. In some embodiments, the series of pulses provide a pulsing pattern (e.g., a characteristic pattern) which may be diagnostic of the identity of the sample under analysis.

FIGS. 4-3A-C show non-limiting examples of characteristic pulse patterns for sample molecules under analysis. FIG. 4-3A is a plot showing discriminant pulse durations (time duration of signal peaks) among the three N-terminal residues when reversibly bound by labeled ClpS2. FIG. 4-3B is a plot showing discriminant interpulse durations (time duration between signal pulses) among the three N-terminal residues. FIG. 4-3C-E shows plots which further illustrate the discriminant pulse durations among phenylalanine, tyrosine, and tryptophan at peptide N-termini.

As described herein, signal pulse information may be used to identify a molecule, such as an amino acid, based on a characteristic pattern in a series of signal pulses. In some embodiments, a characteristic pattern comprises a plurality of signal pulses, each signal pulse comprising a pulse duration. In some embodiments, the plurality of signal pulses may be characterized by a summary statistic (e.g., mean, median, time decay constant) of the distribution of pulse durations in a characteristic pattern. In some embodiments, the mean pulse duration of a characteristic pattern is between about 1 millisecond and about 10 seconds (e.g., between about 1 ms and about 1 s, between about 1 ms and about 100 ms, between about 1 ms and about 10 ms, between about 10 ms and about 10 s, between about 100 ms and about 10 s, between about 1 s and about 10 s, between about 10 ms and about 100 ms, or between about 100 ms and about 500 ms). In some embodiments, different characteristic patterns corresponding to different types of amino acids in a single polypeptide may be distinguished from one another based on a statistically significant difference in the summary statistic. For example, in some embodiments, one characteristic pattern may be distinguishable from another characteristic pattern based on a difference in mean pulse duration of at least 10 milliseconds (e.g., between about 10 ms and about 10 s, between about 10 ms and about 1 s, between about 10 ms and about 100 ms, between about 100 ms and about 10 s, between about 1 s and about 10 s, or between about 100 ms and about 1 s). It should be appreciated that, in some embodiments, smaller differences in mean pulse duration between different characteristic patterns may require a greater number of pulse durations within each characteristic pattern to distinguish one from another with statistical confidence.

As described herein, fluorescence markers may be configured such that the fluorescence markers only fluoresce when attached to a molecule of interest in the sample, and may not fluoresce during periods of disassociation. For example, in some embodiments, a fluorescence resonance energy transfer (FRET) technique is used such that fluorescence of markers selectively occur when attached to a molecule of interest in the sample. Labeled affinity reagent for a fluorescent marker may comprise a label having binding-induced luminescence. For example, in some embodiments, a labeled aptamer comprises a donor label and an acceptor label. Labeled aptamer as a free molecule may adopt a conformation in which donor label and acceptor label are separated by a distance that limits detectable FRET between the labels (e.g., about 10 nm or more). Labeled aptamer as a selectively bound molecule adopts a conformation in which donor label and acceptor label are within a distance that promotes detectable FRET between the labels (e.g., about 10 nm or less). In yet other embodiments, labeled aptamer comprises a quenching moiety and functions analogously to a molecular beacon, wherein luminescence of labeled aptamer is internally quenched as a free molecule and restored as a selectively bound molecule (see, e.g., Hamaguchi, et al. (2001) Analytical Biochemistry 294, 126-131). Without wishing to be bound by theory, it is thought that these and other types of mechanisms for binding-induced luminescence may advantageously reduce or eliminate background luminescence to increase overall sensitivity and accuracy of the methods described herein.

The inventors have recognized that obtaining one or more measurements for pulse duration and/or interpulse duration to facilitate the discrimination techniques described herein may be accomplished using the integrated device 1-102 and the time binning techniques described herein, particularly with respect to Section III of this disclosure. In some embodiments, pulse duration and/or interpulse duration may be used as dimensions for discriminating a sample in a sample well under analysis. For example, as described herein, particular molecules may have a characteristic pulse duration and/or interpulse duration and a sample may be identified by comparing measured pulse durations and/or interpulse duration with known characteristic durations.

VI. Techniques for Obtaining Intensity Information

According to another aspect of the technology described herein, the inventors have developed techniques for obtaining one or more measurements of emission light intensity which can, in some embodiments, facilitate multi-dimensional discrimination techniques of a sample in a sample well. The inventors have recognized that some fluorophores may emit at significantly different intensities or have a significant difference in their probabilities of excitation (e.g., at least a difference of about 35%) even though their decay rates may be similar. By referencing binned signals (e.g., by measuring the accumulation of charge carriers) to measured excitation energy and/or other acquired signals, it can be possible to distinguish different fluorophores based on intensity levels. Thus, it should be appreciated that an integrated device, such as integrated device 1-102, may be configured to measure intensity based on the accumulation of charge carriers in a storage bin through various read-out periods as described herein, and measurements of intensity may be used to distinguish the particular sample under analysis.

In some embodiments, different numbers of fluorophores of the same type may be linked to different molecules in a sample, so that each molecule may be identified based on luminescence intensity. For example, two fluorophores may be linked to a first labeled molecule and four or more fluorophores may be linked to a second labeled molecule. Because of the different numbers of fluorophores, there may be different excitation and fluorophore emission probabilities associated with the different molecules. For example, there may be more emission events for the second labeled molecule during a signal accumulation interval, so that the apparent intensity of the bins is significantly higher than for the first labeled molecule. Thus, the inventors have recognized that, in some embodiments, controlling the number of fluorophores which are linked to a particular molecule in a sample may facilitate identification of the sample. In some embodiments, intensity is therefore at least one of a number of characteristics used in multi-dimensional discrimination techniques for sample analysis.

VII. Applications of Multi-dimensional Discrimination Techniques

Having thus described multiple techniques for acquiring information regarding various characteristics (e.g., lifetime, wavelength, intensity, pulse duration, and/or interpulse duration) of emission light from a sample, example applications of the multi-dimensional discrimination techniques will now be described. For example, the inventors have recognized that identification of one or more molecules in a sample under analysis may be identified using the multi-dimensional techniques described herein. In particular, measurements for one or more characteristics of emission light may be obtained by a device, such as the integrated device described herein, and the collected measurements may be compared to known characteristic values of the measured characteristics for a fluorescent marker to determine which fluorescent marker is the most likely source of the emission light. In turn, by identifying the fluorescent marker, the identity of the molecule to which the fluorescent marker is attached can be known based on the particular type of molecule to which the fluorescent marker is known to attach.

Any suitable combination of characteristics may be combined and used in the multi-dimensional techniques described herein. For example, in some embodiments, a two-dimensional discrimination technique may identify a sample of interest based on information of any two of lifetime, wavelength, pulse duration, interpulse duration, and intensity of emission light associated with the sample. In some embodiments, a two-dimensional discrimination technique for identifying a sample of interest is based on wavelength information and lifetime information of emission light associated with the sample. In some embodiments, a two-dimensional discrimination technique for identifying a sample of interest is based on lifetime information and intensity information of emission light associated with the sample. In some embodiments, a two-dimensional discrimination technique for identifying a sample of interest is based on wavelength information and lifetime information of emission light associated with the sample. In some embodiments, a three-dimensional discrimination technique may identify a sample of interest based on information of any three of lifetime, wavelength, pulse duration, interpulse duration, and intensity of emission light associated with the sample. In some embodiments, a three-dimensional discrimination technique for identifying a sample of interest is based on lifetime information, wavelength information, and intensity information of emission light associated with the sample. In some embodiments, a three-dimensional discrimination technique for identifying a sample of interest is based on any two of wavelength information, lifetime information, and intensity information, and any one of pulse duration information and interpulse duration information of emission light associated with the sample. According to another aspect of the technology described herein, a four-dimensional discrimination technique is used to identify a sample of interest based information of any four of lifetime, wavelength, pulse duration, interpulse duration, and intensity of emission light associated with the sample. In some embodiments, a four-dimensional discrimination technique for identifying a sample of interest is based on lifetime information, wavelength information, intensity information and one of interpulse duration information and pulse duration information of emission light associated with the sample. According to another aspect of the technology described herein, a five-dimensional discrimination technique is used to identify a sample of interest based on information of lifetime, wavelength, intensity, pulse duration, and interpulse duration of emission light associated with the sample.

In some embodiments, a two-dimensional discrimination technique for identifying a sample of interest is based on measurements of any two of wavelength, lifetime, intensity, pulse duration and interpulse duration of emission light associated with the sample. In some embodiments, a two-dimensional discrimination technique for identifying a sample of interest is based on measurements of lifetime and intensity of emission light associated with a sample. In some embodiments, a two-dimensional discrimination technique for identifying a sample of interest is based on measurements of wavelength and intensity of emission light associated with a sample.

For example, FIG. 4-4 shows one example of data collected for a multi-dimensional discrimination technique, according to some embodiments described herein. In the illustrated example in FIG. 4-4, measurements are collected for intensity, wavelength, and lifetime of emission light collected emitted from a sample within a sample well and collected by a photodetector. The graph shown in FIG. 4-4 contains signal data collected from two storage nodes, SNA and SNB. The storage nodes SNA and SNB may be configured as the two charge storage regions in FIG. 3-3, for example. "Ping" and "pong" labels as applied to storage nodes SNA and SNB may refer to time intervals at which signal from a respective storage node is obtained by a processor. Charge carriers accumulated in storage regions may be read out to a component, such as a processor, controller, and/or circuit, incrementally, with charges carriers in a first storage node SNA being readout twice initially (a ping interval, and a pong interval) and thereafter charge carriers in a second storage node SNB being read out twice (a ping interval, and a pong interval). The signal represents the accumulated charge from all storage nodes previously read out.

Analysis of the signal at the various time intervals provides information for various characteristics of incident emission light. For example, intensity of the incident emission light may be analyzed best by comparing relative signal measurements for the SNA ping interval, which is the initial interval of charge carrier read out. As shown in the graph and accompanying table, pulses 1-4 have a relatively lower signal than pulses 5-8, and thus, pulses 1-4 can be considered as having a low intensity while pulses 5-8 can be considered as having a relatively higher intensity. Lifetime information can be analyzed by viewing the relative difference in signal between the SNA ping interval and the SNA pong interval. For example, where the SNA pong interval signal read out is approximately the same as the SNA ping interval, much of the signal was generated by charge carriers generated during the SNA ping interval, which is the earlier interval, and therefore for those pulses, lifetime is relatively short. Where the SNA pong interval signal read out is larger than the SNA ping interval, more charge carriers were generated at a later time interval and thus lifetime is relatively long. In the illustrated figure, odd pulses are shown to have short lifetimes while even pulses have longer lifetimes. Finally, wavelength information can be determined based on the arrangement of the storage nodes SNA and SNB. When the storage nodes are configured with an optical blocking element as described with respect to FIG. 3-3, the storage node which is unblocked, SNB, will receive more light at longer wavelengths than the blocked storage node, SNA. Thus, analyzing the difference between SNA and SNB pong intervals to determine whether the SNB charge carrier readouts are relatively larger than SNA charge carrier readouts will indicate whether the pulse has a relatively short or long wavelength. For example, comparing SNA and SNB readout signals for pong intervals and determining whether the signal readout for SNB is approximately more than double the SNA readout signal will determine whether the wavelength of incident emission light is relatively short or otherwise, is relatively long.

The inventors have recognized that discrimination techniques a relatively higher number of dimensions (e.g., three dimensions vs. two dimensions, four dimensions vs. three dimensions, etc.) may improve the ability to accurately identify the source of emission light and therefore to accurately identify the sample under analysis. As described herein, in the application of the multidimensional discrimination techniques to protein sequencing, in order to accurately identify 20 different amino acids as well as posttranslational modifications, it is advantageous to use discrimination techniques having higher degrees of dimensionality (e.g., three, four, and/or five dimensions for discriminating a sample). In particular, higher dimensional techniques may facilitate accurate identification of a emission source (e.g., a fluorescent marker and/or a sample to which the fluorescent marker is attached) even when the received signal is relatively low (i.e., the emission light intensity is relatively low). The inventors have recognized that developing discrimination techniques which function even with relatively low signal may extend read length for the sequencing applications described herein and improve the scalability of the technology to larger assay sizes.

Although it may be advantageous to increase the dimensionality of a discrimination technique used to identify a sample, doing so may increase the complexity of the integrated device from which the discrimination information is obtained. In addition, providing fluorescent markers optimized for obtaining information on multiple characteristics (e.g., wavelength and lifetime) may require increased effort and complexity of the fluorescent marker and/or integrated device. The inventors have recognized, however, that certain types of information may be obtained without increasing the complexity of the integrated device, as described herein. For example, pulse duration information, interpulse duration information, and pulse intensity information may be obtained using an existing device configured for obtaining wavelength information and/or lifetime information without minimal to no changes to the device required. Thus, the inventors have recognized that increasing the dimensionality of a discrimination technique by using pulse intensity information, pulse duration information, and/or interpulse duration information to identify a sample may improve identification accuracy without significantly increasing the complexity of the integrated device.

As described herein, the characteristics described above, e.g., wavelength information, intensity information, lifetime information, pulse duration information, and interpulse duration information, may be obtained based charge carriers stored in at least one charge storage region. A component, which, in some embodiments, is part of the integrated device, is configured for obtaining the information regarding one or more of the characteristics described herein. For example, the component may be a hardware module (e.g. one or more controllers, one or more processors, circuitry implemented via one or more Field Programmable Gate Arrays (FPGAs), an application-specific integrated circuit (ASICs)) and/or any other suitable component configured to perform the functions of the component described herein.

In some embodiments, the integrated device is configured having one component capable of obtaining wavelength information, intensity information, lifetime information, pulse duration information, and interpulse duration information. In some embodiments, the integrated device may be configured having multiple components capable of obtaining wavelength information, intensity information, lifetime information, pulse duration information, and interpulse duration information. For example, in some embodiments, each type of information (e.g., wavelength information, lifetime information, etc.) may be obtained by a different component. In some embodiments, a first component may be configured to obtain some but not all types of information, and one or more other components may be configured to obtain the other types of information not obtained by the first component. For example, interpulse duration information and pulse duration information may be obtained by a first component, while wavelength information, luminescence lifetime information, and intensity information may be obtained by one or more other components. In some embodiments, interpulse duration information, pulse duration information, and luminescence lifetime information may be obtained by a first component, and wavelength information and luminescence lifetime information may be obtained by one or more other components. In some embodiments, multiple components may be configured to obtain a single type of information (e.g., wavelength information).

The inventors have appreciated that the multi-dimensional discriminations techniques can be implemented in variety of applications, two non-limiting examples of which include DNA and/or RNA sequencing applications and/or protein sequencing applications, each of which is described further herein.

a. DNA and/or RNA Sequencing Applications

The inventors have recognized that, in some embodiments, the techniques described herein for multi-dimensional discrimination of a sample may be used in DNA and/or RNA sequencing applications, as one non-limiting example. For example, an analytic system described herein may include an integrated device and an instrument configured to interface with the integrated device. The integrated device may include an array of pixels, where a pixel includes a reaction chamber and at least one photodetector. A surface of the integrated device may have a plurality of reaction chambers, where a reaction chamber is configured to receive a sample from a suspension placed on the surface of the integrated device. A suspension may contain multiple samples of a same type, and in some embodiments, different types of samples. In this regard, the phrase "sample of interest" as used herein can refer to a plurality of samples of a same type that are dispersed in a suspension, for example. Similarly, the phrase "molecule of interest" as used herein can refer to a plurality of molecules of a same type that are dispersed in a suspension. The plurality of reaction chambers may have a suitable size and shape such that at least a portion of the reaction chambers receive one sample from a suspension. In some embodiments, the number of samples within a reaction chamber may be distributed among the reaction chambers such that some reaction chambers contain one sample with others contain zero, two or more samples.

In some embodiments, a suspension may contain multiple single-stranded DNA templates, and individual reaction chambers on a surface of an integrated device may be sized and shaped to receive a sequencing template. Sequencing templates may be distributed among the reaction chambers of the integrated device such that at least a portion of the reaction chambers of the integrated device contain a sequencing template. The suspension may also contain labeled nucleotides which then enter in the reaction chamber and may allow for identification of a nucleotide as it is incorporated into a strand of DNA complementary to the single-stranded DNA template in the reaction chamber. In some embodiments, the suspension may contain sequencing templates and labeled nucleotides may be subsequently introduced to a reaction chamber as nucleotides are incorporated into a complementary strand within the reaction chamber. In this manner, timing of incorporation of nucleotides may be controlled by when labeled nucleotides are introduced to the reaction chambers of an integrated device.

Excitation light is provided from an excitation source located separate from the pixel array of the integrated device. The excitation light is directed at least in part by elements of the integrated device towards one or more pixels to illuminate an illumination region within the reaction chamber. A marker may then emit emission light when located within the illumination region and in response to being illuminated by excitation light. In some embodiments, one or more excitation sources are part of the instrument of the system where components of the instrument and the integrated device are configured to direct the excitation light towards one or more pixels.

Emission light emitted from a reaction chamber (e.g., by a fluorescent label) may then be detected by one or more photodetectors within a pixel of the integrated device. Characteristics of the detected emission light may provide an indication for identifying the marker associated with the emission light. Such characteristics may include any suitable type of characteristic, including an arrival time of photons detected by a photodetector, an amount of photons accumulated over time by a photodetector, and/or a distribution of photons across two or more photodetectors. In some embodiments, a photodetector may have a configuration that allows for the detection of one or more characteristics associated with emission light, such as timing characteristics (e.g., fluorescence lifetime), wavelength, pulse duration, interpulse duration, and/or intensity. As one example, the photodetector may detect a distribution of photon arrival times after a pulse of excitation light propagates through the integrated device, and the distribution of arrival times may provide an indication of a timing characteristic of the emission light (e.g., a proxy for fluorescence lifetime, pulse duration, and/or interpulse duration). In some embodiments, the one or more photodetectors provide an indication of the probability of emission light emitted by the marker (e.g., fluorescence intensity). In some embodiments, a plurality of photodetectors may be sized and arranged to capture a spatial distribution of the emission light (e.g., wavelength). Output signals from the one or more photodetectors may then be used to distinguish a marker from among a plurality of markers, where the plurality of markers may be used to identify a sample or its structure. In some embodiments, a sample may be excited by multiple excitation energies, and emission light and/or timing characteristics of the emission light from the reaction chamber in response to the multiple excitation energies may distinguish a marker from a plurality of markers.

Figures 2, 3, 4, 5:
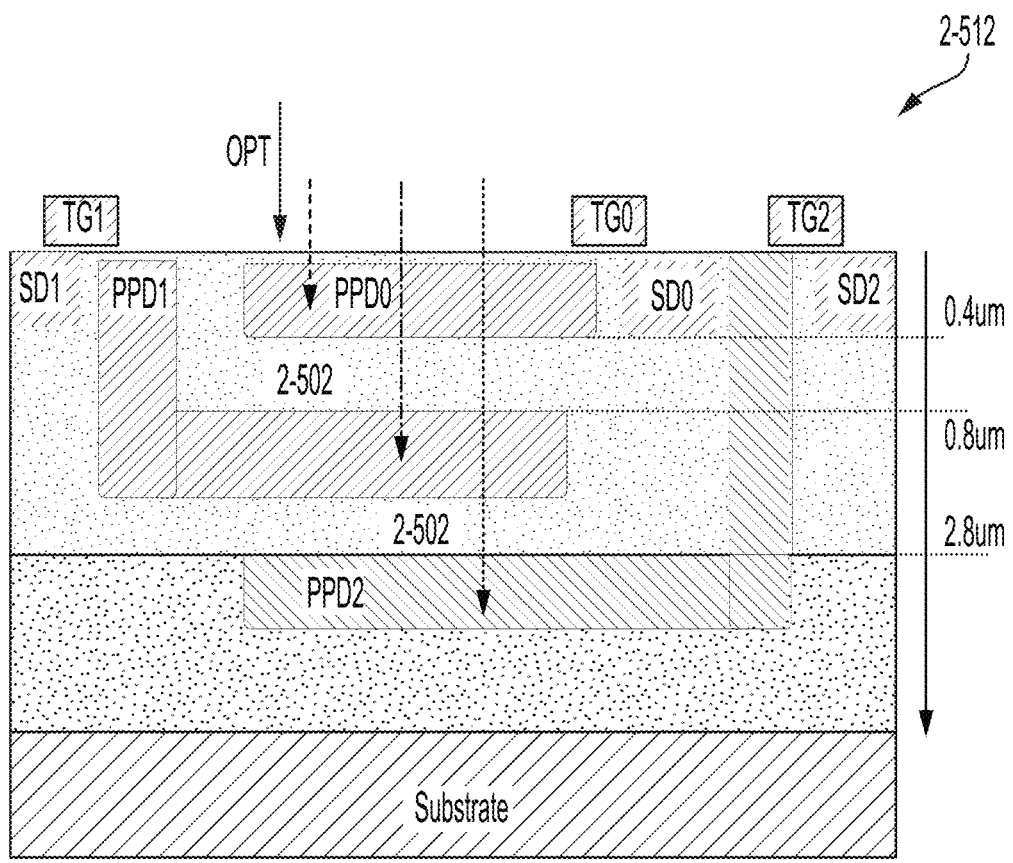

In some embodiments, a system and integrated device similar to the technology previously described herein may be implemented to facilitate DNA and/or RNA sequencing applications. For example, a schematic overview of the system 5-100 is illustrated in FIG. 5-1A. The system comprises both an integrated device 5-102 that interfaces with an instrument 5-104. In some embodiments, instrument 5-104 may include one or more excitation sources 5-106 integrated as part of instrument 5-104. In some embodiments, an excitation source may be external to both instrument 5-104 and integrated device 5-102, and instrument 5-104 may be configured to receive excitation light from the excitation source and direct excitation light to the integrated device. The integrated device may interface with the instrument using any suitable socket for receiving the integrated device and holding it in precise optical alignment with the excitation source. The excitation source 5-106 may be configured to provide excitation light to the integrated device 5-102. As illustrated schematically in FIG. 5-1A, the integrated device 5-102 has a plurality of pixels 5-112, where at least a portion of pixels may perform independent analysis of a sample of interest. Such pixels 5-112 may be referred to as "passive source pixels" since a pixel receives excitation light from a source 5-106 separate from the pixel, where excitation light from the source excites some or all of the pixels 5-112. Excitation source 5-106 may be any suitable light source. Examples of suitable excitation sources are described in U.S. patent application Ser. No. 14/821,688, filed Aug. 7, 2015, titled "INTEGRATED DEVICE FOR PROBING, DETECTING AND ANALYZING MOLECULES," which is hereby incorporated by reference in its entirety. In some embodiments, excitation source 5-106 includes multiple excitation sources that are combined to deliver excitation light to integrated device 5-102. The multiple excitation sources may be configured to produce multiple excitation energies or wavelengths.

A pixel 5-112 has a reaction chamber 5-108 configured to receive a single sample of interest and a photodetector 5-110 for detecting emission light emitted from the reaction chamber in response to illuminating the sample and at least a portion of the reaction chamber 5-108 with excitation light provided by the excitation source 5-106. In some embodiments, reaction chamber 5-108 may retain the sample in proximity to a surface of integrated device 5-102, which may ease delivery of excitation light to the sample and detection of emission light from the sample or a reaction component (e.g., a labeled nucleotide).

Optical elements for coupling excitation light from excitation light source 5-106 to integrated device 5-102 and guiding excitation light to the reaction chamber 5-108 are located both on integrated device 5-102 and the instrument 5-104. Source-to-chamber optical elements may comprise one or more grating couplers located on integrated device 5-102 to couple excitation light to the integrated device and waveguides to deliver excitation light from instrument 5-104 to reaction chambers in pixels 5-112. One or more optical splitter elements may be positioned between a grating coupler and the waveguides. The optical splitter may couple excitation light from the grating coupler and deliver excitation light to at least one of the waveguides. In some embodiments, the optical splitter may have a configuration that allows for delivery of excitation light to be substantially uniform across all the waveguides such that each of the waveguides receives a substantially similar amount of excitation light. Such embodiments may improve performance of the integrated device by improving the uniformity of excitation light received by reaction chambers of the integrated device.

Reaction chamber 5-108, a portion of the excitation source-to-chamber optics, and the reaction chamber-to-photodetector optics are located on integrated device 5-102. Excitation source 5-106 and a portion of the source-to-chamber components are located in instrument 5-104. In some embodiments, a single component may play a role in both coupling excitation light to reaction chamber 5-108 and delivering emission light from reaction chamber 5-108 to photodetector 5-110. Examples of suitable components, for coupling excitation light to a reaction chamber and/or directing emission light to a photodetector, to include in an integrated device are described in U.S. patent application Ser. No. 14/821,688, filed Aug. 7, 2015, titled "INTEGRATED DEVICE FOR PROBING, DETECTING AND ANALYZING MOLECULES," and U.S. patent application Ser. No. 14/543,865, filed Nov. 17, 2014, titled "INTEGRATED DEVICE WITH EXTERNAL LIGHT SOURCE FOR PROBING, DETECTING, AND ANALYZING MOLECULES," both of which are hereby incorporated by reference in their entirety.

Pixel 5-112 is associated with its own individual reaction chamber 5-108 and at least one photodetector 5-110. The plurality of pixels of integrated device 5-102 may be arranged to have any suitable shape, size, and/or dimensions. Integrated device 5-102 may have any suitable number of pixels. The number of pixels in integrated device 2-102 may be in the range of approximately 10,000 pixels to 1,000,000 pixels or any value or range of values within that range. In some embodiments, the pixels may be arranged in an array of 512 pixels by 512 pixels. Integrated device 5-102 may interface with instrument 5-104 in any suitable manner. In some embodiments, instrument 5-104 may have an interface that detachably couples to integrated device 5-102 such that a user may attach integrated device 5-102 to instrument 5-104 for use of integrated device 5-102 to analyze at least one sample of interest in a suspension and remove integrated device 5-102 from instrument 5-104 to allow for another integrated device to be attached. The interface of instrument 5-104 may position integrated device 5-102 to couple with circuitry of instrument 5-104 to allow for readout signals from one or more photodetectors to be transmitted to instrument 5-104. Integrated device 5-102 and instrument 5-104 may include multi-channel, high-speed communication links for handling data associated with large pixel arrays (e.g., more than 10,000 pixels).

A cross-sectional schematic of integrated device 5-102 illustrating a row of pixels 5-112 is shown in FIG. 5-1B. Integrated device 5-102 may include coupling region 5-201, routing region 5-202, and pixel region 5-203. Pixel region 5-203 may include a plurality of pixels 5-112 having reaction chambers 5-108 positioned on a surface at a location separate from coupling region 5-201, which is where excitation light (shown as the dashed arrow) couples to integrated device 5-102. Reaction chambers 5-108 may be formed through metal layer(s) 5-116. One pixel 5-112, illustrated by the dotted rectangle, is a region of integrated device 5-102 that includes a reaction chamber 5-108 and a photodetection region having one or more photodetectors 5-110.

FIG. 5-1B illustrates the path of excitation (shown in dashed lines) by coupling a beam of excitation light to coupling region 5-201 and to reaction chambers 5-108. The row of reaction chambers 5-108 shown in FIG. 5-1B may be positioned to optically couple with waveguide 5-220. Excitation light may illuminate a sample located within a reaction chamber. The sample or a reaction component (e.g., fluorescent label) may reach an excited state in response to being illuminated by the excitation light. When in an excited state, the sample or reaction component may emit emission light, which may be detected by one or more photodetectors associated with the reaction chamber. FIG. 5-1B schematically illustrates the path of emission light (shown as the solid line) from a reaction chamber 5-108 to photodetector(s) 5-110 of pixel 5-112. The photodetector(s) 5-110 of pixel 5-112 may be configured and positioned to detect emission light from reaction chamber 5-108. Examples of suitable photodetectors are described in U.S. patent application Ser. No. 14/821,656, filed Aug. 7, 2015, titled "INTEGRATED DEVICE FOR TEMPORAL BINNING OF RECEIVED PHOTONS," which is hereby incorporated by reference in its entirety. For an individual pixel 5-112, a reaction chamber 5-108 and its respective photodetector(s) 5-110 may be aligned along a common axis (along the y-direction shown in FIG. 5-1B). In this manner, the photodetector(s) may overlap with the reaction chamber within a pixel 5-112.

The directionality of the emission light from a reaction chamber 5-108 may depend on the positioning of the sample in the reaction chamber 5-108 relative to metal layer(s) 5-116 because metal layer(s) 5-116 may act to reflect emission light. In this manner, a distance between metal layer(s) 5-116 and a fluorescent marker positioned in a reaction chamber 5-108 may impact the efficiency of photodetector(s) 5-110, that are in the same pixel as the reaction chamber, to detect the light emitted by the fluorescent marker. The distance between metal layer(s) 5-116 and the bottom surface of a reaction chamber 5-106, which is proximate to where a sample may be positioned during operation, may be in the range of 100 nm to 500 nm, or any value or range of values in that range. In some embodiments the distance between metal layer(s) 5-116 and the bottom surface of a reaction chamber 5-108 is approximately 300 nm.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a reaction chamber 5-108 and photodetector(s) may be in the range of 1 µm to 15 µm, or any value or range of values in that range.

Photonic structure(s) 5-230 may be positioned between reaction chambers 5-108 and photodetectors 5-110 and configured to reduce or prevent excitation light from reaching photodetectors 5-110, which may otherwise contribute to signal noise in detecting emission light. As shown in FIG. 5-1B, the one or more photonic structures 5-230 may be positioned between waveguide 5-220 and photodetectors 5-110. Photonic structure(s) 5-230 may include one or more optical rejection photonic structures including a spectral filter, a polarization filter, and a spatial filter. Photonic structure(s) 5-230 may be positioned to align with individual reaction chambers 5-108 and their respective photodetector(s) 5-110 along a common axis. Metal layers 5-240, which may act as a circuitry for integrated device 5-102, may also act as a spatial filter, in accordance with some embodiments. In such embodiments, one or more metal layers 5-240 may be positioned to block some or all excitation light from reaching photodetector(s) 5-110.

Coupling region 5-201 may include one or more optical components configured to couple excitation light from an external excitation source. Coupling region 5-201 may include grating coupler 5-216 positioned to receive some or all of a beam of excitation light. Examples of suitable grating couplers are described in U.S. patent application Ser. No. 15/844,403, filed Dec. 15, 2017, titled "OPTICAL COUPLER AND WAVEGUIDE SYSTEM," which is hereby incorporated by reference in its entirety. Grating coupler 5-216 may couple excitation light to waveguide 5-220, which may be configured to propagate excitation light to the proximity of one or more reaction chambers 5-108. Alternatively, coupling region 5-201 may comprise other well-known structures for coupling light into a waveguide.

Components located off of the integrated device may be used to position and align the excitation source 5-106 to the integrated device. Such components may include optical components including lenses, mirrors, prisms, windows, apertures, attenuators, and/or optical fibers. Additional mechanical components may be included in the instrument to allow for control of one or more alignment components. Such mechanical components may include actuators, stepper motors, and/or knobs. Examples of suitable excitation sources and alignment mechanisms are described in U.S. patent application Ser. No. 15/161,088, filed May 20, 2016, titled "PULSED LASER AND SYSTEM," which is hereby incorporated by reference in its entirety. Another example of a beam-steering module is described in U.S. patent application Ser. No. 15/842,720, filed Dec. 14, 2017, titled "COMPACT BEAM SHAPING AND STEERING ASSEMBLY," which is hereby incorporated herein by reference.

A sample to be analyzed may be introduced into reaction chamber 5-108 of pixel 5-112. The sample may be a biological sample or any other suitable sample, such as a chemical sample. In some cases, the suspension may include multiple molecules of interest and the reaction chamber may be configured to isolate a single molecule. In some instances, the dimensions of the reaction chamber may act to confine a single molecule within the reaction chamber, allowing measurements to be performed on the single molecule. Excitation light may be delivered into the reaction chamber 5-108, so as to excite the sample or at least one fluorescent marker attached to the sample or otherwise associated with the sample while it is within an illumination area within the reaction chamber 5-108.

In operation, parallel analyses of samples within the reaction chambers are carried out by exciting some or all of the samples within the reaction chambers using excitation light and detecting signals with the photodetectors that are representative of emission light from the reaction chambers. Emission light from a sample or reaction component (e.g., fluorescent label) may be detected by a corresponding photodetector and converted to at least one electrical signal. The electrical signals may be transmitted along conducting lines (e.g., metal layers 5-240) in the circuitry of the integrated device, which may be connected to an instrument interfaced with the integrated device. The electrical signals may be subsequently processed and/or analyzed. Processing or analyzing of electrical signals may occur on a suitable computing device either located on or off the instrument.

Instrument 5-104 may include a user interface for controlling operation of instrument 5-104 and/or integrated device 5-102. The user interface may be configured to allow a user to input information into the instrument, such as commands and/or settings used to control the functioning of the instrument. In some embodiments, the user interface may include buttons, switches, dials, and a microphone for voice commands. The user interface may allow a user to receive feedback on the performance of the instrument and/or integrated device, such as proper alignment and/or information obtained by readout signals from the photodetectors on the integrated device. In some embodiments, the user interface may provide feedback using a speaker to provide audible feedback. In some embodiments, the user interface may include indicator lights and/or a display screen for providing visual feedback to a user.

In some embodiments, instrument 5-104 may include a computer interface configured to connect with a computing device. Computer interface may be a USB interface, a FireWire interface, or any other suitable computer interface. Computing device may be any general purpose computer, such as a laptop or desktop computer. In some embodiments, computing device may be a server (e.g., cloud-based server) accessible over a wireless network via a suitable computer interface. The computer interface may facilitate communication of information between instrument 5-104 and the computing device. Input information for controlling and/or configuring the instrument 5-104 may be provided to the computing device and transmitted to instrument 5-104 via the computer interface. Output information generated by instrument 5-104 may be received by the computing device via the computer interface. Output information may include feedback about performance of instrument 5-104, performance of integrated device 5-112, and/or data generated from the readout signals of photodetector 5-110.

In some embodiments, instrument 5-104 may include a processing device configured to analyze data received from one or more photodetectors of integrated device 5-102 and/or transmit control signals to excitation source(s) 2-106. In some embodiments, the processing device may comprise a general purpose processor, a specially-adapted processor (e.g., a central processing unit (CPU) such as one or more microprocessor or microcontroller cores, a field-programmable gate array (FPGA), an application-specific integrated circuit (ASIC), a custom integrated circuit, a digital signal processor (DSP), or a combination thereof.) In some embodiments, the processing of data from one or more photodetectors may be performed by both a processing device of instrument 5-104 and an external computing device. In other embodiments, an external computing device may be omitted and processing of data from one or more photodetectors may be performed solely by a processing device of integrated device 5-102.

Referring to FIG. 5-1C, a portable, advanced analytic instrument 5-100 can comprise one or more pulsed optical sources 5-106 mounted as a replaceable module within, or otherwise coupled to, the instrument 5-100. The portable analytic instrument 5-100 can include an optical coupling system 5-115 and an analytic system 5-160. The optical coupling system 5-115 can include some combination of optical components (which may include, for example, none, one from among, or more than one component from among the following components: lens, mirror, optical filter, attenuator, beam-steering component, beam shaping component) and be configured to operate on and/or couple output optical pulses 5-122 from the pulsed optical source 5-106 to the analytic system 5-160. The analytic system 5-160 can include a plurality of components that are arranged to direct the optical pulses to at least one reaction chamber for sample analysis, receive one or more optical signals (e.g., fluorescence, backscattered radiation) from the at least one reaction chamber, and produce one or more electrical signals representative of the received optical signals. In some embodiments, the analytic system 5-160 can include one or more photodetectors and may also include signal-processing electronics (e.g., one or more microcontrollers, one or more field-programmable gate arrays, one or more microprocessors, one or more digital signal processors, logic gates, etc.) configured to process the electrical signals from the photodetectors. The analytic system 5-160 can also include data transmission hardware configured to transmit and receive data to and from external devices (e.g., one or more external devices on a network to which the instrument 5-100 can connect via one or more data communications links). In some embodiments, the analytic system 5-160 can be configured to receive a bio-optoelectronic chip 5-140, which holds one or more samples to be analyzed.

FIG. 5-1D depicts a further detailed example of a portable analytical instrument 5-100 that includes a compact pulsed optical source 5-108. In this example, the pulsed optical source 5-108 comprises a compact, passively mode-locked laser module 5-113. A passively mode-locked laser can produce optical pulses autonomously, without the application of an external pulsed signal. In some implementations, the module can be mounted to an instrument chassis or frame 5-103, and may be located inside an outer casing of the instrument. According to some embodiments, a pulsed optical source 5-106 can include additional components that can be used to operate the optical source and operate on an output beam from the optical source 5-106. A mode-locked laser 5-113 may comprise an element (e.g., saturable absorber, acousto-optic modulator, Kerr lens) in a laser cavity, or coupled to the laser cavity, that induces phase locking of the laser's longitudinal frequency modes. The laser cavity can be defined in part by cavity end mirrors 5-111, 5-119. Such locking of the frequency modes results in pulsed operation of the laser (e.g., an intracavity pulse 5-120 bounces back-and-forth between the cavity end mirrors) and produces a stream of output optical pulses 5-122 from one end mirror 5-111 which is partially transmitting.

In some cases, the analytic instrument 5-100 is configured to receive a removable, packaged, bio-optoelectronic or optoelectronic chip 5-140 (also referred to as a "disposable chip"). The disposable chip can include a bio-optoelectronic chip, for example, that comprises a plurality of reaction chambers, integrated optical components arranged to deliver optical excitation energy to the reaction chambers, and integrated photodetectors arranged to detect fluorescent emission from the reaction chambers. In some implementations, the chip 5-140 can be disposable after a single use, whereas in other implementations the chip 5-140 can be reused two or more times. When the chip 5-140 is received by the instrument 5-100, it can be in electrical and optical communication with the pulsed optical source 5-106 and with apparatus in the analytic system 5-160. Electrical communication may be made through electrical contacts on the chip package, for example.

In some embodiments and referring to FIG. 5-1D, the disposable chip 5-140 can be mounted (e.g., via a socket connection) on an electronic circuit board 5-130, such as a printed circuit board (PCB) that can include additional instrument electronics. For example, the PCB 5-130 can include circuitry configured to provide electrical power, one or more clock signals, and control signals to the optoelectronic chip 5-140, and signal-processing circuitry arranged to receive signals representative of fluorescent emission detected from the reaction chambers. Data returned from the optoelectronic chip can be processed in part or entirely by electronics on the instrument 5-100, although data may be transmitted via a network connection to one or more remote data processors, in some implementations. The PCB 5-130 can also include circuitry configured to receive feedback signals from the chip relating to optical coupling and power levels of the optical pulses 5-122 coupled into waveguides of the optoelectronic chip 5-140. The feedback signals can be provided to one or both of the pulsed optical source 5-106 and optical system 5-115 to control one or more parameters of the output beam of optical pulses 5-122. In some cases, the PCB 5-130 can provide or route power to the pulsed optical source 5-106 for operating the optical source and related circuitry in the optical source 5-106.

According to some embodiments, the pulsed optical source 5-106 comprises a compact mode-locked laser module 5-113. The mode-locked laser can comprise a gain medium 5-105 (which can be solid-state material in some embodiments), an output coupler 5-111, and a laser-cavity end mirror 5-119. The mode-locked laser's optical cavity can be bound by the output coupler 5-111 and end mirror 5-119. An optical axis 5-125 of the laser cavity can have one or more folds (turns) to increase the length of the laser cavity and provide a desired pulse repetition rate. The pulse repetition rate is determined by the length of the laser cavity (e.g., the time for an optical pulse to make a round-trip within the laser cavity).

In some embodiments, there can be additional optical elements (not shown in FIG. 5-1D) in the laser cavity for beam shaping, wavelength selection, and/or pulse forming. In some cases, the end mirror 5-119 comprises a saturable-absorber mirror (SAM) that induces passive mode locking of longitudinal cavity modes and results in pulsed operation of the mode-locked laser. The mode-locked laser module 5-113 can further include a pump source (e.g., a laser diode, not shown in FIG. 5-1D) for exciting the gain medium 5-105. Further details of a mode-locked laser module 5-113 can be found in U.S. patent application Ser. No. 15/844,469, titled "Compact Mode-Locked Laser Module," filed Dec. 15, 2017, each application of which is incorporated herein by reference.

When the laser 5-113 is mode locked, an intracavity pulse 5-120 can circulate between the end mirror 5-119 and the output coupler 5-111, and a portion of the intracavity pulse can be transmitted through the output coupler 5-111 as an output pulse 5-122. Accordingly, a train of output pulses 5-122, as depicted in the graph of FIG. 5-2, can be detected at the output coupler as the intracavity pulse 5-120 bounces back-and-forth between the output coupler 5-111 and end mirror 5-119 in the laser cavity.

FIG. 5-2 depicts temporal intensity profiles of the output pulses 5-122, though the illustration is not to scale. In some embodiments, the peak intensity values of the emitted pulses may be approximately equal, and the profiles may have a Gaussian temporal profile, though other profiles such as a sech2 profile may be possible. In some cases, the pulses may not have symmetric temporal profiles and may have other temporal shapes. The duration of each pulse may be characterized by a full-width-half-maximum (FWHM) value, as indicated in FIG. 5-2. According to some embodiments of a mode-locked laser, ultrashort optical pulses can have FWHM values less than 100 picoseconds (ps). In some cases, the FWHM values can be between approximately 5 ps and approximately 30 ps.

The output pulses 5-122 can be separated by regular intervals T. For example, T can be determined by a round-trip travel time between the output coupler 5-111 and cavity end mirror 5-119. According to some embodiments, the pulse-separation interval T can be between about 1 ns and about 30 ns. In some cases, the pulse-separation interval T can be between about 5 ns and about 20 ns, corresponding to a laser-cavity length (an approximate length of the optical axis 5-125 within the laser cavity) between about 0.7 meter and about 3 meters. In embodiments, the pulse-separation interval corresponds to a round trip travel time in the laser cavity, so that a cavity length of 3 meters (round-trip distance of 6 meters) provides a pulse-separation interval T of approximately 20 ns.

According to some embodiments, a desired pulse-separation interval T and laser-cavity length can be determined by a combination of the number of reaction chambers on the chip 5-140, fluorescent emission characteristics, and the speed of data-handling circuitry for reading data from the optoelectronic chip 5-140. In embodiments, different fluorophores can be distinguished by their different fluorescent decay rates or characteristic lifetimes. Accordingly, there needs to be a sufficient pulse-separation interval T to collect adequate statistics for the selected fluorophores to distinguish between their different decay rates. Additionally, if the pulse-separation interval T is too short, the data handling circuitry cannot keep up with the large amount of data being collected by the large number of reaction chambers. Pulse-separation interval T between about 5 ns and about 20 ns is suitable for fluorophores that have decay rates up to about 2 ns and for handling data from between about 60,000 and 10,000,000 reaction chambers.

According to some implementations, a beam-steering module 5-150 can receive output pulses from the pulsed optical source 5-106 and is configured to adjust at least the position and incident angles of the optical pulses onto an optical coupler (e.g., grating coupler) of the optoelectronic chip 5-140. In some cases, the output pulses 5-122 from the pulsed optical source 5-106 can be operated on by a beam-steering module 5-150 to additionally or alternatively change a beam shape and/or beam rotation at an optical coupler on the optoelectronic chip 5-140. In some implementations, the beam-steering module 5-150 can further provide focusing and/or polarization adjustments of the beam of output pulses onto the optical coupler. One example of a beam-steering module is described in U.S. patent application Ser. No. 15/161,088 titled "Pulsed Laser and Bioanalytic System," filed May 20, 2016, which is incorporated herein by reference. Another example of a beam-steering module is described in a separate U.S. patent application No. 62/435,679, filed Dec. 16, 2016 and titled "Compact Beam Shaping and Steering Assembly," which is incorporated herein by reference.

Referring to FIG. 5-3, the output pulses 5-122 from a pulsed optical source can be coupled into one or more optical waveguides 5-312 on a bio-optoelectronic chip 5-140, for example. In some embodiments, the optical pulses can be coupled to one or more waveguides via a grating coupler 5-310, though coupling to an end of one or more optical waveguides on the optoelectronic chip can be used in some embodiments. According to some embodiments, a quad detector 5-320 can be located on a semiconductor substrate 5-305 (e.g., a silicon substrate) for aiding in alignment of the beam of optical pulses 5-122 to a grating coupler 5-310. The one or more waveguides 5-312 and reaction chambers or reaction chambers 5-330 can be integrated on the same semiconductor substrate with intervening dielectric layers (e.g., silicon dioxide layers) between the substrate, waveguide, reaction chambers, and photodetectors 5-322.

Each waveguide 5-312 can include a tapered portion 5-315 below the reaction chambers 5-330 to equalize optical power coupled to the reaction chambers along the waveguide. The reducing taper can force more optical energy outside the waveguide's core, increasing coupling to the reaction chambers and compensating for optical losses along the waveguide, including losses for light coupling into the reaction chambers. A second grating coupler 5-317 can be located at an end of each waveguide to direct optical energy to an integrated photodiode 5-324. The integrated photodiode can detect an amount of power coupled down a waveguide and provide a detected signal to feedback circuitry that controls the beam-steering module 5-150, for example.

The reaction chambers 5-330 or reaction chambers 5-330 can be aligned with the tapered portion 5-315 of the waveguide and recessed in a tub 5-340. There can be photodetectors 5-322 located on the semiconductor substrate 5-305 for each reaction chamber 5-330. In some embodiments, a semiconductor absorber (shown in FIG. 5-5 as an optical filter 5-530) may be located between the waveguide and a photodetector 5-322 at each pixel. A metal coating and/or multilayer coating 5-350 can be formed around the reaction chambers and above the waveguide to prevent optical excitation of fluorophores that are not in the reaction chambers (e.g., dispersed in a solution above the reaction chambers). The metal coating and/or multilayer coating 5-350 may be raised beyond edges of the tub 5-340 to reduce absorptive losses of the optical energy in the waveguide 5-312 at the input and output ends of each waveguide.

There can be a plurality of rows of waveguides, reaction chambers, and time-binning photodetectors on the optoelectronic chip 5-140. For example, there can be 128 rows, each having 512 reaction chambers, for a total of 65,536 reaction chambers in some implementations. Other implementations may include fewer or more reaction chambers, and may include other layout configurations. Optical power from the pulsed optical source 5-106 can be distributed to the multiple waveguides via one or more star couplers or multimode interference couplers, or by any other means, located between an optical coupler 5-310 to the chip 5-140 and the plurality of waveguides 5-312.

FIG. 5-4 illustrates optical energy coupling from an optical pulse 5-122 within a tapered portion of waveguide 5-315 to a reaction chamber 5-330. The drawing has been produced from an electromagnetic field simulation of the optical wave that accounts for waveguide dimensions, reaction chamber dimensions, the different materials' optical properties, and the distance of the tapered portion of waveguide 5-315 from the reaction chamber 5-330. The waveguide can be formed from silicon nitride in a surrounding medium 5-410 of silicon dioxide, for example. The waveguide, surrounding medium, and reaction chamber can be formed by microfabrication processes described in U.S. application Ser. No. 14/821,688, filed Aug. 7, 2015, titled "Integrated Device for Probing, Detecting and Analyzing Molecules." According to some embodiments, an evanescent optical field 5-420 couples optical energy transported by the waveguide to the reaction chamber 5-330.

A non-limiting example of a biological reaction taking place in a reaction chamber 5-330 is depicted in FIG. 5-5. The example depicts sequential incorporation of nucleotides or nucleotide analogs into a growing strand that is complementary to a target nucleic acid. The sequential incorporation can take place in a reaction chamber 5-330, and can be detected by an advanced analytic instrument to sequence DNA. The reaction chamber can have a depth between about 150 nm and about 250 nm and a diameter between about 80 nm and about 160 nm. A metallization layer 5-540 (e.g., a metallization for an electrical reference potential) can be patterned above a photodetector 5-322 to provide an aperture or iris that blocks stray light from adjacent reaction chambers and other unwanted light sources. According to some embodiments, polymerase 5-520 can be located within the reaction chamber 5-330 (e.g., attached to a base of the chamber). The polymerase can take up a target nucleic acid 5-510 (e.g., a portion of nucleic acid derived from DNA), and sequence a growing strand of complementary nucleic acid to produce a growing strand of DNA 5-512. Nucleotides or nucleotide analogs labeled with different fluorophores can be dispersed in a solution above and within the reaction chamber.

Figures 1A, 5:
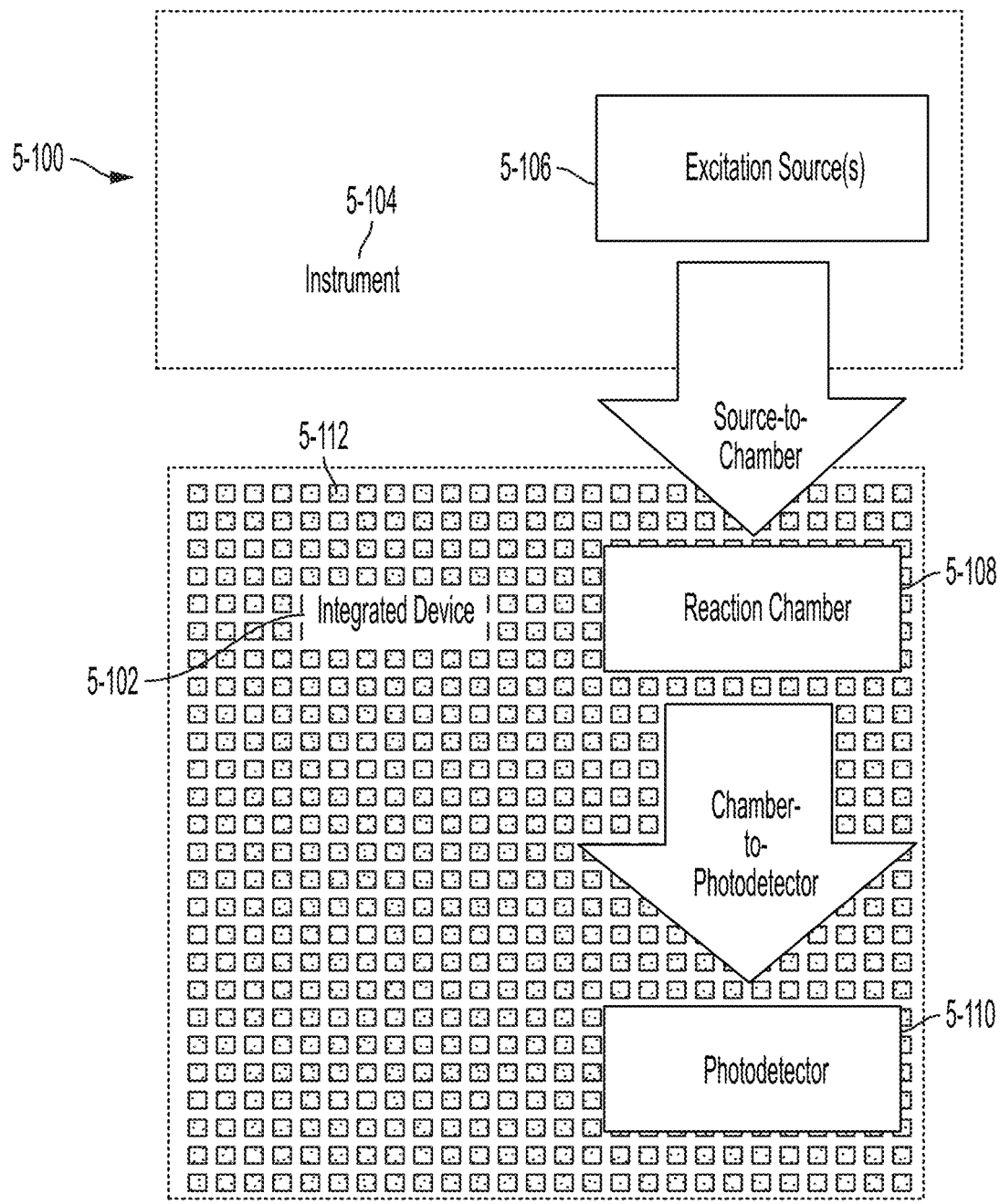
Figures 1B, 5:
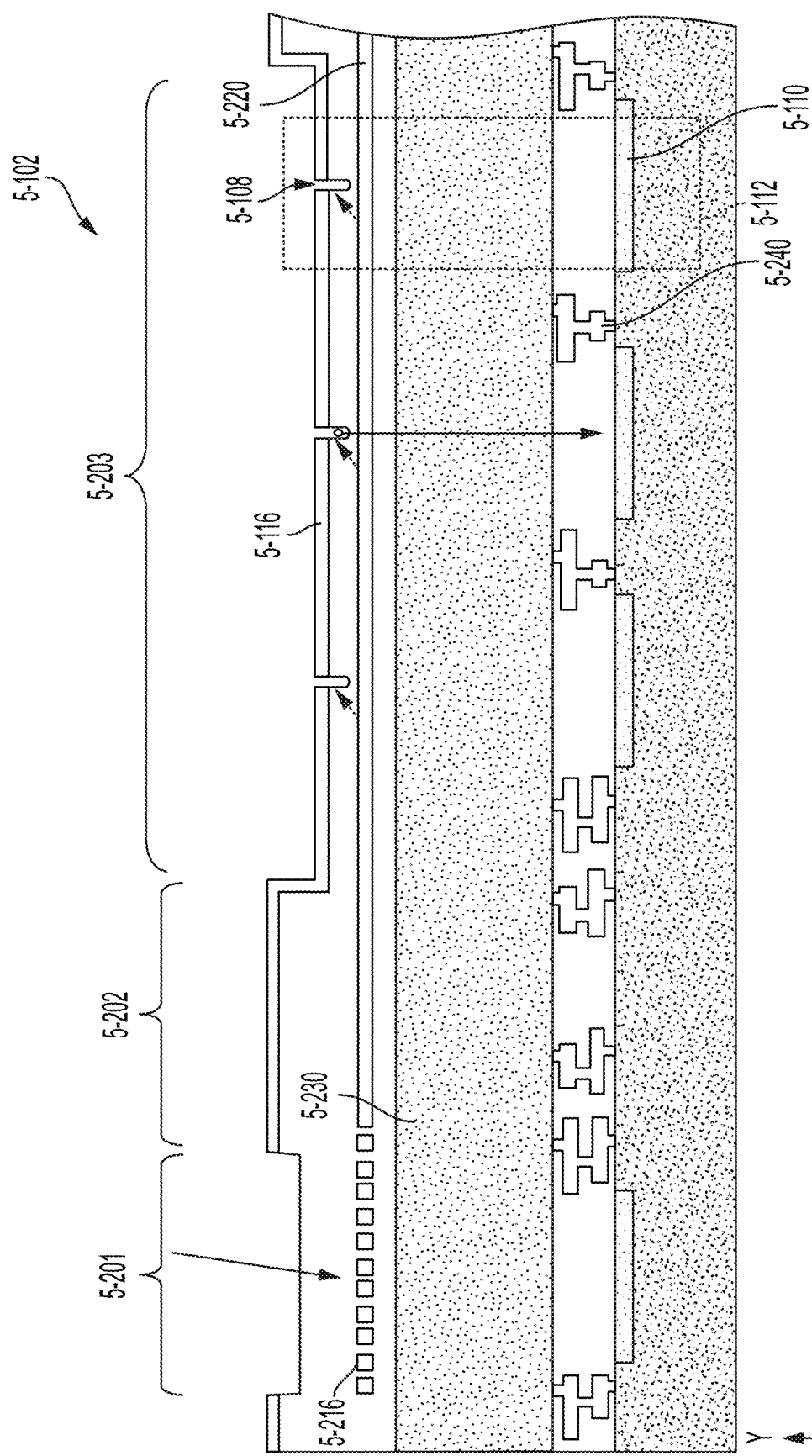
Figures 1C, 5:
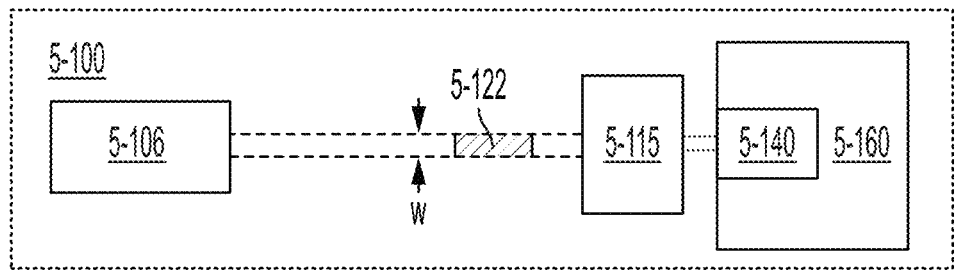
Figures 1D, 5:
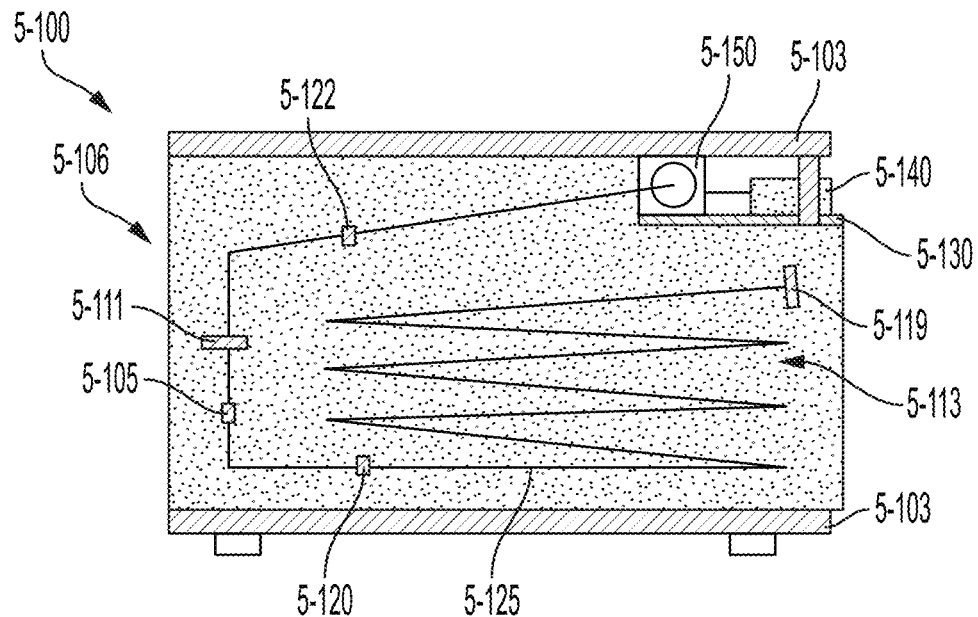
Figures 2, 5:
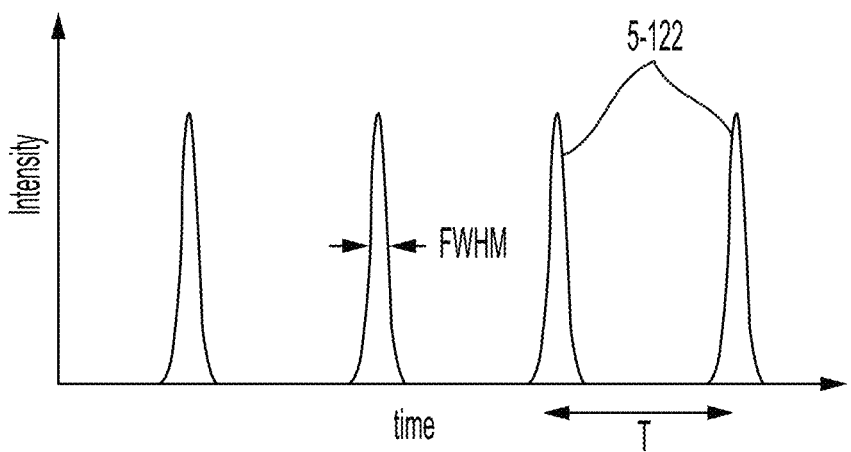
Figures 3, 5:
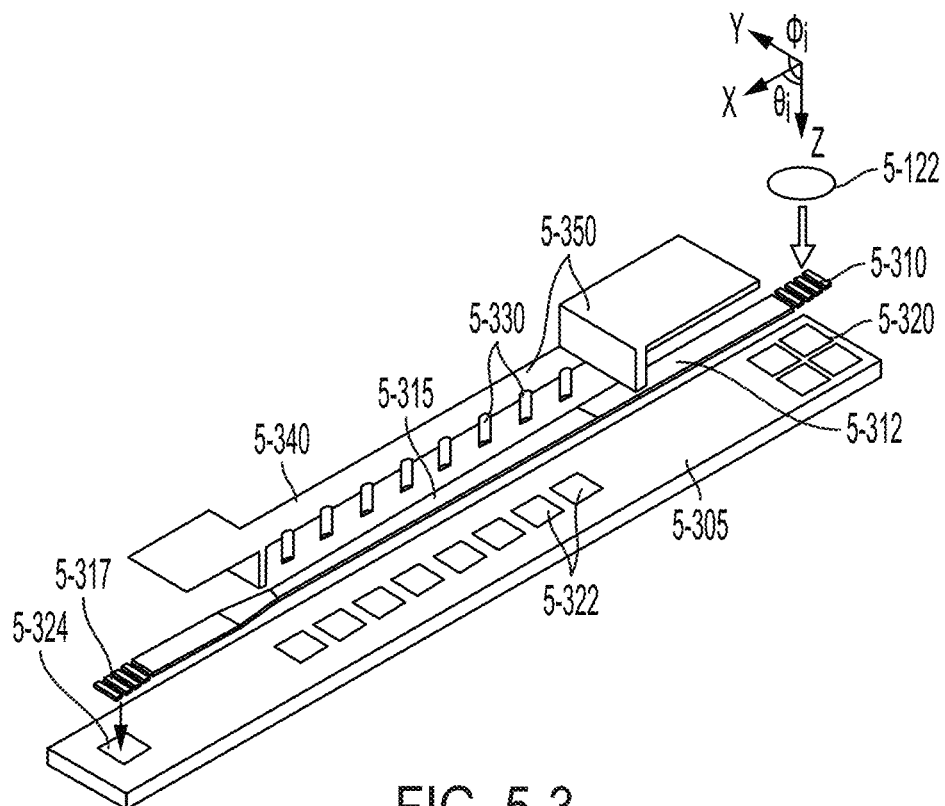
Figures 4, 5:
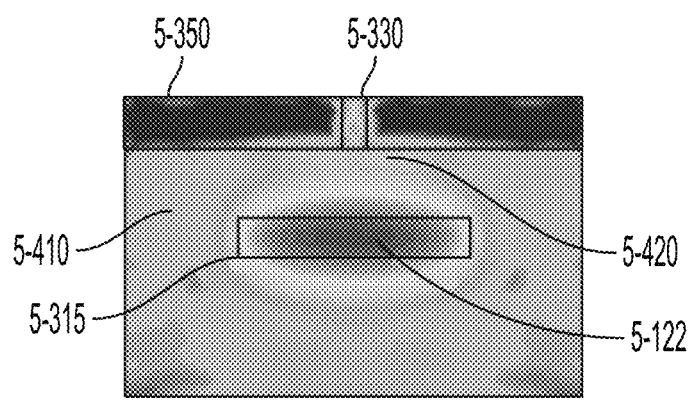
Figure 5:
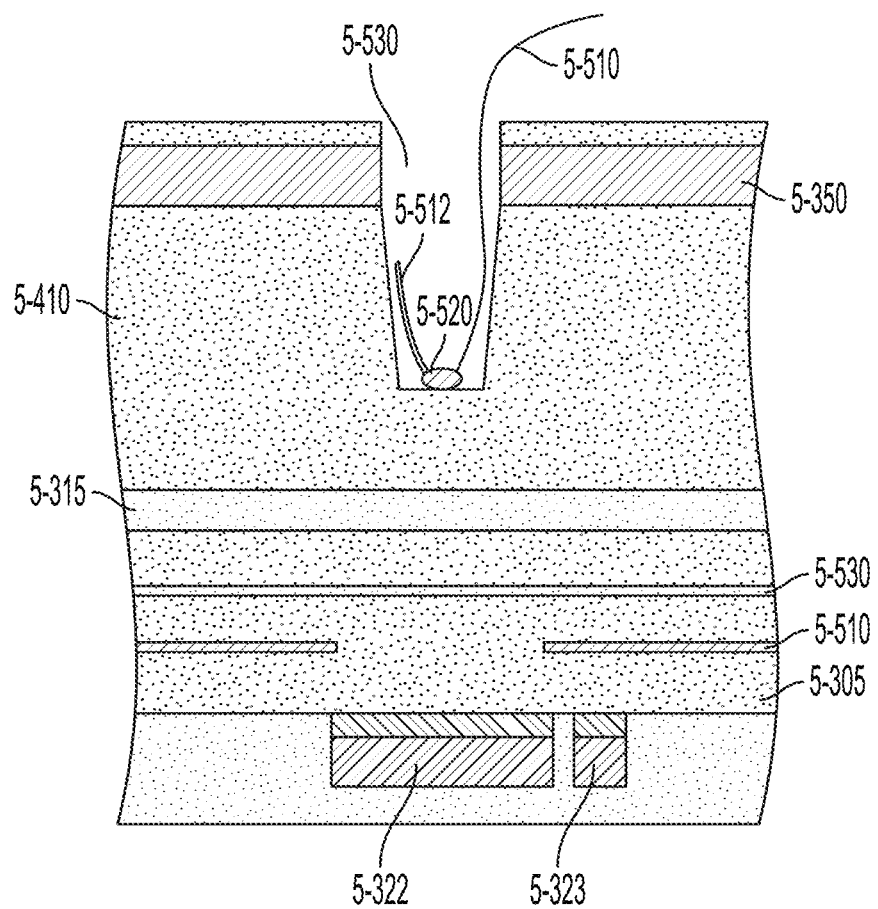
Figures 5, 6:
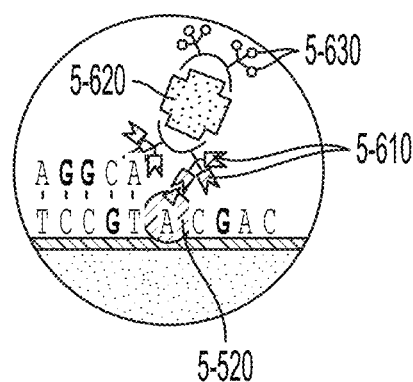

When a labeled nucleotide or nucleotide analog 5-610 is incorporated into a growing strand of complementary nucleic acid, as depicted in FIG. 5-6, one or more attached fluorophores 5-630 can be repeatedly excited by pulses of optical energy coupled into the reaction chamber 5-330 from the waveguide 5-315. In some embodiments, the fluorophore or fluorophores 5-630 can be attached to one or more nucleotides or nucleotide analogs 5-610 with any suitable linker 5-620. An incorporation event may last for a period of time up to about 100 ms. During this time, pulses of fluorescent emission resulting from excitation of the fluorophore(s) by pulses from the mode-locked laser can be detected with a time-binning photodetector 5-322, for example. In some embodiments, there can be one or more additional integrated electronic devices 5-323 at each pixel for signal handling (e.g., amplification, read-out, routing, signal preprocessing, etc.). According to some embodiments, each pixel can include at least one optical filter 5-530 (e.g., a semiconductor absorber) that passes fluorescent emission and reduces transmission of radiation from the excitation pulse. Some implementations may not use the optical filter 5-530. By attaching fluorophores with different emission characteristics (e.g., fluorescent decay rates, intensity, fluorescent wavelength, pulse duration, interpulse duration) to the different nucleotides (A,C,G,T), detecting and distinguishing the different emission characteristics while the strand of DNA 5-512 incorporates a nucleic acid and enables determination of the genetic sequence of the growing strand of DNA.

Figures 5, 6, 7:
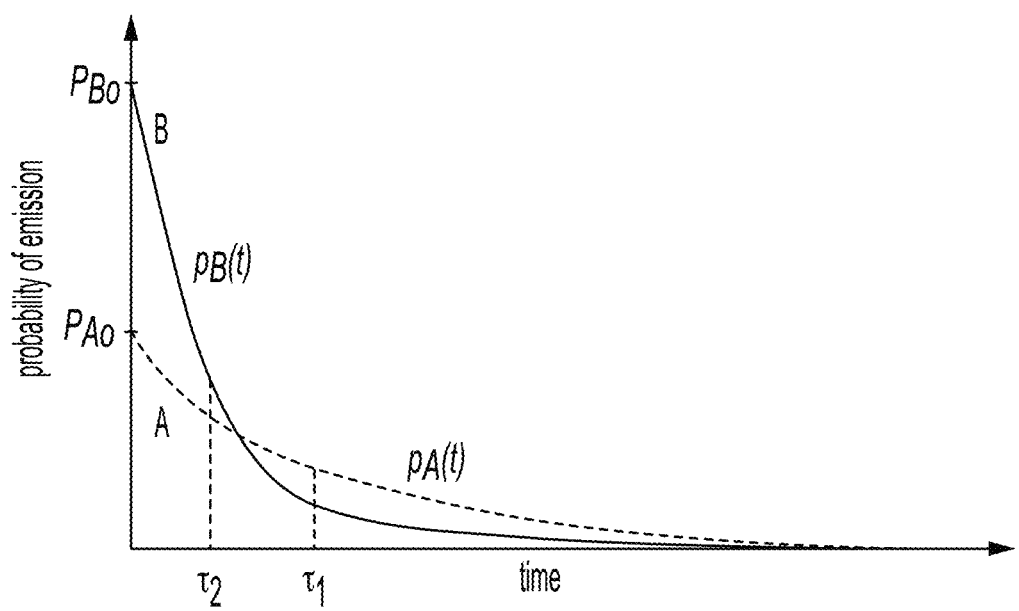
Figures 5, 6, 7, 8:
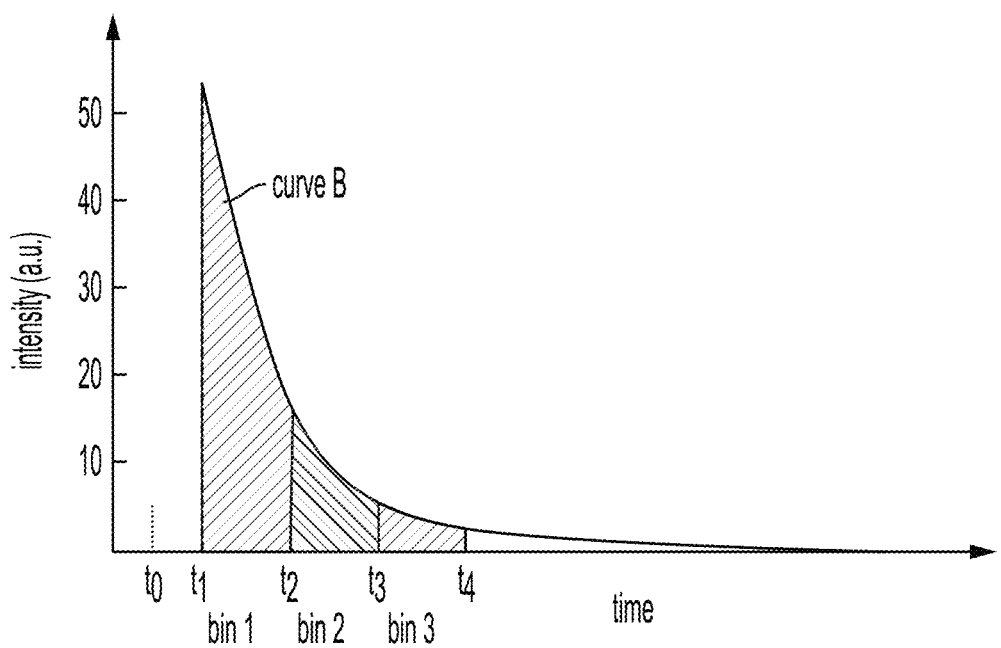
Figures 5, 6, 7, 8, 9:
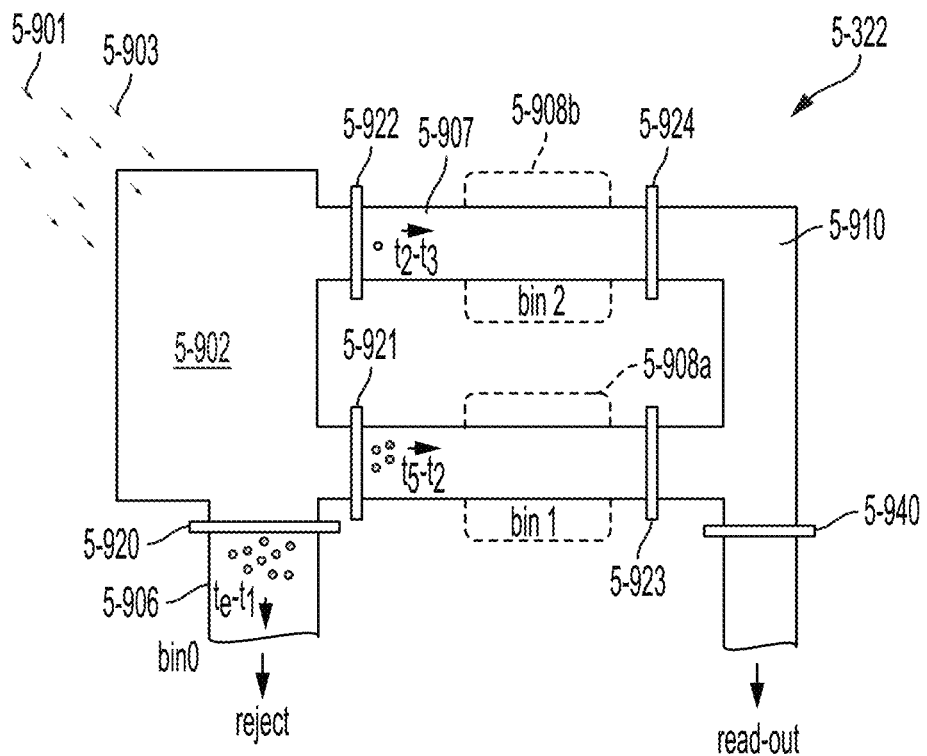
Figures 5, 6, 7, 8, 9, 10, 10A:
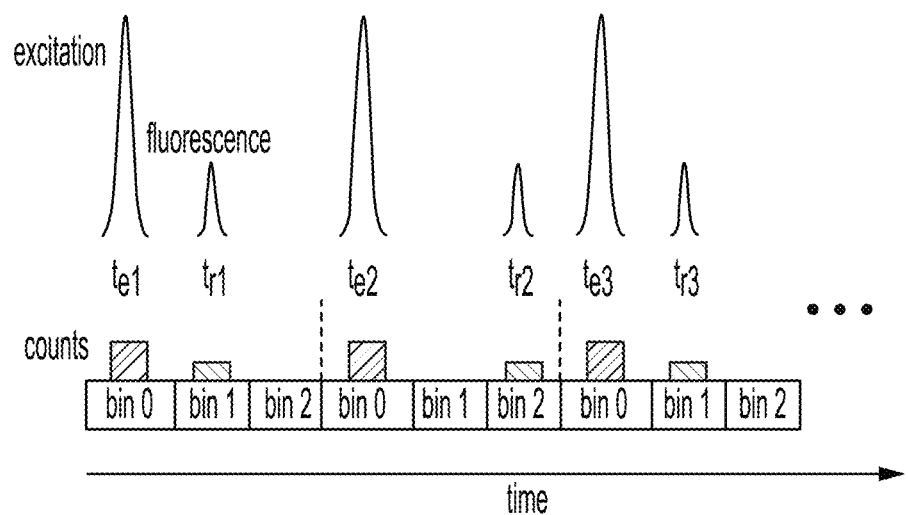
Figures 5, 6, 7, 8, 9, 10, 10B:
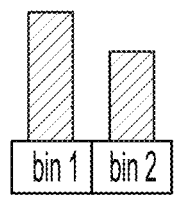
Figures 5, 6, 7, 8, 9, 10, 11, 11A:
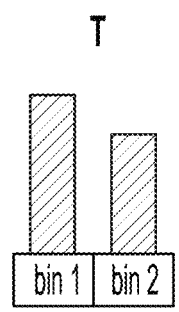
Figures 5, 6, 7, 8, 9, 10, 11, 11B:
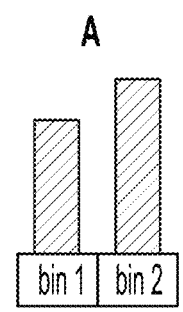
Figures 5, 6, 7, 8, 9, 10, 11, 11C:
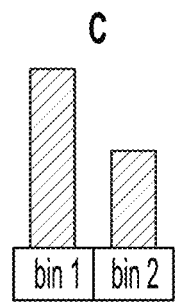
Figures 5, 6, 7, 8, 9, 10, 11, 11D:
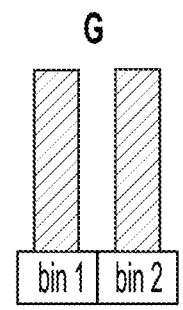
Figures 5, 6, 7, 8, 9, 10, 11, 12:
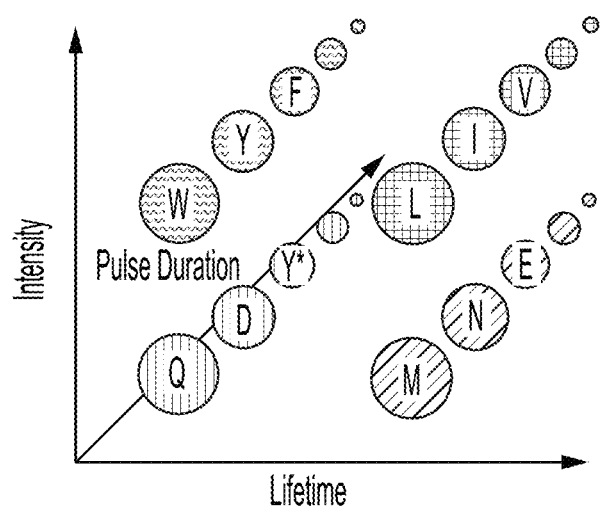
Figures 5, 6, 7, 8, 9, 10, 11, 12, 13:
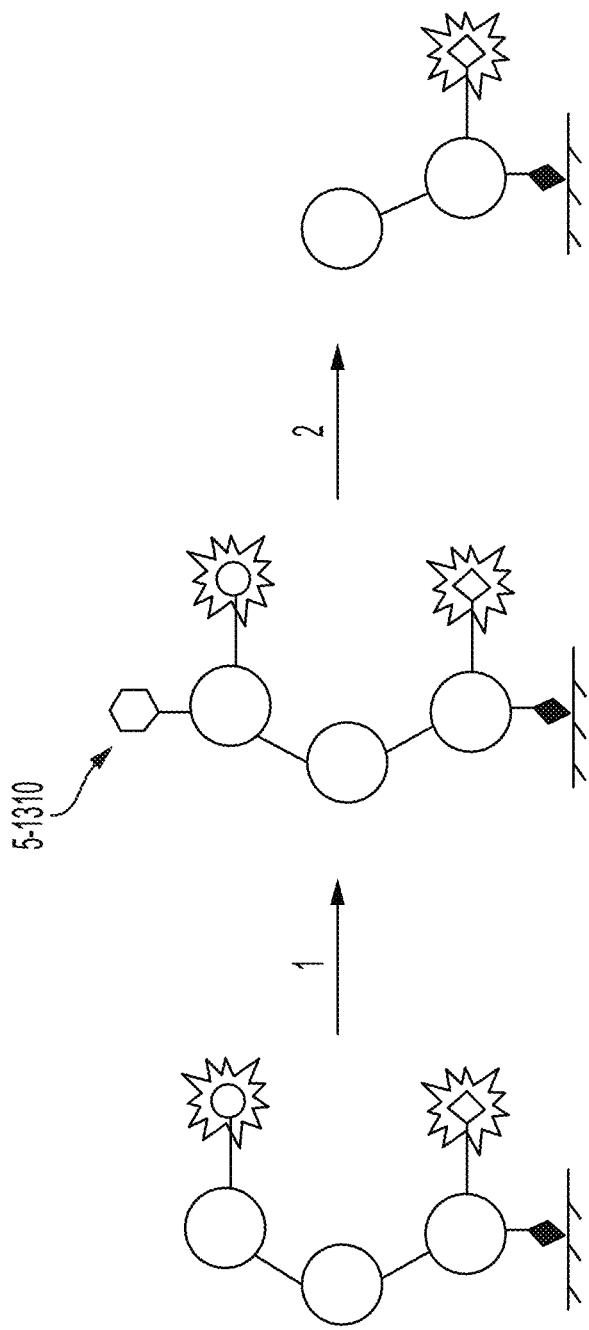
Figures 5, 6, 7, 8, 9, 10, 11, 12, 13, 14:
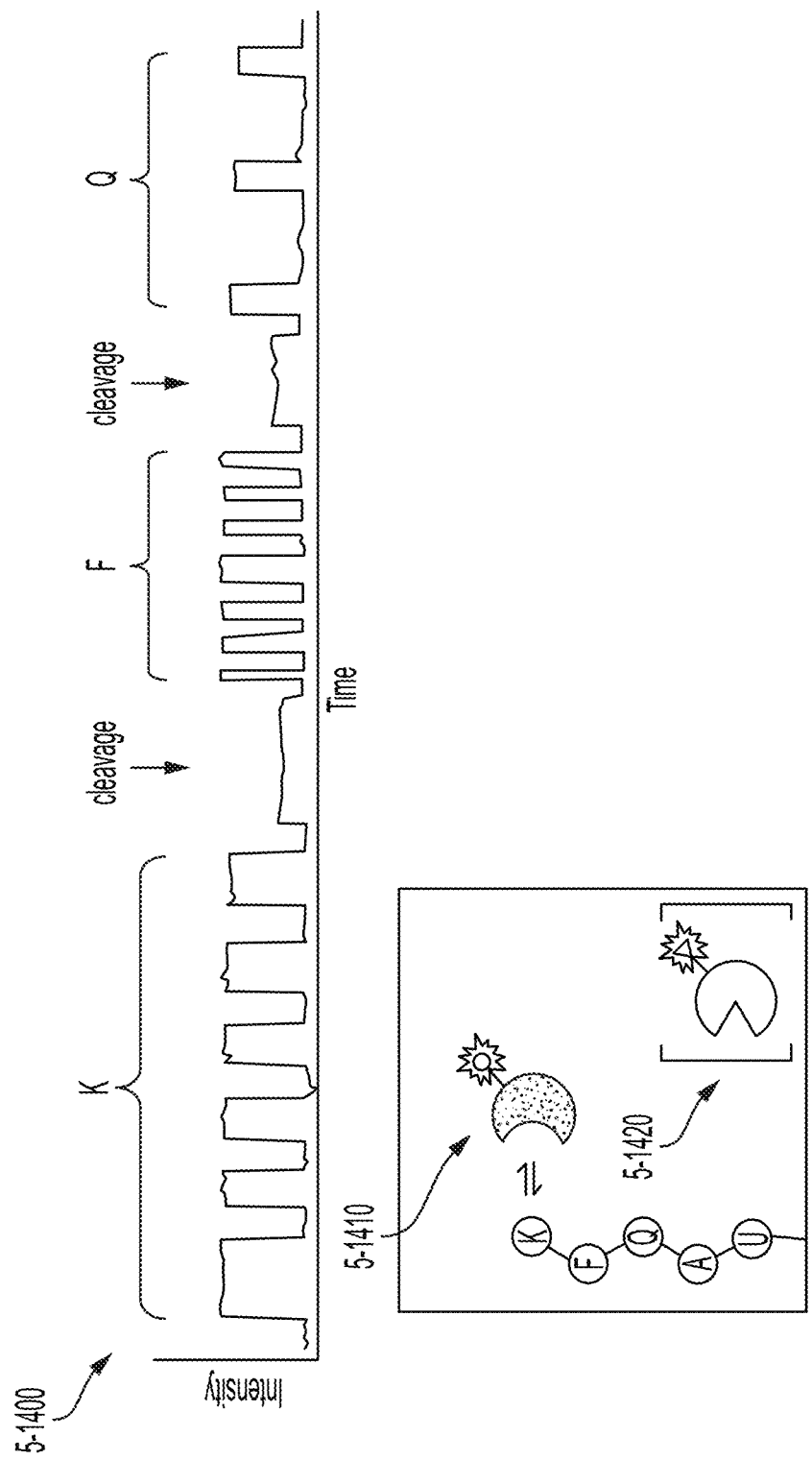

Techniques for time binning charge carriers generated by incident emission light to facilitate obtaining timing information of the emission light (e.g., fluorescent lifetime, pulse duration, interpulse duration) described herein, for example with respect to Sections III. And V may be applied to DNA and/or RNA sequencing applications. For example, according to some embodiments, an advanced analytic instrument 5-100 that is configured to analyze samples based on fluorescent emission characteristics can detect differences in fluorescent lifetimes and/or intensities between different fluorescent molecules, and/or differences between lifetimes and/or intensities of the same fluorescent molecules in different environments. By way of explanation, FIG. 5-7 plots two different fluorescent emission probability curves (A and B), which can be representative of fluorescent emission from two different fluorescent molecules, for example. With reference to curve A (dashed line), after being excited by a short or ultrashort optical pulse, a probability pA(t) of a fluorescent emission from a first molecule may decay with time, as depicted. In some cases, the decrease in the probability of a photon being emitted over time can be represented by an exponential decay function $p\_A(t) = P\_Ao \, e^{(-t/\tau\_1)}$, where PAo is an initial emission probability and $\tau 1$ is a temporal parameter associated with the first fluorescent molecule that characterizes the emission decay probability. $\tau 1$ may be referred to as the "fluorescence lifetime," "emission lifetime," or "lifetime" of the first fluorescent molecule. In some cases, the value of $\tau 1$ can be altered by a local environment of the fluorescent molecule. Other fluorescent molecules can have different emission characteristics than that shown in curve A. For example, another fluorescent molecule can have a decay profile that differs from a single exponential decay, and its lifetime can be characterized by a half-life value or some other metric.

A second fluorescent molecule may have a decay profile pB(t) that is exponential, but has a measurably different lifetime $\tau 2$, as depicted for curve B in FIG. 5-7. In the example shown, the lifetime for the second fluorescent molecule of curve B is shorter than the lifetime for curve A, and the probability of emission pB(t) is higher sooner after excitation of the second molecule than for curve A. Different fluorescent molecules can have lifetimes or half-life values ranging from about 0.1 ns to about 20 ns, in some embodiments.

Differences in fluorescent emission lifetimes can be used to discern between the presence or absence of different fluorescent molecules and/or to discern between different environments or conditions to which a fluorescent molecule is subjected. In some cases, discerning fluorescent molecules based on lifetime (rather than emission wavelength, for example) can simplify aspects of an analytical instrument 5-100. As an example, wavelength-discriminating optics (such as wavelength filters, dedicated detectors for each wavelength, dedicated pulsed optical sources at different wavelengths, and/or diffractive optics) can be reduced in number or eliminated when discerning fluorescent molecules based on lifetime. In some cases, a single pulsed optical source operating at a single characteristic wavelength can be used to excite different fluorescent molecules that emit within a same wavelength region of the optical spectrum but have measurably different lifetimes. An analytic system that uses a single pulsed optical source, rather than multiple sources operating at different wavelengths, to excite and discern different fluorescent molecules emitting in a same wavelength region can be less complex to operate and maintain, more compact, and can be manufactured at lower cost.

Although analytic systems based on fluorescent lifetime analysis can have certain benefits, the amount of information obtained by an analytic system and/or detection accuracy can be increased by allowing for additional detection techniques. For example, some analytic systems 5-160 can additionally be configured to discern one or more properties of a sample based on fluorescent wavelength, pulse duration/width, interpulse duration, and/or fluorescent intensity as described herein.

Referring again to FIG. 5-7, according to some embodiments, different fluorescent lifetimes can be distinguished with a photodetector that is configured to time-bin fluorescent emission events following excitation of a fluorescent molecule. The time binning can occur during a single charge-accumulation cycle for the photodetector. A charge-accumulation cycle is an interval between read-out events during which photo-generated carriers are accumulated in bins of the time-binning photodetector. The concept of determining fluorescent lifetime by time-binning of emission events is introduced graphically in FIG. 5-8. At time $t_e$ just prior to $t_1$, a fluorescent molecule or ensemble of fluorescent molecules of a same type (e.g., the type corresponding to curve B of FIG. 5-7) is (are) excited by a short or ultrashort optical pulse. For a large ensemble of molecules, the intensity of emission can have a time profile similar to curve B, as depicted in FIG. 5-8.

For a single molecule or a small number of molecules, however, the emission of fluorescent photons occurs according to the statistics of curve B in FIG. 5-7, for this example. A time-binning photodetector 5-322 can accumulate carriers generated from emission events into discrete time bins. Three bins are indicated in FIG. 5-8, though fewer bins or more bins may be used in embodiments. The bins are temporally resolved with respect to the excitation time $t_e$ of the fluorescent molecule(s). For example, a first bin can accumulate carriers produced during an interval between times $t_1$ and $t_2$, occurring after the excitation event at time $t_e$. A second bin can accumulate carriers produced during an interval between times $t_2$ and $t_3$, and a third bin can accumulate carriers produced during an interval between times $t_3$ and $t_4$. When a large number of emission events are summed, carriers accumulated in the time bins can approximate the decaying intensity curve shown in FIG. 5-8, and the binned signals can be used to distinguish between different fluorescent molecules or different environments in which a fluorescent molecule is located.

Examples of a time-binning photodetector 5-322 are described in U.S. patent application Ser. No. 14/821,656, filed Aug. 7, 2015, titled "Integrated Device for Temporal Binning of Received Photons" and in U.S. patent application Ser. No. 15/852,571, filed Dec. 22, 2017, titled "Integrated Photodetector with Direct Binning Pixel," which are both incorporated herein by reference in their entirety. For explanation purposes, a non-limiting embodiment of a time-binning photodetector is depicted in FIG. 5-9. A single time-binning photodetector 5-322 can comprise a photon-absorption/carrier-generation region 5-902, a carrier-discharge channel 5-906, and a plurality of carrier-storage regions 5-908a, 5-908b all formed on a semiconductor substrate. Carrier-transport channels 5-907 can connect between the photon-absorption/carrier-generation region 5-902 and carrier-storage regions 5-908a, 5-908b. In the illustrated example, two carrier-storage regions are shown, but there may be more or fewer. There can be a read-out channel 5-910 connected to the carrier-storage regions. The photon-absorption/carrier-generation region 5-902, carrier-discharge channel 5-906, carrier-storage regions 5-908a, 5-908b, and read-out channel 5-910 can be formed by doping the semiconductor locally and/or forming adjacent insulating regions to provide photodetection capability, confinement, and transport of carriers. A time-binning photodetector 5-322 can also include a plurality of electrodes 5-920, 5-921, 5-922, 5-923, 5-924 formed on the substrate that are configured to generate electric fields in the device for transporting carriers through the device.

In operation, a portion of an excitation pulse 5-122 from a pulsed optical source 5-106 (e.g., a mode-locked laser) is delivered to a reaction chamber 5-330 over the time-binning photodetector 5-322. Initially, some excitation radiation photons 5-901 may arrive at the photon-absorption/carrier-generation region 5-902 and produce carriers (shown as light-shaded circles). There can also be some fluorescent emission photons 5-903 that arrive with the excitation radiation photons 5-901 and produce corresponding carriers (shown as dark-shaded circles). Initially, the number of carriers produced by the excitation radiation can be too large compared to the number of carriers produced by the fluorescent emission. The initial carriers produced during a time interval $|t_e-t_1|$ can be rejected by gating them into a carrier-discharge channel 5-906 with a first transfer gate 5-920, for example.

At a later times mostly fluorescent emission photons 5-903 arrive at the photon-absorption/carrier-generation region 5-902 and produce carriers (indicated a dark-shaded circles) that provide useful and detectable signal that is representative of fluorescent emission from the reaction chamber 5-330. According to some detection methods, a second electrode 5-921 and third electrode 5-923 can be gated at a later time to direct carriers produced at a later time (e.g., during a second time interval $|t_1-t_2|$) to a first carrier-storage region 5-908a. Subsequently, a fourth electrode 5-922 and fifth electrode 5-924 can be gated at a later time (e.g., during a third time interval $|t_2-t_3|$) to direct carriers to a second carrier-storage region 5-908b. Charge accumulation can continue in this manner after excitation pulses for a large number of excitation pulses to accumulate an appreciable number of carriers and signal level in each carrier-storage region 5-908a, 5-908b. At a later time, the signal can be read out from the bins. In some implementations, the time intervals corresponding to each storage region are at the sub-nanosecond time scale, though longer time scales can be used in some embodiments (e.g., in embodiments where fluorophores have longer decay times).

The process of generating and time-binning carriers after an excitation event (e.g., excitation pulse from a pulsed optical source) can occur once after a single excitation pulse or be repeated multiple times after multiple excitation pulses during a single charge-accumulation cycle for the time-binning photodetector 5-322. After charge accumulation is complete, carriers can be read out of the storage regions via the read-out channel 5-910. For example, an appropriate biasing sequence can be applied to electrodes 5-923, 5-924 and at least to electrode 5-940 to remove carriers from the storage regions 5-908a, 5-908b. The charge accumulation and read-out processes can occur in a massively parallel operation on the optoelectronic chip 5-140 resulting in frames of data.

Although the described example in connection with FIG. 5-9 includes multiple charge storage regions 5-908a, 5-908b in some cases a single charge storage region may be used instead. For example, only bin1 may be present in a time-binning photodetector 5-322. In such a case, a single storage regions 5-908a can be operated in a variable time-gated manner to look at different time intervals after different excitation events. For example, after pulses in a first series of excitation pulses, electrodes for the storage region 5-908a can be gated to collect carriers generated during a first time interval (e.g., during the second time interval $|t_1-t_2|$), and the accumulated signal can be read out after a first predetermined number of pulses. After pulses in a subsequent series of excitation pulses at the same reaction chamber, the same electrodes for the storage region 5-908a can be gated to collect carriers generated during a different interval (e.g., during the third time interval $|t_2-t_3|$), and the accumulated signal can be read out after a second predetermined number of pulses. Carriers could be collected during later time intervals in a similar manner if needed. In this manner, signal levels corresponding to fluorescent emission during different time periods after arrival of an excitation pulse at a reaction chamber can be produced using a single carrier-storage region.

Regardless of how charge accumulation is carried out for different time intervals after excitation, signals that are read out can provide a histogram of bins that are representative of the fluorescent emission decay characteristics, for example. An example process is illustrated in FIG. 5-10A and FIG. 5-10B, for which two charge-storage regions are used to acquire fluorescent emission from the reaction chambers. The histogram's bins can indicate a number of photons detected during each time interval after excitation of the fluorophore(s) in a reaction chamber 5-330. In some embodiments, signals for the bins will be accumulated following a large number of excitation pulses, as depicted in FIG. 5-10A. The excitation pulses can occur at times $t_{e1}$, $t_{e2}$, $t_{e3}$, $t_{eN}$ which are separated by the pulse interval time T. In some cases, there can be between 105 and 107 excitation pulses 5-122 (or portions thereof) applied to a reaction chamber during an accumulation of signals in the electron-storage regions for a single event being observed in the reaction chamber (e.g., a single nucleotide incorporation event in DNA analysis). In some embodiments, one bin (bin 0) can be configured to detect an amplitude of excitation energy delivered with each optical pulse, and may be used as a reference signal (e.g., to normalize data). In other cases, the excitation pulse amplitude may be stable, determined one or more times during signal acquisition, and not determined after each excitation pulse so that there is no bin0 signal acquisition after each excitation pulse. In such cases, carriers produced by an excitation pulse can be rejected and dumped from the photon-absorption/carrier-generation region 5-902 as described above in connection with FIG. 5-9.

In some implementations, only a single photon may be emitted from a fluorophore following an excitation event, as depicted in FIG. 5-10A. After a first excitation event at time $t_{e1}$, the emitted photon at time $t_{f1}$ may occur within a first time interval (e.g., between times $t_1$ and $t_2$), so that the resulting electron signal is accumulated in the first electron-storage region (contributes to bin 1). In a subsequent excitation event at time $t_{e2}$, the emitted photon at time $t_{f2}$ may occur within a second time interval (e.g., between times $t_2$ and $t_3$), so that the resulting electron signal contributes to bin 2. After a next excitation event at time $t_{e3}$, a photon may emit at a time $t_{f3}$ occurring within the first time interval.

In some implementations, there may not be a fluorescent photon emitted and/or detected after each excitation pulse received at a reaction chamber 5-330. In some cases, there can be as few as one fluorescent photon that is detected at a reaction chamber for every 10,000 excitation pulses delivered to the reaction chamber. One advantage of implementing a mode-locked laser 5-113 as the pulsed excitation source 5-106 is that a mode-locked laser can produce short optical pulses having high intensity and quick turn-off times at high pulse-repetition rates (e.g., between 50 MHz and 250 MHz). With such high pulse-repetition rates, the number of excitation pulses within a 10 millisecond charge-accumulation interval can be 50,000 to 250,000, so that detectable signal can be accumulated.

After a large number of excitation events and carrier accumulations, the carrier-storage regions of the time-binning photodetector 5-322 can be read out to provide a multi-valued signal (e.g., a histogram of two or more values, an N-dimensional vector, etc.) for a reaction chamber. The signal values for each bin can depend upon the decay rate of the fluorophore. For example and referring again to FIG. 5-8, a fluorophore having a decay curve B will have a higher ratio of signal in bin 1 to bin 2 than a fluorophore having a decay curve A. The values from the bins can be analyzed and compared against calibration values, and/or each other, to determine the particular fluorophore present. For a sequencing application, identifying the fluorophore can determine the nucleotide or nucleotide analog that is being incorporated into a growing strand of DNA, for example. For other applications, identifying the fluorophore can determine an identity of a molecule or specimen of interest, which may be linked to the fluorophore.

To further aid in understanding the signal analysis, the accumulated, multi-bin values can be plotted as a histogram, as depicted in FIG. 5-10B for example, or can be recorded as a vector or location in N-dimensional space. Calibration runs can be performed separately to acquire calibration values for the multi-valued signals (e.g., calibration histograms) for four different fluorophores linked to the four nucleotides or nucleotide analogs. As an example, the calibration histograms may appear as depicted in FIG. 5-11A (fluorescent label associated with the T nucleotide), FIG. 5-11B (fluorescent label associated with the A nucleotide), FIG. 5-11C (fluorescent label associated with the C nucleotide), and FIG. 5-11D (fluorescent label associated with the G nucleotide). A comparison of the measured multi-valued signal (corresponding to the histogram of FIG. 5-10B) to the calibration multi-valued signals can determine the identity "T" (FIG. 5-11A) of the nucleotide or nucleotide analog being incorporated into the growing strand of DNA.

In some implementations, fluorescent intensity can be used additionally or alternatively to distinguish between different fluorophores. For example, some fluorophores may emit at significantly different intensities or have a significant difference in their probabilities of excitation (e.g., at least a difference of about 35%) even though their decay rates may be similar. By referencing binned signals (bins 5-3) to measured excitation energy and/or other acquired signals, it can be possible to distinguish different fluorophores based on intensity levels.

In some embodiments, different numbers of fluorophores of the same type can be linked to different nucleotides or nucleotide analogs, so that the nucleotides can be identified based on fluorophore intensity. For example, two fluorophores can be linked to a first nucleotide (e.g., "C") or nucleotide analog and four or more fluorophores can be linked to a second nucleotide (e.g., "T") or nucleotide analog. Because of the different numbers of fluorophores, there may be different excitation and fluorophore emission probabilities associated with the different nucleotides. For example, there may be more emission events for the "T" nucleotide or nucleotide analog during a signal accumulation interval, so that the apparent intensity of the bins is significantly higher than for the "C" nucleotide or nucleotide analog.

Distinguishing nucleotides or any other biological or chemical specimens based on fluorophore decay rates and/or fluorophore intensities enables a simplification of the optical excitation and detection systems in an analytical instrument 5-100. For example, optical excitation can be performed with a single-wavelength source (e.g., a source producing one characteristic wavelength rather than multiple sources or a source operating at multiple different characteristic wavelengths). Additionally, wavelength-discriminating optics and filters may not be needed in the detection system to distinguish between fluorophores of different wavelengths. Also, a single photodetector can be used for each reaction chamber to detect emission from different fluorophores. However, in some embodiments, it may be advantageous to add additional dimensions of discrimination for identifying a particular molecule by using multiple of intensity, lifetime, wavelength, pulse duration and/or interpulse duration to distinguish a sample.

The phrase "characteristic wavelength" or "wavelength" is used to refer to a central or predominant wavelength within a limited bandwidth of radiation (e.g., a central or peak wavelength within a 20 nm bandwidth output by a pulsed optical source). In some cases, "characteristic wavelength" or "wavelength" may be used to refer to a peak wavelength within a total bandwidth of radiation output by a source.

Fluorophores having emission wavelengths in a range between about 560 nm and about 900 nm can provide adequate amounts of fluorescence to be detected by a time-binning photodetector (which can be fabricated on a silicon wafer using CMOS processes). These fluorophores can be linked to biological molecules of interest, such as nucleotides or nucleotide analogs for genetic sequencing applications. Fluorescent emission in this wavelength range can be detected with higher responsivity in a silicon-based photodetector than fluorescence at longer wavelengths. Additionally, fluorophores and associated linkers in this wavelength range may not interfere with incorporation of the nucleotides or nucleotide analogs into growing strands of DNA. In some implementations, fluorophores having emission wavelengths in a range between about 560 nm and about 660 nm can be optically excited with a single-wavelength source. An example fluorophore in this range is Alexa Fluor 647, available from Thermo Fisher Scientific Inc. of Waltham, Mass. Excitation energy at shorter wavelengths (e.g., between about 500 nm and about 650 nm) may be used to excite fluorophores that emit at wavelengths between about 560 nm and about 900 nm. In some embodiments, the time-binning photodetectors can efficiently detect longer-wavelength emission from the reaction chambers, e.g., by incorporating other materials, such as Ge, into the photodetectors' active regions.

b. Protein Sequencing Applications

Some aspects of the present disclosure may be useful for protein sequencing. For example, some aspects of the present disclosure are useful for determining amino acid sequence information from polypeptides (e.g., for sequencing one or more polypeptides) such as by applying the multi-dimensional discrimination techniques using wavelength, lifetime, intensity, pulse duration and/or interpulse duration measurements to identify a particular sample. In some embodiments, amino acid sequence information can be determined for single polypeptide molecules. In some embodiments, one or more amino acids of a polypeptide are labeled (e.g., directly or indirectly) and the relative positions of the labeled amino acids in the polypeptide are determined. In some embodiments, the relative positions of amino acids in a protein are determined using a series of amino acid labeling and cleavage steps. In particular, the multi-dimensional discrimination techniques described herein may be implemented with the protein sequencing methods described in U.S. patent application Ser. No. 16/686,028 titled "METHODS AND COMPOSITIONS FOR PROTEIN SEQUENCING," filed Nov. 15, 2019 and PCT Application No. PCT/US19/61831 titled "METHODS AND COMPOSITIONS FOR PROTEIN SEQUENCING," filed Nov. 15, 2019, both which are hereby incorporated by reference in their entireties For example, FIG. 5-12 illustrates an example graph illustrating a three-dimensional discrimination technique for identifying amino acids. The inventors have recognized that it is possible to identify individual amino acids based at least one the characteristic intensity, pulse duration, and lifetime measurements. In particular, by obtaining measurements of intensity, pulse duration, and lifetime of emitted light from a fluorescent marker, the obtained measurements can be compared to known measurements to determine the most likely fluorescent marker from which the emission light came from. By identifying a particular fluorescent marker, the amino acid to which the marker is attached can then be known. Using three dimensions of discrimination, in particular, intensity, pulse duration, and lifetime, it is possible to identify all twenty standard genetic amino acids as well as post-translational modifications. Although in the illustrated embodiment, a three-dimensional discrimination technique is illustrated for identifying particular amino acids, the inventors have appreciated that any of the multi-dimensional techniques may be applied to protein sequencing application, including two-dimensional, four-dimensional, and/or five-dimensional techniques. In addition, although, in the illustrated embodiments, the three-dimensional discrimination technique is shown using measurements of intensity, lifetime, and pulse duration, it should be appreciated that other suitable combinations may be implemented in the multi-dimensional techniques described herein, for example, any of intensity, lifetime, wavelength, pulse duration and/or interpulse duration.

In some embodiments, the identity of a terminal amino acid (e.g., an N-terminal or a C-terminal amino acid) is assessed, after which the terminal amino acid is removed and the identity of the next amino acid at the terminus is assessed, and this process is repeated until a plurality of successive amino acids in the polypeptide are assessed. In some embodiments, assessing the identity of an amino acid comprises determining the type of amino acid that is present. In some embodiments, determining the type of amino acid comprises determining the actual amino acid identity, for example by determining which of the naturally-occurring 20 amino acids is the terminal amino acid is (e.g., using a recognition molecule that is specific for an individual terminal amino acid). However, in some embodiments assessing the identity of a terminal amino acid type can comprise determining a subset of potential amino acids that can be present at the terminus of the polypeptide. In some embodiments, this can be accomplished by determining that an amino acid is not one or more specific amino acids (and therefore could be any of the other amino acids). In some embodiments, this can be accomplished by determining which of a specified subset of amino acids (e.g., based on size, charge, hydrophobicity, binding properties) could be at the terminus of the polypeptide (e.g., using a recognition molecule that binds to a specified subset of two or more terminal amino acids).

Amino acids of a polypeptide can be indirectly labeled, for example, using amino acid recognition molecules that selectively bind one or more types of amino acids on the polypeptide. Amino acids of a polypeptide can be directly labeled, for example, by selectively modifying one or more types of amino acid side chains on the polypeptide with uniquely identifiable labels. Methods of selective labeling of amino acid side chains and details relating to the preparation and analysis of labeled polypeptides are known in the art (see, e.g., Swaminathan, et al. PLoS Comput Biol. 2015, 11(2):e1004080). Accordingly, in some embodiments, the one or more types of amino acids are identified by detecting binding of one or more amino acid recognition molecules that selectively bind the one or more types of amino acids. In some embodiments, the one or more types of amino acids are identified by detecting labeled polypeptide.

In some embodiments, the relative position of labeled amino acids in a protein can be determined without removing amino acids from the protein but by translocating a labeled protein through a pore (e.g., a protein channel) and detecting a signal (e.g., a Förster resonance energy transfer (FRET) signal) from the labeled amino acid(s) during translocation through the pore in order to determine the relative position of the labeled amino acids in the protein molecule.

As used herein, sequencing a polypeptide refers to determining sequence information for a polypeptide. In some embodiments, this can involve determining the identity of each sequential amino acid for a portion (or all) of the polypeptide. However, in some embodiments, this can involve assessing the identity of a subset of amino acids within the polypeptide (e.g., and determining the relative position of one or more amino acid types without determining the identity of each amino acid in the polypeptide). However, in some embodiments amino acid content information can be obtained from a polypeptide without directly determining the relative position of different types of amino acids in the polypeptide. The amino acid content alone may be used to infer the identity of the polypeptide that is present (e.g., by comparing the amino acid content to a database of polypeptide information and determining which polypeptide(s) have the same amino acid content).

In some embodiments, sequence information for a plurality of polypeptide products obtained from a longer polypeptide or protein (e.g., via enzymatic and/or chemical cleavage) can be analyzed to reconstruct or infer the sequence of the longer polypeptide or protein. Accordingly, some embodiments provide compositions and methods for sequencing a polypeptide by sequencing a plurality of fragments of the polypeptide. In some embodiments, sequencing a polypeptide comprises combining sequence information for a plurality of polypeptide fragments to identify and/or determine a sequence for the polypeptide. In some embodiments, combining sequence information may be performed by computer hardware and software. The methods described herein may allow for a set of related polypeptides, such as an entire proteome of an organism, to be sequenced. In some embodiments, a plurality of single molecule sequencing reactions may be performed in parallel (e.g., on a single chip). For example, in some embodiments, a plurality of single molecule sequencing reactions are each performed in separate sample wells on a single chip.

In some embodiments, methods provided herein may be used for the sequencing and identification of an individual protein in a sample comprising a complex mixture of proteins. Some embodiments provide methods of uniquely identifying an individual protein in a complex mixture of proteins. In some embodiments, an individual protein is detected in a mixed sample by determining a partial amino acid sequence of the protein. In some embodiments, the partial amino acid sequence of the protein is within a contiguous stretch of approximately 5 to 50 amino acids.

Without wishing to be bound by any particular theory, it is believed that most human proteins can be identified using incomplete sequence information with reference to proteomic databases. For example, simple modeling of the human proteome has shown that approximately 98% of proteins can be uniquely identified by detecting just four types of amino acids within a stretch of 6 to 40 amino acids (see, e.g., Swaminathan, et al. PLoS Comput Biol. 2015, 11(2):e1004080; and Yao, et al. Phys. Biol. 2015, 12(5): 055003). Therefore, a complex mixture of proteins can be degraded (e.g., chemically degraded, enzymatically degraded) into short polypeptide fragments of approximately 6 to 40 amino acids, and sequencing of this polypeptide library would reveal the identity and abundance of each of the proteins present in the original complex mixture. Compositions and methods for selective amino acid labeling and identifying polypeptides by determining partial sequence information are described in in detail in U.S. patent application Ser. No. 15/510,962, filed Sep. 15, 2015, titled "SINGLE MOLECULE PEPTIDE SEQUENCING," which is hereby incorporated by reference in its entirety.

Sequencing in accordance with some embodiments can involve immobilizing a polypeptide on a surface of a substrate or solid support, such as a chip or integrated device. In some embodiments, a polypeptide can be immobilized on a surface of a sample well (e.g., on a bottom surface of a sample well) on a substrate. In some embodiments, a first terminus of a polypeptide is immobilized to a surface, and the other terminus is subjected to a sequencing reaction as described herein. For example, in some embodiments, a polypeptide is immobilized to a surface through a C-terminal end, and terminal amino acid recognition and degradation proceeds from an N-terminal end of the polypeptide toward the C-terminal end. In some embodiments, the N-terminal amino acid of the polypeptide is immobilized (e.g., attached to the surface). In some embodiments, the C-terminal amino acid of the polypeptide is immobilized (e.g., attached to the surface). In some embodiments, one or more non-terminal amino acids are immobilized (e.g., attached to the surface). The immobilized amino acid(s) can be attached using any suitable covalent or non-covalent linkage, for example as described herein. In some embodiments, a plurality of polypeptides are attached to a plurality of sample wells (e.g., with one polypeptide attached to a surface, for example a bottom surface, of each sample well), for example in an array of sample wells on a substrate.

Some aspects of the present disclosure provide a method of sequencing a polypeptide by detecting luminescence of a labeled polypeptide which is subjected to repeated cycles of terminal amino acid modification and cleavage. For example, FIG. 5-13 shows a method of sequencing a labeled polypeptide by Edman degradation in accordance with some embodiments. In some embodiments, the method generally proceeds as described herein for other methods of sequencing by Edman degradation. For example, in some embodiments, steps (1) and (2) shown in FIG. 5-13 may be performed as described elsewhere herein for terminal amino acid modification and terminal amino acid cleavage, respectively, in an Edman degradation reaction.

As shown in the example depicted in FIG. 5-13, in some embodiments, the method comprises a step of (1) modifying the terminal amino acid of a labeled polypeptide. As described elsewhere herein, in some embodiments, modifying comprises contacting the terminal amino acid with an isothiocyanate (e.g., PITC) to form an isothiocyanate-modified terminal amino acid. In some embodiments, an isothiocyanate modification 5-1310 converts the terminal amino acid to a form that is more susceptible to removal by a cleaving reagent (e.g., a chemical or enzymatic cleaving reagent, as described herein). Accordingly, in some embodiments, the method comprises a step of (2) removing the modified terminal amino acid using chemical or enzymatic means including as detailed elsewhere herein for Edman degradation.

In some embodiments, the method comprises repeating steps (1) through (2) for a plurality of cycles, during which luminescence of the labeled polypeptide is detected, and cleavage events corresponding to the removal of a labeled amino acid from the terminus may be detected as a decrease in detected signal. In some embodiments, no change in signal following step (2) as shown in FIG. 5-13 identifies an amino acid of unknown type. Accordingly, in some embodiments, partial sequence information may be determined by evaluating a signal detected following step (2) during each sequential round by assigning an amino acid type by a determined identity based on a change in detected signal or identifying an amino acid type as unknown based on no change in a detected signal.

Some aspects of the present disclosure provide methods of polypeptide sequencing in real-time by evaluating binding interactions of terminal amino acids with labeled amino acid recognition molecules and a labeled cleaving reagent (e.g., a labeled exopeptidase). FIG. 5-14 shows an example of a method of sequencing in which discrete binding events give rise to signal pulses of a signal output 5-1400. The inset panel of FIG. 5-14 illustrates a general scheme of real-time sequencing by this approach. As shown, a labeled amino acid recognition molecule 5-1410 selectively binds to and dissociates from a terminal amino acid (shown here as lysine), which gives rise to a series of pulses in signal output 5-1400 which may be used to identify the terminal amino acid. In some embodiments, the series of pulses provide a pulsing pattern which may be diagnostic of the identity of the corresponding terminal amino acid.

Without wishing to be bound by theory, labeled amino acid recognition molecule 5-1410 selectively binds according to a binding affinity (KD) defined by an association rate of binding (kon) and a dissociation rate of binding (koff). The rate constants koff and kon are the critical determinants of pulse duration (e.g., the time corresponding to a detectable binding event) and interpulse duration (e.g., the time between detectable binding events), respectively. In some embodiments, these rates can be engineered to achieve pulse durations and pulse rates that give the best sequencing accuracy.

As shown in the inset panel, a sequencing reaction mixture further comprises a labeled cleaving reagent 5-1420 comprising a detectable label that is different than that of labeled amino acid recognition molecule 5-1410. In some embodiments, labeled cleaving reagent 5-1420 is present in the mixture at a concentration that is less than that of labeled amino acid recognition molecule 5-1410. In some embodiments, labeled cleaving reagent 5-1420 displays broad specificity such that it cleaves most or all types of terminal amino acids.

As illustrated by the progress of signal output 5-1400, in some embodiments, terminal amino acid cleavage by labeled cleaving reagent 5-1420 gives rise to a uniquely identifiable signal pulse, and these events occur with higher wavelength than the binding pulses of a labeled amino acid recognition molecule 5-1410. In this way, amino acids of a polypeptide can be counted and/or identified in a real-time sequencing process. As further illustrated in signal output 5-1400, in some embodiments, a labeled amino acid recognition molecule 5-1410 is engineered to bind more than one type of amino acid with different binding properties corresponding to each type, which produces uniquely identifiable pulsing patterns. In some embodiments, a plurality of labeled amino acid recognition molecules may be used, each with a diagnostic pulsing pattern, including a characteristic wavelength, lifetime, intensity, pulse duration and/or interpulse duration, which may be used to identify a corresponding terminal amino acid.

VIII. Alternatives and Scope

Having thus described several aspects and embodiments of the technology of the present disclosure, it is to be appreciated that various alterations, modifications, and improvements will readily occur to those of ordinary skill in the art. Such alterations, modifications, and improvements are intended to be within the spirit and scope of the technology described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. An integrated circuit, comprising:
   at least one photodetection region configured to generate charge carriers responsive to incident photons emitted from a sample;
   at least one charge storage region configured to receive the charge carriers from the photodetection region; and
   at least one component configured to obtain information about the incident photons, the information comprising pulse duration information and/or interpulse duration information and at least one member selected from a group comprising wavelength information, luminescence lifetime information, and intensity information; wherein:
   the pulse duration information is obtained at least in part by determining a first pulse comprising measures of arrivals of a plurality of incident photons emitted from the sample and determining a length of a first time interval during which the first pulse exceeds a first threshold; and
   the interpulse duration information is obtained at least in part by determining a second pulse comprising measures of arrivals of a second plurality of incident photons emitted from the sample and determining a length of a time interval between the first time interval and a second time interval during which the second pulse exceeds a second threshold.

2. The integrated circuit of claim 1, wherein the at least one component is further configured to identify the sample based at least in part on the information obtained by the at least one component.

3. The integrated circuit of claim 2, wherein identifying the sample comprises identifying at least one fluorescent marker, and the at least one component is further configured to identify at least one molecule to which the at least one fluorescent marker is attached.

4. The integrated circuit of claim 3, wherein identifying the at least one molecule comprises identifying at least one amino acid.

5. The integrated circuit of claim 1, wherein the information about the incident photons is based at least in part on one or more characteristics of the charge carriers stored in the at least one charge storage region.

6. The integrated circuit of claim 1, wherein the pulse duration information is obtained at least in part by determining a length of a time interval during which the total number of incident photons being received by the at least one photodetection region exceed a threshold.

7. The integrated circuit of claim 1, wherein the at least one component comprises at least one processor.

8. An integrated circuit, comprising:
   at least one photodetection region configured to generate charge carriers responsive to incident photons emitted from a sample;
   at least one charge storage region configured to receive the charge carriers from the photodetection region; and at least one component configured to:
- determine information about the incident photons, the information comprising at least three members selected from a group comprising a characteristic wavelength of the incident photons emitted from the sample, a characteristic luminescence lifetime of the incident photons emitted from the sample, a characteristic intensity of the sample, a characteristic pulse duration of the sample, and a characteristic interpulse duration of the sample; and
- identify the sample at least in part by comparing the information of each of the three members determined by the at least one component to known information about a candidate matching sample.

9. The integrated circuit of claim 8, wherein the information determined by the at least one component comprises at least two members selected from a group comprising the characteristic wavelength of the incident photons emitted from the sample, the characteristic luminescence lifetime of the incident photons emitted from the sample, and the characteristic intensity of the sample, and one member selected from a group comprising the characteristic pulse duration of the sample and the characteristic interpulse duration of the sample.

10. The integrated circuit of claim 9, wherein the information obtained by the at least one component comprises the characteristic luminescence lifetime of the incident photons emitted from the sample, the characteristic intensity of the sample, and one member selected from the group comprising the characteristic pulse duration of the sample and the characteristic interpulse duration of the sample.

11. The integrated circuit of claim 8, wherein identifying the sample comprises identifying at least one fluorescent marker, and the at least one component is further configured to identify at least one molecule to which the at least one fluorescent marker is attached.

12. The integrated circuit of claim 11, wherein identifying the at least one molecule comprises identifying at least one amino acid.

13. A method, comprising:
- determining information about a sample that emits emission light in response to excitation light, the information comprising at least three members selected from a group comprising a characteristic wavelength of the emission light, a characteristic intensity of the emission light, a characteristic luminescence lifetime of the emission light, a characteristic pulse duration of the emission light and a characteristic interpulse duration of the emission light; and
- identifying the sample at least in part by comparing the information about the sample of each of the three members to known information about a candidate matching sample.

14. The method of claim 13 wherein the determining the information about the sample comprises determining at least four members selected from the group comprising the characteristic wavelength of the emission light, the characteristic intensity of the emission light, the characteristic luminescence lifetime of the emission light, the characteristic pulse duration of the emission light and the characteristic interpulse duration of the emission light.

15. The method of claim 13, wherein the information about the sample comprises determining the characteristic wavelength of the emission light, the characteristic intensity of the emission light, the characteristic lifetime of the emission light, the characteristic pulse duration of the emission light and the characteristic interpulse duration of the emission light.

16. The method of claim 13, wherein identifying the sample comprises determining an identity of at least one fluorescent marker in the sample.

17. The method of claim 16, wherein identifying the sample comprises determining an identity of at least one molecule to which the at least one fluorescent marker is attached.

18. The method of claim 17, wherein the at least one molecule comprises at least one amino acid.

19. The method of claim 13, wherein determining information about the sample is based at least in part on one or more characteristics of one or more charge carriers generated in response to the emission light.

* * * * *